United States Patent [19]

Deacon et al.

[11] Patent Number: 5,504,772
[45] Date of Patent: Apr. 2, 1996

[54] LASER WITH ELECTRICALLY-CONTROLLED GRATING REFLECTOR

[75] Inventors: David A. G. Deacon, Los Altos; Simon J. Field, Menlo Park; Michael J. Brinkman, Redwood City; William K. Bischel, Menlo Park, all of Calif.

[73] Assignee: Deacon Research, Palo Alto, Calif.

[21] Appl. No.: 303,801

[22] Filed: Sep. 9, 1994

[51] Int. Cl.$^6$ ........................................... H01S 3/08
[52] U.S. Cl. ................................................ 372/102
[58] Field of Search ................... 372/6, 12, 37, 372/102; 385/8, 10

[56] References Cited

U.S. PATENT DOCUMENTS

| | | |
|---|---|---|
| 4,006,963 | 2/1977 | Baues et al. . |
| 4,410,823 | 10/1983 | Miller et al. . |
| 4,743,087 | 5/1988 | Utaka et al. ........................ 385/10 |
| 4,813,771 | 3/1989 | Handschy et al. . |
| 4,835,779 | 5/1989 | Liou ................................. 372/102 |
| 4,865,406 | 9/1989 | Khanarian et al. . |
| 4,867,516 | 9/1989 | Baken et al. . |
| 5,006,285 | 4/1991 | Thackara et al. . |
| 5,007,696 | 4/1991 | Thackara et al. . |
| 5,016,959 | 5/1991 | Diemeer . |
| 5,020,072 | 5/1991 | Abe et al. ......................... 372/102 |
| 5,036,220 | 7/1991 | Byer et al. . |
| 5,040,864 | 8/1991 | Hong . |
| 5,061,028 | 10/1991 | Khanarian et al. . |
| 5,077,752 | 12/1991 | Tada et al. ........................ 372/102 |
| 5,103,492 | 4/1992 | Ticknor et al. . |
| 5,105,433 | 4/1992 | Eisele et al. ...................... 372/102 |
| 5,119,393 | 6/1992 | Oka et al. ......................... 372/102 |
| 5,157,541 | 10/1992 | Schildkraut et al. . |
| 5,182,665 | 1/1993 | O'Callaghan et al. . |
| 5,185,752 | 2/1993 | Welch et al. ..................... 372/102 |
| 5,267,336 | 11/1993 | Sriram et al. . |
| 5,271,024 | 12/1993 | Huber ............................... 372/102 |
| 5,278,924 | 1/1994 | Schaffner . |
| 5,299,045 | 3/1994 | Sekiguchi ............................ 385/10 |
| 5,317,576 | 5/1994 | Leonberger et al. ............. 372/102 |
| 5,337,328 | 9/1994 | Lang et al. ....................... 372/102 |

OTHER PUBLICATIONS

R. A. Becker et al., "Electrooptical switching in thin film waveguides for a computer communication bus," Applied Optics, vol. 18, No. 19, Oct. 1, 1979.

*Primary Examiner*—Rodney B. Bovernick
*Assistant Examiner*—Robert E. Wise
*Attorney, Agent, or Firm*—Townsend and Townsend and Crew; Kenneth R. Allen

[57] ABSTRACT

One or more lasers are combined with optical energy transfer devices and energy guiding devices which use an electric field for control. The optical energy transfer devices may form gratings, mirrors, lenses and the like using a class of poled structures in solid material. The poled structures may be combined with waveguide structures. Electric fields applied to the poled structures control routing, reflection and refraction of optical energy. Adjustable tunability is obtained by a poled structure which produces a spatial gradient in a variable index of refraction along an axis in the presence of a variable electric field.

22 Claims, 32 Drawing Sheets

LASER WITH ELECTRICALLY-CONTROLLED GRATING REFLECTOR

BACKGROUND OF THE INVENTION

This invention relates to lasers in connection with optical devices for controlling optical beams using electric field control. In particular, the invention relates to lasers in connection with devices constructed with poled structures, including periodically poled structures, and electrodes which permit controlled propagation of optical energy in the presence of controlled electric fields applied between electrodes.

The invention is especially applicable to the fields of laser control, communications, flat panel displays, scanning devices and recording and reproduction devices.

Interactions with energy beams such as optical or acoustic beams can be controlled by means of applied electric fields in electro-optic (EO) or piezoelectric materials. An electrically controlled spatial pattern of beam interaction is desired in a whole class of switched or modulated devices. Patterned responses can be achieved in uniform substrates using the electro-optic or piezoelectric effect by patterning the electric field. However, Maxwell's equations for the electric field prevent sharp field variations from extending over a large range. Some materials can be poled, which means their electro-optical and/or piezoelectric response can be oriented in response to some outside influence. In these materials, is possible to create sharp spatial variations in EO coefficient over potentially large ranges. By combining slowly varying electric fields with sharply varying (poled) material, new types of patterned structures can be fabricated and used.

Polable EO materials have an additional degree of freedom which must be controlled, as compared to fixed EO crystals. Usually, the substrate must be poled into a uniformly aligned state before any macroscopic EO response can be observed. Uniformly poled substrates have been fabricated both from base materials where the molecules initially have no order, and from base materials where the molecules spontaneously align with each other locally, but only within randomly oriented microscopic domains. An example of the first type of material is the nonlinear polymer. Examples of the second type of material are sintered piezoelectric materials such as lead zirconate titanate (PZT), liquid crystals, and crystalline ferroelectric materials such as lithium niobate ($LiNbO_3$). Nonlinear polymer poling is described in ♦ E. Van Tomme, P. P. Van Daele, R. G. Baets, P. E. Lagasse, "Integrated optic devices based on nonlinear optical polymers", IEEE JQE 27 778, 1991. PZT poling is described for example in ♦ U.S. Pat. No. 4,410,823, October 1983, Miller et al, "Surface acoustic wave device employing reflectors". (Liquid crystal poling is described in standard references, such as S. Chandrasekhar, *Liquid Crystals*, Second Edition (1992), Cambridge University Press, Cambridge.) Ferroelectric crystal poling is described in ♦ U.S. Pat. No. 5,036,220 July 1991, Byer et al., "Nonlinear optical radiation generator and method of controlling regions of ferroelectric polarization domains in solid state bodies".

Examples of poled EO devices include:

- ♦ the beam diffractor in a polymer layer with interdigitated electrodes of S. Ura, R. Ohyama, T. Suhara, and H. Nishihara, "Electro-optic functional waveguide using new polymer p-NAn-PVA for integrated photonic devices," *Jpn. J. Appl. Phys.*, 31, 1378 (1992) [UOS92];

- ♦ the beam modulator in a polymer layer with planar electrodes of U.S. Pat. No. 5,157,541 October 1992, Schildkraut et al. "Optical article for reflection modulation";

- ♦ the total internal reflection beam reflector in a lithium niobate waveguide with an electrode pair of H. Naitoh, K. Muto, T. Nakayama, "Mirror-type optical branch and switch", *Appl. Opt.* 17, 101–104 (1978);

- ♦ the 2×2 waveguide switch in lithium niobate with two electrodes of M. Papuchon, Am. Roy, "Electrically active optical bifurcation: BOA", *Appl. Phys. Lett.* 31, 266–267 (1977); and

- ♦ the wye junction beam router in a lithium niobate waveguide with three electrodes of H. Sasaki and I. Anderson, "Theoretical and experimental studies on active y-junctions in optical waveguides", *IEEE Journ. Quant. Elect.*, QE14, 883–892 (1978).

These devices use uniformly poled material with varied electrode and optical structures. Many of the advantages of patterned poled devices have not been recognized. For example, in the book by ♦ H. Nishihara, M. Haruna, T. Suhara, *Optical Integrated Circuits*, McGraw-Hill, New York (1989) [NHS89], many electro-optical devices activated by various electrode patterns are described, but all of these devices are fabricated on a uniformly poled substrate. The same is true of another review article, ♦ T. Suhara and H. Nishihara, "Integrated optics components and devices using periodic structures," *IEEE J. Quantum Electron.*, QE-22, 845, (1986) [TH86], which describes the general characteristics of grating coupled devices without recognizing the advantages of a poled grating as opposed to an electrode grating.

In selected instances in the literature, certain advantages of patterned poled substrates have been pointed out.

- ♦ A surface acoustic wave reflector with an array of domain reversals in a piezoelectric ceramic (but no electrodes) is described in U.S. Pat. No. 4,410,823, Miller et al.;

- ♦ A beam steerer with triangular domain reversed regions in $LiTaO_3$ is described in Q. Chen, Y. Chiu, D. N. Lambeth, T. E. Schlesinger, D. D. Stancil, "Thin film electro-optic beam deflector using domain reversal in $LiTaO_3$", CTuN63, CLEO'93 *Conference Proceedings*, pp 196 et. seq., Optical Society of America.

- ♦ A Mach-Zehnder modulator with domain reversals to compensate phase differences between microwave and optical beams is described in U.S. Pat. No 5,278,924, January 1994, Schaffner, "Periodic domain reversal electro-optic modulator".

- ♦ A Mach-Zehnder electric field sensor with one domain reversed region in an electro-optic substrate is described in U.S. Pat. No. 5,267,336, November 1993, Sriram et al., "Electro-optical sensor for detecting electric fields".

Use of patterned poled structures offers efficiency advantages in beam control (including generation, modulation, redirection, focussing, filtration, conversion, analysis, detection, and isolation) with applications in laser control; communications; data storage; and display. What is needed in these areas are adjustable methods for beam control with high efficiency. Due to the sharp domain transitions, higher efficiency devices can generally be obtained using pattern poled substrates to create the high frequency variations; the electrodes are needed to excite the patterned poled substrate, not to create the high frequency variations.

The poling process in polymers is quite different from that of crystals, and results in poorly defined domain boundaries.

In crystals, there are a discrete number of (usually two) poling directions which are stable, and poling a local region consists of flipping atoms between these alternative states. Poled regions are fully aligned, and sharp boundaries exist between oppositely aligned domains. In poled polymers, any molecule can be oriented in any direction regardless of the poling direction. The poling process produces only an average component of alignment within a random distribution of individual molecules. In polymers, the poling (and the related EO coefficients) therefore have a continuous variation in strength and orientation. The sharp domain boundaries obtained in crystals are absent. This has a profound influence on the efficiency of certain types of poled device in polymers. Since the poling strength and direction in polymers follows the strength and direction of the local applied electric field, it is not possible to obtain poling features with spatial dimensions any sharper than permitted by Maxwell's equations. In polymers, there is very little advantage to be obtained from spatially patterning the poled regions instead of the electrodes.

In devices based on optical polymers, poling is required to create an electro-optical response. The poling is done by applying a voltage to electrodes fabricated on the device (in the presence of heat). The entire polymer film may be poled with a uniform electrode, after which the electrodes are spatially patterned for the desired functionality. The EO performance of the device will not change much if the poling is accomplished with the patterned electrodes, since the active region within reach of the electric field is still poled almost as well. The choice of whether to pole the whole layer or just the region under the electrodes is mainly by convenience in fabrication. Examples of polymer EO devices where the poling is spatially patterned outside the active region of the device are ♦ the switched waveguides of U.S. Pat. No. 4,867,516, September 1989, Baken et al., "Electro-optically induced optical waveguide, and active devices comprising such a waveguide", and ♦ U.S. Pat. No. 5,103,492, April 1992, Ticknor et al., "Electro-optic channel switch". None of these devices have the electrodes traverse multiple boundaries of a patterned poled structure.

The poling process also changes the index of refraction ellipsoid in polymers. This fact has some desirable consequences, such as making possible waveguides fabricated by poling a stripe of polable polymer as described in ♦ J. I. Thackara, G. F. Lipscomb, M. A. Stiller, A. J. Ticknor, and R. Lytel, "Poled electro-optic waveguide formation in thin-film organic media," *Appl. Phys. Lett.*, 52, 1031 (1988) [TLS88] and in ♦ U.S. Pat. Nos. 5,006,285, April 1991, and 5,007,696. April 1991, Thackara et al. "Electro-optic channel waveguide". However, it leaves a problem in that poled polymer boundaries are lossy in their unexcited state (they scatter, diffract and refract). Devices in which a light beam crosses poled polymer boundaries have the problem that although transparency may be achieved, the poled polymer must be activated electrically to produce a uniform index of refraction. Poled crystalline devices do not have this problem because poling does not change their index of refraction.

A solution to the problem of lack of transverse spatial definition in poled polymers was proposed in ♦ U.S. Pat. No. 5,016,959 May 1991, Diemeer, "Electro-optical component and method for making the same", who describe a total internal reflection (TIR) waveguide switch in which the entire polymer film is poled, but the electro-optic coefficient of selected regions is destroyed by irradiation, creating unpoled regions with sharp spatial boundaries. While the underlying molecules in these unpoled irradiated regions remain aligned, they no longer have any electro-optic response. This approach is useful in creating sharp poled-unpoled domain boundaries in polymer films. It has the disadvantage that it cannot produce reverse poled domains so its efficiency is considerably reduced compared to the equivalent crystal poling technique.

In nonlinear frequency conversion devices, domains of different polarity are typically periodically poled into a nonlinear optic material, but not excited by an electric field. The poled structure periodically changes along the axis of the beam to allow net energy conversion despite a phase difference that accumulates between the two beams. This process is known as quasi-phasematching, and has been demonstrated in ferroelectrics [U.S. Pat. No. 5,036,220, Byer et al.] such as lithium niobate, KTP, and lithium tantalate, as well as in polymers, as described in ♦ U.S. Pat. No. 4,865,406 September 1989, Khanarian et al, "Frequency doubling polymeric waveguide". Electrodes are not typically used in these devices, since the phasematching occurs in the absence of an electric field. Generalized frequency conversion in polymers is described in ♦ U.S. Pat. No. 5,061,028 October 1991, Khanarian et al, "Polymeric waveguides with bidirectional poling for radiation phase matching", as well as TE–TM modulation. Khanarian et al. used patterned electrodes in both patents to pole the polymer film; the attendant loss in sharpness of the spatial pattern becomes a severe problem where more complex electrode structures are needed such as in the latter patent.

Devices are known employing periodic structures which use electric fields to control gratings in order to control propagating fields. A diffraction grating modulator is shown in ♦ U.S. Pat. No. 4,006,963, February 1977, Baues et al. "Controllable, electro-optical grating coupler". This structure is fabricated by removing material periodically in an electro-optic substrate to form a permanent grating. By exciting the substrate electro-optically, the fixed index grating has a greater or lesser effect, producing some tuning. This structure does not contain poled regions. The drawbacks of the Baues structure are the same as for the polymer film: the grating cannot be made transparent without the application of a very strong field.

The current technology for an EO switchable grating is shown in FIG. 1 (Prior Art). In this structure, periodically patterned electrodes serve as the elements that define the grating. The underlying material does not have a patterned poled structure, as hereinafter explained. An input beam 12 is coupled into a electro-optically active material 2 which contains an electrically controllable grating 6. When the voltage source 10 to the grating electrodes is off, the input beam continues to propagate through the material to form the output beam 16. When the grating-controlling voltage source is switched on, an index modulation grating is produced in the material, and a portion of the input beam is coupled into a reflected output beam 14. The material has an electro-optically active poled region 4 with a single domain, with the same polarity throughout the poled structure. A first electrode 6 is interdigitated with a second electrode 7 on a common surface 18 of the substrate. When a voltage is applied between the electrodes, the vertical component of electric field along the path of the beam 12 alternately has opposite sign, creating alternate positive and negative index changes to form a grating. The strength of the grating is controlled by the voltage source connected between the two electrodes by two conductors 8.

A second general problem with the existing art of EO and piezoelectric devices using uniform substrates and patterned electrodes is that the pattern of the excited electric field decays rapidly with distance away from the electrodes. The pattern is essentially washed out at a distance from the electrodes equal to the pattern feature size. This problem is aggravated in the case of a grating because of the very small feature size. Prior art gratings formed by interdigitated electrodes produce a modulated effect only in a shallow surface layer. EO structures interact weakly with waveguides whose dimension is larger than the feature size. While longer grating periods may be used in higher order interaction devices, the lack of sharp definition described above again seriously limits efficiency. The minimum grating period for efficient interaction with current technology is about 10 microns. What is needed is a way to maintain the efficiency of EO devices based on small structures, despite a high aspect ratio (i.e. the ratio of the width of the optical beam to the feature size). Switchable patterned structures are needed which persist throughout the width of waveguides and even large unguided beams.

In bulk material, gratings may be formed by holographic exposure and acoustic excitation. Holographic exposure is very difficult, and storage materials such as SBN are not yet developed to a commercial state. Acoustic excitation is very expensive to implement and to power, and requires additional components such as soft mounts and impedance matched damping structures. Other methods form surface gratings, including deposition techniques, material removal techniques and material modification techniques (such as indiffusion, outdiffusion, and ion exchange). What is needed is an approach capable of a large enough aspect ratio to produce bulk interaction structures, preferably with feature control at an accessible surface.

While the EO material can in principle be any electro-optically active material, liquid crystals are a special case and have limited applicability. A light modulator based on diffraction from an adjustable pattern of aligned liquid crystal domains is described in ◆ U.S. Pat. No. 5,182,665, January 1993, O'Callaghan et al., "Diffractive light modulator". A light modulator based on total internal reflection modulated by liquid crystal domain formation is described in ,◆ U.S. Pat. No. 4,813,771 March 1989, Handschy et al., "Electro-optic switching devices using ferroelectric liquid crystals". In all of these devices, the domains must physically appear or disappear to produce the desired effect. The orientation of the molecules in the liquid crystal device changes in response to an applied field, producing a patterned structure which interacts with light. However, liquid crystals have important drawbacks. They are of course liquid and more difficult to package, and they have a limited temperature range and more complex fabrication process than solid state devices. High aspect ratio structures cannot be made because of the decay of the exciting field pattern with distance. The molecular orientation relaxes as soon as the field is turned off, and re-establishing the pattern takes a long time, so fast switching is not possible.

The structures which switch light from waveguide to waveguide in the prior art have a high insertion loss or large channel spacing which render them unsuitable for large routing structures. A large switching structure must have switching elements with insertion loss low enough to permit light to propagate through the structure. If a waveguide has 100 switches, for example, the switches must have less than about 0.03 dB insertion loss. In the prior art this is not possible. R. A. Becker and W. S. C. Chang, "Electro-optical switching in thin film waveguides for a computer communications bus", Appl. Opt. 18, 3296 (1979), demonstrate a multimode crossing waveguide array structure coupled via interdigitated electro-optic grating switches. This switch has an inherently high insertion loss (0.4 dB) and poor switching efficiency (~10%). U.S. Pat. No. 5,040,864, 8/1991, J. H. Hong, "Optical Crosspoint Switch Module", discloses a planar waveguide structure which may in principle have a low insertion loss, but which requires very large crossing junctions for efficient switching, and is therefore incapable of producing a high density switching array.

In summary, the prior art has shortcomings in several areas: 1) large aspect ratios of controllable patterns are needed for efficient interaction with bulk waves or small patterns; 2) sharp domain transitions are needed for efficiency in higher order interactions; 3) transparency of domain structures is needed at zero applied field for proper unpowered operation; and 4) low insertion loss is required for arrays of switches. Poled structures contained in the above and other structures have not been fully utilized heretofore to realize practical devices.

SUMMARY OF THE INVENTION

According to the invention, one or more lasers are combined with optical energy transfer devices and energy guiding devices which use an electric field for control. The optical energy transfer devices may form gratings, mirrors, lenses and the like using a class of poled structures in solid material. The poled structures may be combined with waveguide structures. Electric fields applied to the poled structures control routing, reflection and refraction of optical energy. Adjustable tunability is obtained by a poled structure which produces a spatial gradient in a variable index of refraction along an axis in the presence of a variable electric field.

In one embodiment, the present invention is a switchable grating which consists of a poled material with an alternating domain structure of specific period. When an electric field is applied across the periodic structure, a Bragg grating is formed by the electro-optic effect, reflecting optical radiation with a certain bandwidth around a center wavelength. The grating may be used by itself, or in combination with other gratings to form integrated structures in a ferroelectric crystal. Specifically of interest is an integrated structure in which one or more optical waveguides interact with one or more periodic structures to form a wavelength selective integrated optic modulator, switch, or feedback element.

The invention will be better understood upon reference to the following detailed description in connection with the accompanying drawings.

DESCRIPTION OF SPECIFIC EMBODIMENTS

Figure 1:
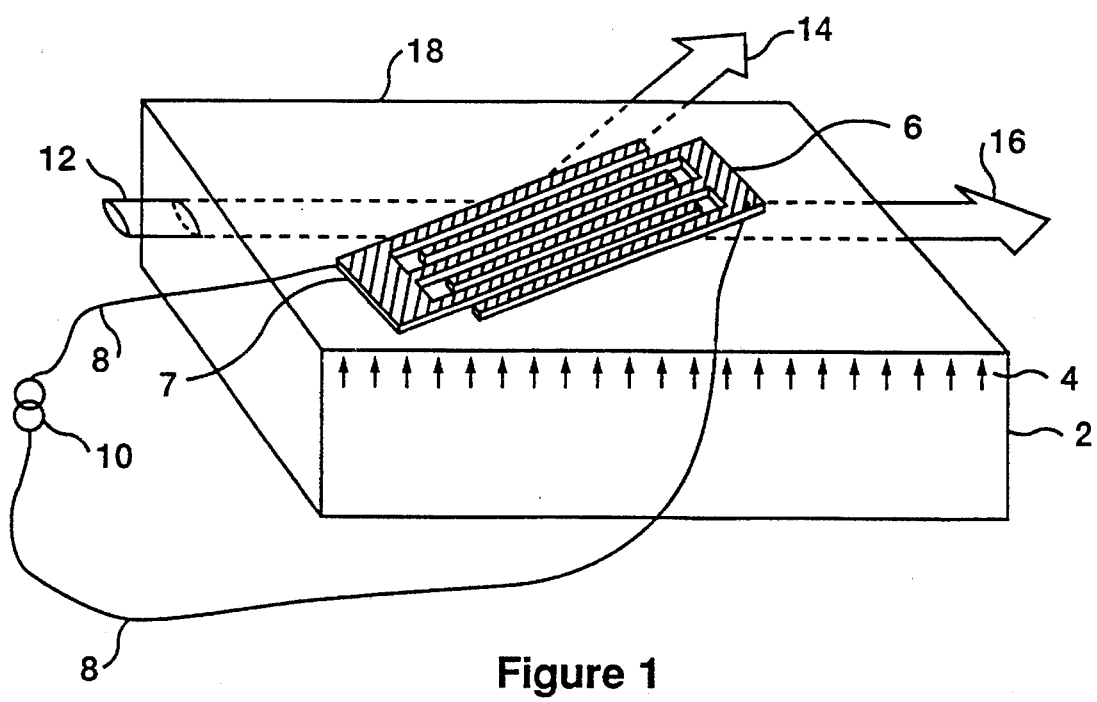
FIG. 1 is a modulator with interdigitated electrodes, according to the prior art.
Figure 2:
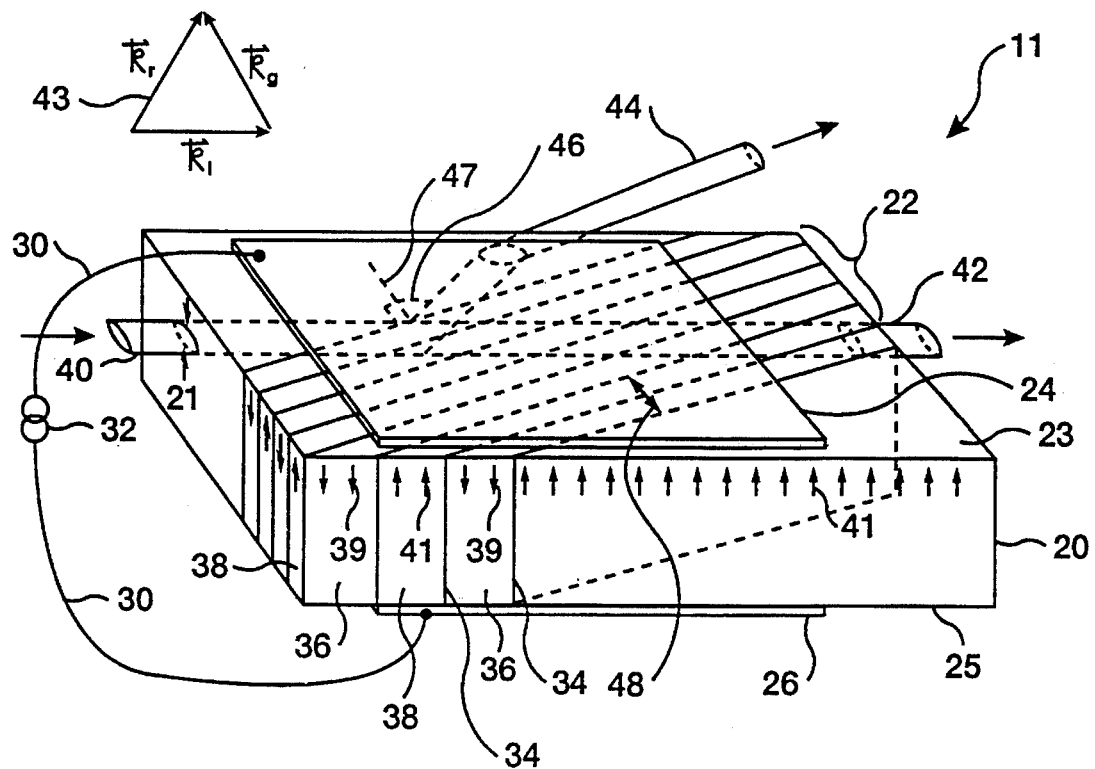
FIG. 2 is a generalized embodiment of the switched grating for interacting with bulk optical beams, according to the invention.

FIGS. 55–58 are particularly relevant to the claims of this application. Structures and methods employed in connection with the claim invention are explained in the reamainder of the specification. Referring to FIG. 2, there is shown a generalized embodiment of a device 11 used in the present invention, which is a patterned poled dielectric device.

Essentially, this device is an electrically-controllable stacked dielectric optical energy redirector, or more succinctly, an electrically-switchable mirror. In a preferred embodiment, the invention is a bulk optical reflector in a ferroelectric crystal 20 of lithium niobate. The electrically-controlled switching element is a poled grating 22, which consists of alternating poled domains of two types 36 and 38.

A domain, which may be of any shape or size, is a physical region within which certain material properties are approximately constant. A poled domain is a region in a material in which the molecular groups have a directionality and these groups are substantially aligned (or are partially aligned) in, or near, a direction called the poling direction. There are many types of domains including domains of aligned atomic structures in different directions, domains of aligned molecules or atomic structures with various modified parameters such as the nonlinear activity or the electro-optic coefficient, domains of atomic structures with no preferred direction, domains defined by regions activated by different electrodes, poled regions in which the poling direction varies systematically across the region such as occurs in the case of polymers and fused silica poled with localized electrodes, domains of randomly oriented molecules, and by extension, a random domain structure: domains of sub-domains which are randomly poled within the domain. A poled structure is a set of individual domains. A patterned poled region is a region in a material in which the domains within the region have been poled according to a spatial pattern, with more than one domain type. There may be a systematic offset between the poled pattern and the imposed pattern used during the poling process, depending on the nature of this process. The boundaries of the pattern may also be somewhat irregular and not follow the imposed pattern perfectly, particularly if the poling process is not under complete control. The device is described as a patterned poled dielectric because an electric field is applied in controlling the device, so the material must be a dielectric in order to withstand the required field without damage. Typically, the poling process is also accomplished using an electric field, which the material must also withstand. In general, we mean by dielectric the capability of the material to withstand the minimum electric fields needed for the application.

In operation, an optical input beam 40 is incident on and through the crystal, along an optical axis. The optical axis is normal to the phase front of the beam and is defined by the mean location of the propagating beam across its intensity profile at the phase front. The optical axis is straight in a uniform material, but may bend in several situations including curved waveguides, nonuniform media, and in reflective or diffractive structures. The input beam 40 preferably has a sufficiently small spot size 21 throughout the crystal length so that it is not apertured by the crystal, causing undesirable power loss and mode conversion. In a bulk-interaction device such as is shown in FIG. 2, the domains 36 and 38 must penetrate a sufficient distance through the substrate 20 so that they overlap at least a portion of the input beam 40. The grating 22 lies transverse of the input beam 40. This means the planes 34 of the grating 22 are transverse of the axis of the input beam 40. For two lines (or a line and a plane, or two planes) to be transverse of each other we mean that they are not parallel. Since the grating is transverse of the beam 40, the beam passes through at least a portion of the structure of the grating 22.

The optical beam 40 is derived from an optical frequency source (not shown) and has a wavelength such that the beam is not substantially absorbed in the crystal, and such that the photorefractive effect does not distort the beam significantly. The optical frequency source means may include one or more optical exciters capable of supplying sufficient brightness within the wavelength acceptance of the grating reflector 22 to produce a useful switched output beam 44. The output beam may be coupled to other elements on the same substrate, or it may be coupled to external devices, in which case the output surface through which beam 44 emerges is preferably antireflection coated. The antireflection coating may be a multilayer dielectric coating, a single quarter wave layer of a material with almost the appropriate index of refraction, or a sol-gel coating. The exciter may be any light source including a laser, a light emitting diode, an arc lamp, a discharge, or even a filament, provided that the desired spectral brightness is achieved. The desired spectral brightness may be supplied directly from one or more exciters, indirectly from one or more frequency converted (doubled, mixed, or parametrically amplified) exciters, or in combination with several of the above alternatives. Absorption effects will limit the wavelength to the range from about 400 to 4000 nm. The effect of the photorefractive phenomenon varies with the configuration, the wavelength, dopants, and the poling structure, and we assume here that it has been brought under control so that any beam distortion remains within acceptable limits.

The grating 22 is formed or defined by the boundaries 34 between alternating domains of two different types. The first type of domain 36 has a different electro-optic (E-O) coefficient than the second type of domain 38, so that a uniform electric field applied between the electrodes 24 and 26 results in different changes in the index of refraction in the two types of domains. Because the index of refraction changes the phase velocity of the wave, there is an impedance mismatch between the regions of different index or phase velocity. It is advantageous to accomplish such an index change with material in which the regions 36 have a reverse sense relative to the poling direction of the other domain type 38 and the original wafer 20, as shown by the poling sense arrows 39, 41. By reverse sense we mean the poling direction is opposite to some reference direction. (An alternative realization of the field controllable grating is in an irradiated masked polymer film which has its E–O coefficient destroyed inside or outside the regions 36.) A uniform electric field applied to the structure 22 produces a modulated index of refraction. The pattern of index modulation adds to the pre-existing index of refraction distribution; the simplest configuration has no index modulation in the absence of the applied electric field, and develops an index grating linearly in response to the applied field. A period 48 for the grating 22 is the distance between two domain boundaries entirely including a region corresponding to each domain type.

An alternative realization of the index of refraction grating is obtained by applying a strain field to the poled regions. The photoelastic response of the material produces different index of refraction changes in the different poled regions. The strain field may be applied permanently by, for example, laying down a film on top of the substrate at a high temperature and then cooling to room temperature. A concentration of strain may be achieved by etching away a stripe of the film, for example.

The poled elements 36 and 38 alternate across the grating 22 with no space between them. If additional domain types are available, more complicated patterns of alternation are possible with domains separated by variable distances of the different domain types. For some applications, the grating 22 is a uniformly periodic grating as shown in FIG. 2 so that the domain types contained in one period along the length of the grating 22 are reproduced in the other periods. For other applications, it is advantageous to modify the period to obtain advantages such as multiple spectral peaks or a broader spectral bandwidth. By grating we mean an array of distinguishable structures, including all possible variations of geometry and periodicity.

A periodic index grating is capable of supplying virtual photons in an interaction between optical beams. This means the grating structure is capable of supplying momentum, but not energy, to the interaction. For an interaction to proceed, both energy and momentum must be conserved, and the grating is useful when a momentum increment is required to simultaneously satisfy the two conservation relations. The grating periodicity defines the momentum which is available to the interaction. The grating strength determines the "intensity" of the virtual photon beam. The number of periods in the section of the grating traversed by the optical beam determines the bandwidth of the virtual photon momenta which are available. Because of the bandwidth limitation, the interaction can only proceed within a specific range (or ranges) of optical frequencies. Grating devices are therefore inherently frequency selective, and typically operate around a nominal wavelength.

For example, in a simple reflection process at an angle, as illustrated in FIG. 2, the photons of the input beam 40 have the same optical frequency as the photons of the output beams 44 and 42, so energy conservation is observed. However, the momentum of the photons in input beam 40 and diverted output beam 44 are not the same; for the reflection process to occur, the change in momentum must be supplied by the grating 22 as illustrated by the vector diagram 43 associated with FIG. 2. The grating 22 supplies a virtual (with momentum but no energy) photon to the interaction to enable the conservation of momentum. The momentum vector associated with the $i^{th}$ mode, $k_i=2\pi n_i/\lambda_i$, is equal to the product of $2\pi$ times the effective index $n_i$ for that mode divided by the wavelength $\lambda_i$ for that wave, and it points in the direction of propagation. The magnitude of the momentum vector is also called the propagation constant. In the case of a single period grating, the momentum vector $k_g=2\pi/\Lambda$ points perpendicular to the grating surfaces, and it can have any wavelength value $\Lambda$ which is present in the Fourier transform of the grating. The optical spacing (the width of the grating lines and spaces) associated with the propagation constant $k_g$ of a 50% duty cycle grating is therefore $\Lambda/2$. The frequency of interaction may also be tuned by adjusting for example the index of refraction of the optical beams, or the grating period by thermal expansion or other means. Depending on how a given device is implemented, an index structure may have a spectrum of wavelengths and vector directions which can be contributed to the interaction. Also, multiple virtual photons may be contributed to an interaction in a so-called "higher order" grating interaction. A "higher order" grating is one which has a period which is related to the required period for momentum conservation by division by an integer. The required momentum virtual photon is obtained from the harmonics of the "higher order" grating. The condition that momentum be conserved by the process is commonly called the Bragg condition, so the gratings of this invention am Bragg gratings, and the incidence angle on the gratings is the Bragg angle for the in-band or resonant frequency component. This dual conservation of energy and momentum is required for any energy beam interaction, whether the energy beam is optical, microwave, acoustic, or any other wavelike energy form consisting of a time-variable energy field. Only the implementation of the grating may change, to produce an impedance modulation for the different forms of energy so that the pattern of the structure can couple with the wavelike energy form.

In FIG. 2, the index grating functions as a frequency-selective optical energy router or reflector. A beam of a characteristic frequency within the interaction bandwidth (capable of interacting with one or more of the virtual photons) is known as an in-band beam, while energy beams of other frequencies are known as out-of-band beam. The grating 22 has a frequency bandwidth which corresponds to the full width at half maximum of the reflection efficiency of the grating as a function of optical frequency. When the index grating is present (the grating is "on"), a beam having an optical frequency within the bandwidth of the grating is reflected from the grating at the angle 46 around a normal 47 to the grating structure. An out-of-band beam transmits through the crystal along the same optical axis and in the same direction as the input beam, forming part of the transmitted output beam 42. An electric field applied in the region including the grating controls the strength of the index modulation (which can also be thought of as the intensity of the virtual photons), adjusting the ratio of the power in the transmitted output beam 42 to that in the reflected output beam 44.

For a weak retro reflecting grating (which does not substantially deplete the input beam), the full width half maximum bandwidth $\Delta\lambda$ is given by $$\Delta\lambda = \frac{\lambda^2}{2.24nL} \quad (1)$$

where $\lambda$=vacuum wavelength of the input beam, n=index of refraction of the beam, and L=length of the grating. For highly reflecting gratings, the effective length is smaller than the total length of the grating, increasing the bandwidth.

The two types of domains may exhibit an index difference before an electric field is applied. In this case, a permanent index grating accompanies the poled switchable index grating. As the electric field is applied, the net modulation in the index of refraction (the grating strength) may be increased or decreased, depending on the polarity. The "grating off" situation (index grating value near zero) is then achieved at a specific value of applied field. The grating can then be turned "on" by applying any other field strength. If the polarity of the applied field is reversed, for example, an index grating is produced with twice the strength of the original permanent grating.

The poled grating structure of our invention has two major advantages over the prior art. First, the poled domain structures can have very sharp boundaries, providing a strong Fourier coefficient at virtual photon momenta which are multiples of the momentum corresponding to the basic grating period. This is very useful in cases where it is impractical to perform lithography with the required small feature size. Second, strong index modulation gratings can be made even if the optical mode dimension is large compared to the grating period. This is not possible in a uniformly poled substrate excited by patterned electrodes, because the electric field modulation decays exponentially with distance away from the plane of the electrode array, losing most of the modulation within a distance equal to the grating period. The poling process can create poled features with an extremely high aspect ratio, or the ratio of depth of the domain to its width. Using an electric field poling technique, aspect ratios in excess of 250:1 have been fabricated. Because we use essentially uniform electrodes, we get good electrostatic penetration; with deep domain walls, good modulation is available across the entire beam.

The grating may also be a two dimensional array of index changes, in which case the grating has periodicities in two dimensions. The virtual photon contributed by the grating can then contribute momentum in two dimensions. This might be useful, for example, in an application with several output beams from a single grating.

In the preferred embodiment, the ferroelectric crystal is a commercially-available, z-cut, lithium niobate single-crystal wafer. Other cuts, including x-, y-, and angle-cuts can also be used, depending on the poling method and the desired orientation of the poled domains. The fabrication steps include primarily poling and electrode fabrication. Prior to processing, the crystal is cleaned (for example by oxygen plasma ashing) to remove all hydrocarbons and other contaminants remaining from the polishing and handling processes. To control the poling, a mask and processing electrodes are used to create a pattern of applied electric field at the surface of and through the wafer, as described in U.S. patent application Ser. No. 08/239,799 filed May 9, 1994. The poling pattern is adjusted to produce the poled domain inversion in regions 36 during the application of the poling field. In brief, a silica layer several microns thick is deposited on the+z surface 23 of the wafer 20. This film is thinned or removed over the regions 36 where domain inversion is desired, a liquid electrode or deposited metal film is used to make a good equipotential surface over the patterned silica, and an electric field exceeding approximately 24 kV/mm is applied with the+z surface 23 at a higher potential than the−z surface 25. Using this technique, ferroelectric crystals of lithium niobate have been poled to create patterns of two domain types which are of reverse polarity (domain inversion). The magnitude of the electro-optic coefficient for the two types of domains is identical, although with a reverse polarity.

In addition to the preferred technique, domain inversion has been achieved in ferroelectrics using in-diffusion, ion-exchange, and alternate electric field poling techniques. Domain formation by thermally-enhanced in-diffusion has been demonstrated in lithium niobate, using titanium. The triangular shape of the inverted region limits the interaction efficiency for small domain size, however, and is useful mainly in waveguide devices with long periods. Patterned poling via ion exchange has been demonstrated in KTP in a salt bath containing rubidium and barium ions, in which the potassium ions in the crystal were exchanged for the rubidium ions. Electric field poling using alternate techniques to the preferred one have also been demonstrated in both lithium niobate and lithium tantalate. Potentially, all solid ferroelectric materials, including KTP and barium titanate, can be poled by electric field domain-inversion techniques. (Solid means holding its structure for a certain period of time, such as cooled fluids, glasses, crosslinked polymers, etc.)

Gratings with different characteristics are generated by the different techniques. Electric field poling aligns the domains in the crystal without producing an intrinsic change in the index of refraction, while the ion-exchange and diffusion techniques do create a index change in the poled regions. A permanent index grating accompanies the switchable poled grating when these latter methods are used.

In general, there are two types of differing domains, at least the first type of which is poled. Although only two types of domains are required, more complex switchable grating structures can be fabricated with additional types of domains. The second domain type may be reverse poled, unpoled, or poled at another angle, and it may be distinguished by possessing a distinct electrical activity coefficient, (e.g. the electro-optic or the piezo-optic coefficient). For example, it may in some applications be cost effective to fabricate the device from unpoled lithium niobate wafers, in which case the substrate wafer is comprised of multiple randomly oriented domains. The poled domains will have a uniform orientation while the orientation in the other domains will be random. The performance of the device will be affected by the details of the random pattern, depending on the type of device. As another example, the second domains may be oriented perpendicular to the first or at another angle, and the difference in the electrical response can still produce a useful electronically controlled structure. The poled domains may also be formed in a material which was previously unpoled and randomly oriented on a molecular scale, such as in fused silica or polymers. The poling process orients the structure of the material to form the first domain type, while the second domain type consists of the unpoled or randomly oriented regions in the material.

In an alternate technique, the poled structure can be formed by selectively changing or destroying the electrical activity coefficient in regions corresponding to the second domain type. The orientation of the atomic structures in these regions does not need to be altered: if the electrical activity is changed in the second domain region, the domains are different. For example in nonlinear polymers, the electro-optic coefficient may be disabled by irradiation, producing regions of electrical activity where the irradiation is masked off. A similar effect has been demonstrated in lithium niobate, where proton exchange destroys the nonlinear coefficient. Modification of the electro-optic coefficient can also be achieved by optical radiation, electron bombardment, and/or ion bombardment in many other materials, including most nonlinear materials such as KTP and lithium tantalate.

In lithium niobate, an applied field $E_3$ along the z axis of the crystal induces a change in the extraordinary index of refraction $\delta n_e$ which is given by $$\delta n_e = \frac{r_{33} E_3 n_e^3}{2} \quad (2)$$

where $r_{33}$ is the appropriate electro-optic nonlinear optical coefficient. Because $r_{33}$ is the largest nonlinear constant in lithium niobate, it is best to use the change in the extraordinary index in practical devices. (The nonlinear constant $r_{13}$ which produces a change in the ordinary index of refraction due to an applied $E_3$, is a factor of 3.6 smiler than $r_{33}$.) To use the change in the extraordinary index, the light waves must be polarized along the z axis of the material. In a z-cut crystal, this polarization is called TM. (In TE polarization, the electric vector lies in the plane of the crystal surface. The only other significant nonlinear coefficient is $r_{15}$, which couples TE and TM waves upon the application of an electric field $E_1$ or $E_2$.)

Because the index change induced in the poled structures is quite small (with an applied field of 10 V/μm along the z axis of a lithium niobate substrate, the index change $\delta n_e$ is only $1.6 \times 10^3$), the grating reflector of FIG. 2 has a strong angular dependence. The Brewster angle for a weak index change is 45°, so the gratings will totally transmit any TE polarized wave when the planes of the grating are disposed at and angle of 45° with respect to the phase front of the light beam. The device may therefore be used as a polarizer. The reflected beam will always be essentially polarized at 45° incidence. If the reflection coefficient for the TM wave is high, which can be arranged with enough grating periods and a high applied field, the extinction ratio of the polarizer can also be very high in the forward direction. At normal incidence, of course, there is no difference in reflection between the two polarizations due to this effect (although there are differences due to other effects such as the different electro-optic coefficients described above). A total internal reflection device operating at grazing incidence is far from Brewster's angle and has little difference in reflection due to this effect.

The wafer material can be any polable solid dielectric material, including ferroelectrics, polymer films, and some amorphous materials such as fused silica which can also be poled for producing many useful devices according to the invention. The poled material may also be a thin film deposited on a substrate of a second material. Many of the polable thin film, such as fused silica, lithium niobate, potassium niobate, barium titanate, zinc oxide, II–VI materials, and various polymers, have been successfully deposited on a substrate. A wide variety of substrates have been used, including MgO, silicon, gallium arsenide, lithium niobate, and various glasses, including quartz and fused silica. For the domains to be electronically switchable, they must consist of electro-optic materials, which are materials having an index change induced by an applied electric field.

After the poling step, the liquid electrode material and silica masking film are preferably removed. Referring again to FIG. 2, a first electrode 24 and a second electrode 26 confront the dielectric material in order to provide a means to create the electric field which controls the grating. (Confronting a material means placed close to the material but not necessarily touching, approximately aligned to the surface of the material but not necessarily with a constant gap dimension, and includes situations with additional material of varying dimensions placed on top of the material.) The electrodes 24 and 26, consisting of an electrically-conductive material, are preferably laid out on opposing surfaces of the crystal in a spatially delimited manner using standard deposition techniques. These electrodes are referred to as being on opposing planes even though the surfaces may be curved and/or non-parallel as part of a larger geometry. The electrodes may be formed by any material that provides sufficient transport of electrical charge to achieve an adequate field strength to activate the poled grating in a time consistent with the application. For example, the electrodes could alternatively consist of metals such as aluminum, gold, titanium, chromium, etc., conductive paint, epoxy, semiconducting material, or optically transparent materials such as oxides of indium and tin, and liquid conductors such as salt solutions. They may also confront the surfaces 23 and 25 with a gap filled with air, an optically transparent buffer layer, and/or other material. Only one electrode is required since a potential voltage difference can be created between that electrode and any potential reference such as an exterior ground plane, a second electrode, or multiple electrodes. The electrodes are the electric field creating means because the application of a voltage to an electrode establishes an electric field pattern which is determined by the electrode. A voltage and current supply is of course also needed. The electrodes are placed so that the control electric field is applied through the active volume of the invention, which may consist of a pattern poled region or a grating.

In the case of metallic electrodes, it may be best to incorporate a coating deposited below the electrode, to reduce the optical loss which occurs when a portion of the guided wave mode extends to the metallic electrode. The coating should be thin enough to maintain high electric field at the surface in the case of multiple electrodes mounted on the same surface, but thick enough to reduce the optical loss. Mother coating is also useful above the electrodes to reduce the probability of breakdown.

A voltage control source 32 (or potential source) provides the electrical potential to drive the electrodes through connections 30 to activate the grating. The activated electrodes are polarized relative to each other according to the polarity of the applied voltage. The voltage of the source produces a large enough electric field through the poled regions to switch a significant amount of light into the switched output beam 44. The voltage of the source is variable to provide a means to control the ratio of power in the two output beams. Substantially all of the input beam may be reflected with a long grating if the electric field is sufficiently high, forming an electrically activated mirror. For lower electric fields, the grating forms a partial reflector. The voltage control source may be a battery, an electrical transformer, a gas powered generator, or any other type of controllable source of electrical current and potential. The control means 32 may also incorporate a controller which generates a time dependent voltage, and which supplies the current to change the voltage on the electrodes 24 and 26 at the frequencies required by the application. The control means 32 may also have multiple outputs capable of controlling multiple devices, and which might be sequenced temporally according to some pattern. The source 32 may have control inputs for manual or electronic control of its function by computer or by another instrument.

In order to avoid unnecessary repetition, it should be understood that the variations described in reference to FIG. 2 apply to the embodiments described below, and that the variations described in reference to the figures below also apply to FIG. 2.

Figure 3:
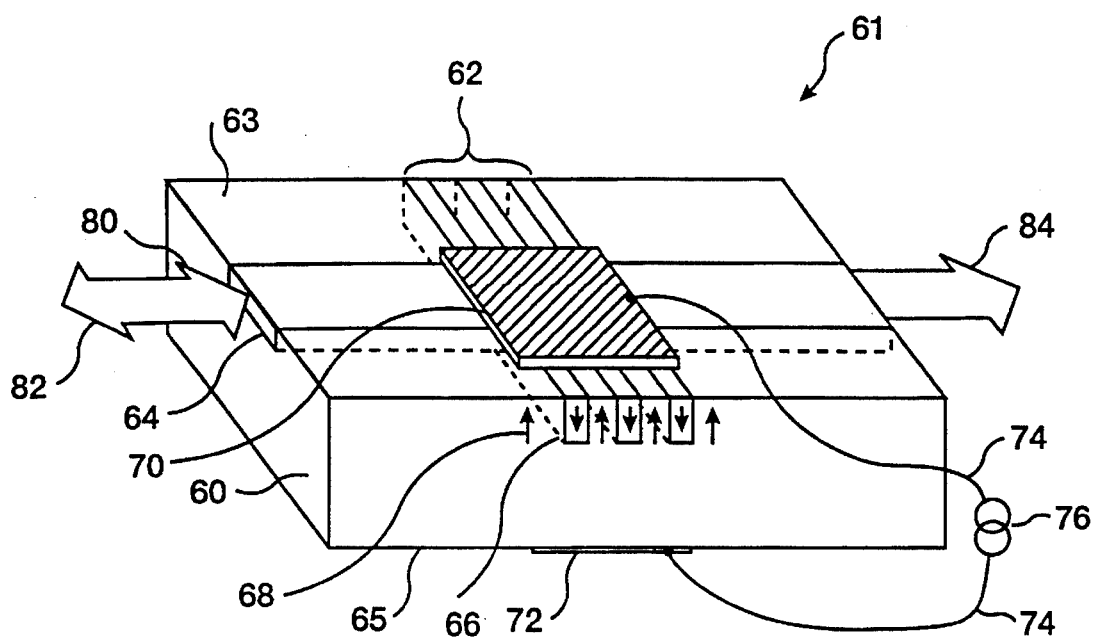
FIG. 3 is an embodiment of a waveguide retroreflector using the switched grating.

Referring now to FIG. 3, a guided-wave embodiment of the present invention is shown. Specifically, this embodiment is an electrically-controlled, frequency-selective waveguide retroreflector. All of the optical beam in this device are confined in two dimensions by an optical waveguide 64, which traverses one surface of the polable dielectric material that forms the substrate 60 of the device 61.

A waveguide is any structure which permits the propagation of a wave throughout its length despite diffractive effects, and possibly curvature of the guide structure. An optical waveguide is defined by an extended region of increased index of refraction relative to the surrounding medium. The strength of the guiding, or the confinement, of the wave depends on the wavelength, the index difference and the guide width. Stronger confinement leads generally to narrower modes. A waveguide may support multiple optical modes or only a single mode, depending on the strength of the confinement. In general, an optical mode is distinguished by its electromagnetic field geometry in two dimensions, by its polarization state, and by its wavelength. The polarization state of a wave guided in a birefringent material or an asymmetric waveguide is typically linear polarized. However, the general polarization state may contain a component of nonparallel polarization as well as elliptical and unpolarized components, particularly if the wave has a large bandwidth. If the index of refraction difference is small enough (e.g. $\Delta n=0.003$) and the dimension of the guide is narrow enough (e.g. $W=4\mu m$), the guide will only confine a single transverse mode (the lowest order mode) over a range of wavelengths. If the waveguide is implemented on the surface of a substrate so that there is an asymmetry in the index of refraction above and below the waveguide, there is a cutoff value in index difference or waveguide width below which no mode is confined. A waveguide may be implemented in a substrate (e.g. by indiffusion), on a substrate (e.g. by etching away the surrounding regions, or by applying a coating and etching away all but a strip to define the waveguide), inside a substrate (e.g. by contacting or bonding several processed substrate layers together). In all cases, we speak of the waveguide as traversing the substrate. The optical mode which propagates in the waveguide has a transverse dimension which is related to all of the confinement parameters, not just the waveguide width.

The substrate is preferably a single crystal of lithium niobate, forming a chip which has two opposing faces 63 and 65 which are separated by the thickness of the wafer. The opposing faces need not be parallel or even flat. The waveguide is preferably formed by a well-established technique such as annealed proton exchange (APE) on face 63. Alternatively, ions other than protons may also be indiffused or ion exchanged into the substrate material. The APE waveguide increases the crystal extraordinary refractive index, forming a waveguide for light polarized along the z-axis. For a z-cut crystal, this corresponds to a TM polarized mode. Waveguides formed by alternate techniques, such as titanium indiffusion in lithium niobate, may support both the TM and TE polarizations.

Preferably, the waveguide is designed to support only a single lowest order transverse mode, eliminating the complexities associated with higher order modes. The higher order transverse modes have different propagation constants than the lowest order mode, and higher scattering loss, which can be problems in some applications. However, multimode waveguides might be preferred for some applications, such as for high power propagation.

One alternative configuration is to excite the grating by applying pressure rather than by directly applying an electric field. The effect of an applied pressure is indirectly the same: by the piezoelectric effect, the applied stress produces an electric field, which in turn changes the index of refraction of the domains. However, no sustaining energy need be applied to maintain the stress if the structure is compressed mechanically, for example. This alternative, like the others mentioned herein, apply also to the other similar realizations of the invention described below.

Once the waveguide dimensions are determined, a photomask for the waveguide is generated and the pattern is transferred to a masking material on the substrate, by one of many well known lithographic processes. The mask material may be $SiO_2$, tantalum or other metals, or other acid resisting materials. To fabricate an APE waveguide, the masked substrate material is immersed in molten benzoic acid to exchange protons from the acid for lithium ions in the crystal. The resulting step index waveguide may then be annealed for several hours at around 300° C. to diffuse the protons deeper into the crystal and create a low-loss waveguide with high electrical activity coefficients.

In addition to in-diffusion and ion exchange two-dimensional waveguides, planar and two dimensional ridge or strip-loaded waveguides can be formed. Planar waveguides may be formed by depositing the electrically active material on a substrate of lower index. Deposition techniques for waveguide fabrication are well-known and include liquid phase epitaxy (LPE), molecular beam epitaxy (MBE), flame hydrolysis, spinning, and sputtering. Ridge waveguides can be formed from these planar guides by using processes such as lift-off, wet etch, or dry etch such as reactive ion etching (RIE). Planar guides can also be used in the present invention, particularly in devices using a variable angle of diffraction off the grating.

The grating 62 in this embodiment is disposed normal to the optical waveguide 64 which traverses the substrate. The grating is composed of a first type 66 and second type 68 of domain, which do not necessarily extend through the substrate. For example, when the active material is poled using indiffusion or ion exchange, the inverted domains 66 typically extend to a finite depth in the material. The partial domains may also be formed when the poling is achieved by destroying the electrical activity of the material (or reducing the electro-optic activity) by a technique such as ion bombardment or UV irradiation.

The optical input beam 80 is incident on and is coupled into the waveguide. Coupling refers to the process of transferring power from one region into another across some kind of generalized boundary such as across an interface, or between two parallel or angled waveguides, or between a planar guide and a stripe guide, or between single mode and multimode waveguides, etc. When the grating is on, a portion of the input beam is coupled back into a retroreflected output beam 82. While the retroreflection of the grating need not be perfect, i.e. the grating may reflect the light to within a few degrees of the reverse direction, the waveguide captures most of this light and forms a perfectly retroreflected beam. The imperfection of the retroreflection results in a coupling loss of the retroreflected beam into the waveguide 64. When the grating is off (when the controlling electrical field is adjusted to the "off" position in which the index grating has a minimum value near zero, typically at zero field), the input beam continues to propagate in the same direction through the waveguide to form a transmitted output beam 84. As in the bulk device, the strength of the grating can be varied with the voltage source 76 to control the ratio of the power in the two output beams.

A first electrode 70 and second 72 electrode confront opposing faces of the dielectric material 60. The substrate is a dielectric because it is capable of withstanding an applied electric field without damage, but it need not be a perfect insulator as long as the current flow does not adversely affect the performance of the device. The electrodes may be formed of any electrically conducting material. There must also be a means for creating an electric field through the dielectric material using the first electrode structure.

The electrodes bridge at least two of the elements of the first type of poled structure that forms the grating. This means the electric field produced by the electrodes penetrates into at least the two elements. Thus, these elements can be activated by the field. Two wires 74 preferably connect the voltage control source 76 to the two electrodes to provide an electric field in the region formed by the intersection of the waveguide 64 and the poled structure 62. The wires may be formed from any material and in any geometry with sufficient conductivity at the operating frequency to allow charging the electrodes as desired for the application. The wires may be round, flat, coaxial cables, or integrated lead pattern conductors, and they may be resistors, capacitors, semiconductors, or leaky insulators.

Alternately, the electrodes can be arranged in any manner that allows an electric field to be applied across the electrically active material. For example, the electrodes may be interspersed in different layers on a substrate, with the active material between the electrodes. This configuration enables high electric fields to be produced with low voltages, and is particularly useful for amorphous active materials, such as silica and some polymers, which can be deposited over the electrode material.

The poled structure 62 is preferably deeper than the waveguide so that the intersection between the waveguide 64 and the poled structure 62 has the transverse dimensions of the mode in the waveguide and the longitudinal dimensions of the grating.

Figure 4:
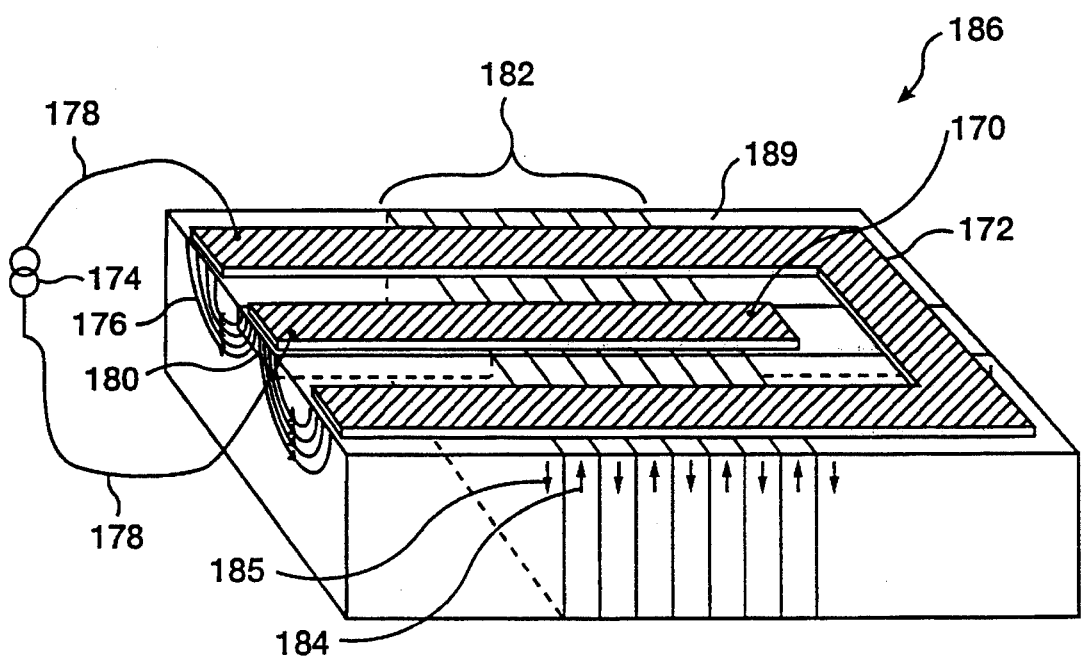
FIG. 4 is an embodiment of an electrode configuration for the retroreflecting device with three electrodes disposed on the same face of the crystal.
Figure 5:
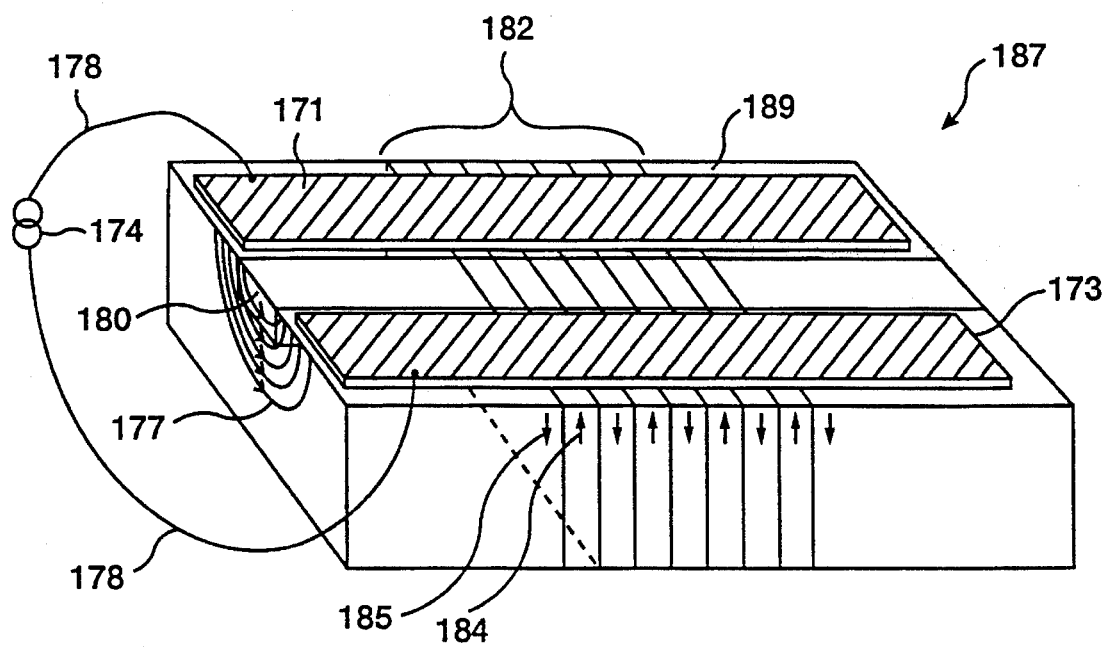
FIG. 5 is an embodiment of an electrode configuration for the same device, in which two electrodes are disposed on the same face of the crystal.
Figure 6:
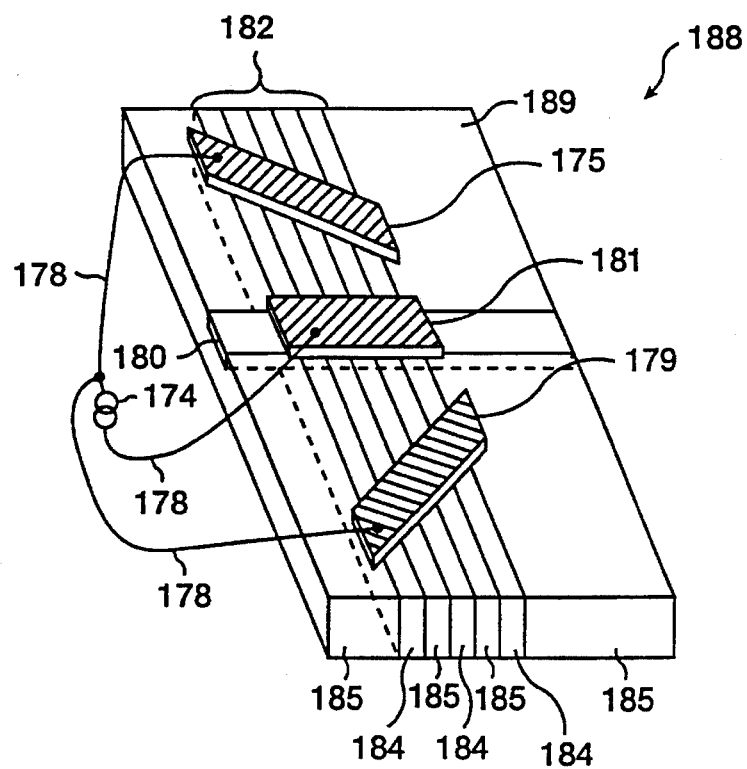
FIG. 6 is an embodiment of an electrode configuration for the device, in which three electrodes with tapered separation are disposed on the same face of the crystal.

FIGS. 4, 5 and 6 show alternate electrode configurations in which the electrodes are disposed on a common face of the dielectric material 189. These configurations are especially useful for embodiments of the present invention that use a waveguide 180 to guide an optical beam, since the same-surface electrode configurations permit high electric fields at low voltage. These electrode structures are of particular interest for low voltage control of the grating 182 because of the proximity of the electrodes to the section of the waveguide which traverses the grating. In the electrode configuration 186 depicted in FIG. 4, the first electrode 170 and second electrode 172 confront the dielectric material on the same surface. These electrodes are referred to as being on a common plane even though the surface may be curved as part of a larger geometry. The first electrode is placed above a portion of the waveguide that contains several grating elements, each of which consists of alternate regions of a first type of domain 184 and a second type of domain 185. The second electrode is positioned around the first electrode. The distance between the electrodes along the waveguide is approximately constant along the axis of the waveguide for cases where a uniform field along the axis of the waveguide is desired. The electrode spacing may also be varied to taper the field strength, as shown schematically in the device 188 of FIG. 6. A voltage source 174 connected between the two electrodes disposed as shown in FIG. 4, is capable of generating electric fields between the electrodes. The electric field vectors 176 have their largest component perpendicular to the surface of the material, in the region of the electrically-active waveguide. For a z-cut ferroelectric crystal such as lithium niobate, this electric field structure activates the largest electro-optic coefficient $r_{33}$, creating a change in index for a TM polarized optical beam. For an applied electric field of 10 V/μm and an optical beam with a wavelength of 1.5 μm in lithium niobate, the strength of a first order grating is 40 cm$^{-1}$.

A means 178 for contacting the electrodes to a voltage source is required for each of the electrode configurations. To form this means, an electrically conducting material, such as a wire, is electrically contacted between the electrodes on the device and the terminals of the potential source. In all electrode configurations, each electrode typically has a section, or pad, or contact, to which the wire is contacted. The pads are preferably of large enough size to reduce placement tolerances on the electrical contact means for easier bonding. The wire can then be contacted to the pads using a technique such as wire bonding by ultrasonic waves, heating, or conductive epoxy. Alternately, a spring-loaded conductor plate can be placed in direct contact with the electrode to make the required electrical connection to the voltage source. In the figures, the electrodes are typically large enough and function as the contact pads by themselves.

Another realization 187 of the same-surface electrode structure is shown in FIG. 5, wherein the first electrode 171 and second electrode 173 are placed on either side of the optical waveguide. When an electric potential is applied across the two electrodes positioned in this manner, the electric field vectors 177 have their largest component parallel to the substrate surface. For a z-cut ferroelectric crystal, the electro-optic coefficient that creates a change in index for a TM polarized optical wave and the applied electric field is $r_{13}$. For an applied electric field of 10 V/μm and an optical beam with a wavelength of 1.5 μm in lithium niobate, the first order grating coupling constant is 12 cm$^{-1}$.

Alternately, for TE waveguides the active electro-optic coefficients are switched for the two configurations. For an electric field vector perpendicular to the surface of the chip, the appropriate coefficient is $r_{13}$, while for an electric field vector parallel to the surface of the chip, the electro-optic coefficient used is $r_{33}$. Similar situations apply for x- or y-cut crystals, or intermediate cuts.

As a further variation of the configuration of FIG. 5, the electrodes are asymmetrically arranged so that one electrode approximately covers the waveguide 180 and the other electrode is displaced somewhat to the side. In this configuration, the strong vertical field induced under the edges of the adjacent electrodes is made to pass predominantly through the waveguide region under one of the electrodes.

Figure 7:
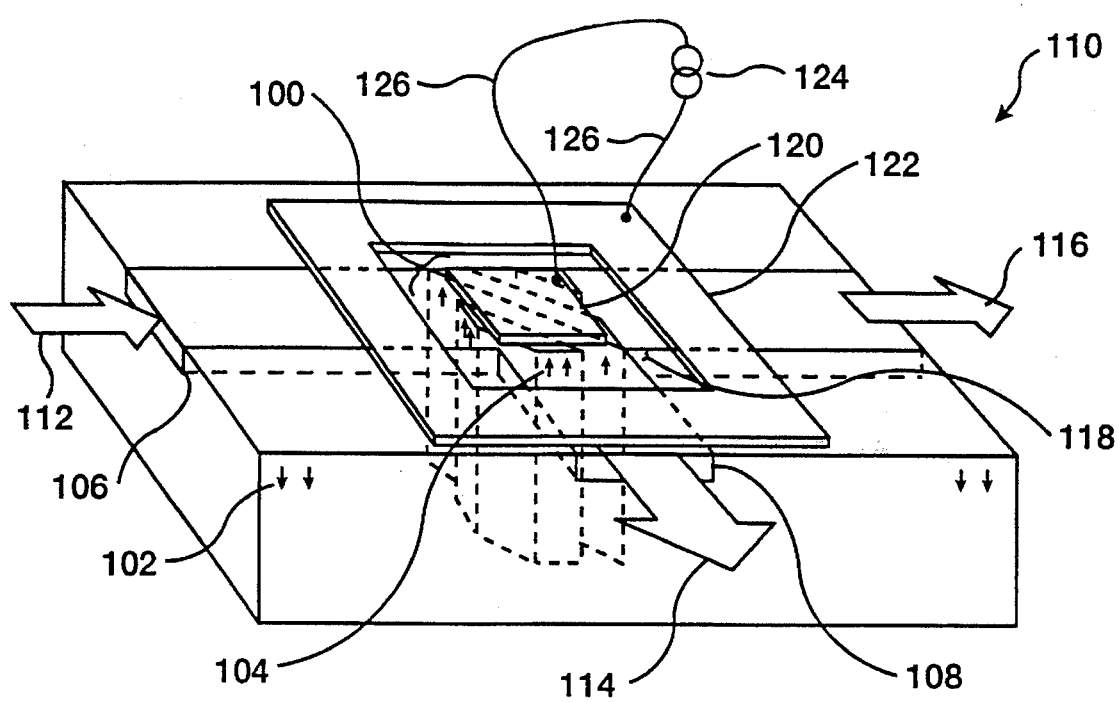
FIG. 7 is a tee embodiment of a poled crossing waveguide coupler.
Figure 8:
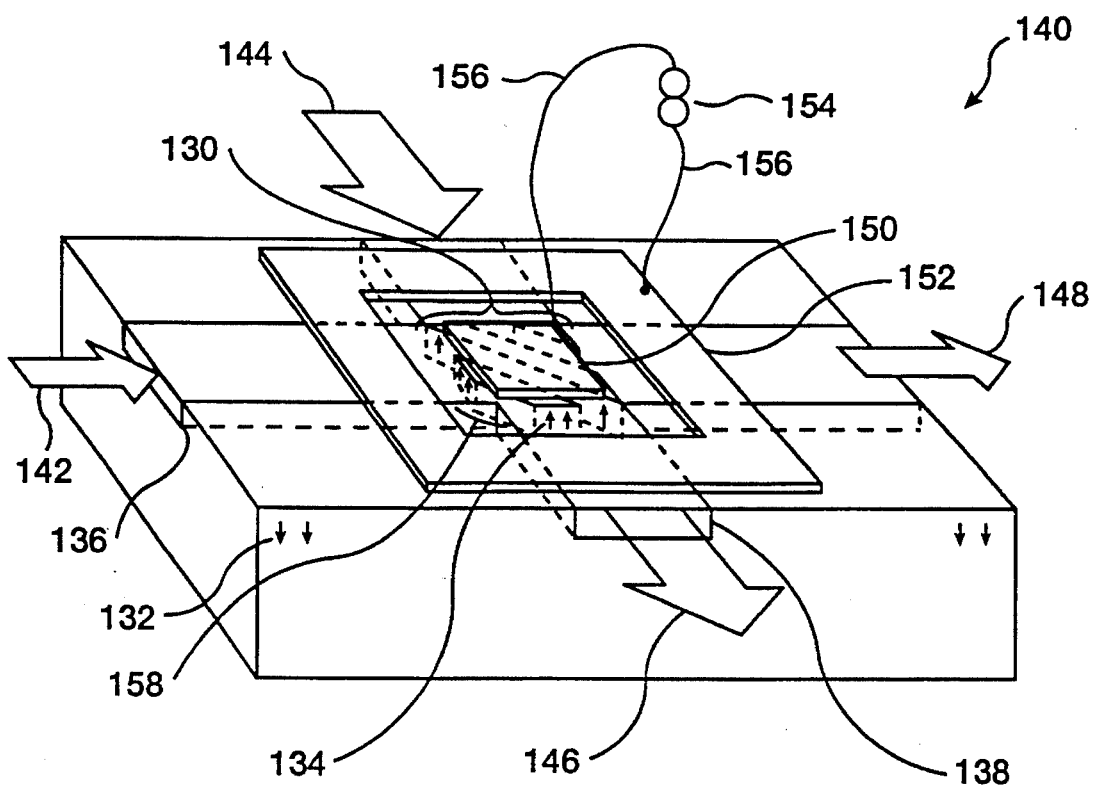
FIG. 8 is an x embodiment of a poled crossing waveguide coupler.

In FIG. 6, the electrodes 175 and 179 have a separation from the center electrode 181 which is tapered. When a voltage is applied across these electrodes, this configuration produces a tapered field strength, with the strong field towards the right and the weaker field towards the left. By "tapered" we mean that any parameter has a generalized spatial variation from one value to another without specifying whether the variation is linear or even monotonic; the parameter may be a gap, a width, a density, an index, a thickness, a duty cycle, etc. The index changes induced in the poled domains towards the left of the waveguide 180 are therefore weaker than the index changes induced towards the right. This might be useful, for example, to obtain a very narrow bandwidth total reflector where it is needed to extend the length of the interaction region. In non-normal incidence angle devices, such as shown in FIG. 7 and FIG. 8, the taper might be useful to optimize the coupling of a specific input mode into a specific output mode.

In all electrode configurations, the voltage applied can range from a constant value to a rapidly varying or pulsed signal, and can be applied with either polarity applied between the electrodes. The value of the voltage is chosen to avoid catastrophic damage to the electrically-active material and surrounding materials in a given application.

When a constant electric field is applied across materials such as lithium niobate, charge accumulation at the electrodes can cause DC drift of the electric field strength with time. The charges can be dispersed by occasionally alternating the polarity of the voltage source, so that the electric field strength returns to its full value. If the time averaged electric field is close to zero, the net charge drift will also be close to zero. For applications sensitive to such drift, care should be taken to minimize the photorefractive sensitivity of the material, such as by in-diffusion of MgO, and operation is preferably arranged without a DC field.

Surface layers are useful for preventing electric field breakdown and lossy optical contact with the electrodes. Losses are particularly important for waveguide devices, since the beam travels at or near the surface, while breakdown is most critical when electrodes of opposite polarity are placed on the same surface. This concern applies to the poling of the active material as well as to the electro-optic switching. The largest vector component of the electric field between two same-surface electrodes is parallel to the surface of the material. Both the breakdown problem and the optical loss problem can be considerably reduced by depositing a layer of optically transparent material with a high dielectric strength between the guiding region and the electrodes. Silicon dioxide is one good example of such a material. Since there is also a potential for breakdown in the air above and along the surfaces between the electrodes, a similar layer of the high-dielectric-strength material can be deposited on top of the electrodes.

FIG. 7 and FIG. 8 show two embodiments of a electrically-controlled frequency-selective waveguide coupler. In FIG. 7, a pair of two-dimensional waveguides traverse one face of a dielectric material, and intersect at an angle 118 to make a tee, forming a three-port device. A grating 100, consisting of a first type 104 and second type 102 of domains, is disposed at an angle to the two guides in the intersection region between them (the volume jointly occupied by the optical modes in the two waveguides). The peak index change in the intersection region is preferably equal to the peak index change in the waveguides. This is done if the fabrication of the tee structure is accomplished in one step (be it by indiffusion, ion exchange, etching, etc.). In the alternative approach of laying down two waveguides in subsequent steps, which is most convenient in the crossing waveguide geometry of FIG. 8, the peak index change in the intersection region is twice the index change in the waveguides, which is not needed. As always, the periodicity and angle of the grating is chosen such that the reflection process is phase matched by the momentum of a virtual photon within the bandwidth of the grating. For optimal coupling between an m-band input beam in the first waveguide and an output beam 114 in the second waveguide 108, the angle of incidence of the input beam is equal to the angle of diffraction off the grating. In this case, the bisector of the angle between the two guides is normal to the domain boundaries of the grating in the plane of the waveguide.

An input beam 112 is incident on and is coupled into the first waveguide 106. A first electrode 120 and second electrode 122 are laid out on the same face of the dielectric material so that an electric field is created in the intersection region between the waveguides, when a voltage source 124 connected to the two electrodes by conductors 126 is turned on. The electric field controls the strength of the grating in the intersection region via the electro-optic effect, coupling the in-band beam from the first waveguide into the second waveguide to form a reflected output beam 114. With the grating turned off, the input beam continues to propagate predominantly down the first waveguide segment to form a transmitted output beam 116 with very little loss. Alternately, counter-propagating beams can be used in the waveguide so that the input beam enters though the second waveguide 108, and is switched into the output waveguide 106 by interacting with the grating.

In single mode systems, the grating strength is preferably spatially distributed in a nonuniform manner so that a lowest order Gaussian mode entering waveguide 106 is coupled into the lowest order Gaussian mode of waveguide 108. The grating strength can be modulated by adjusting the geometry of the electrode, by adjusting the gaps between the electrodes, and by adjusting the duty cycle of the grating. The bandwidth of the grating may also be enhanced by one of a number of well known techniques such as chirping, phase shifting, and the use of multiple period structures.

The size of the coupling region is limited, in the geometry of FIGS. 7 and 8 by the size of the intersection region between the guides where their modes overlap. To obtain a high net interaction strength for a given electric field strength, it is desirable to increase the size of the waveguides to produce a larger intersection. However, large waveguides are multimode, which may not be desirable for some applications. If adiabatic expansions and contractions are used, the advantages of both a large intersection region and single mode waveguides can be obtained simultaneously. The input waveguide 106 begins as a narrow waveguide and is increased in width adiabatically as the intersection region is approached. The output waveguide 108 has a large width at the intersection to capture most of the reflected light, and it is tapered down in width adiabatically to a narrow waveguide. The idea of adiabatic tapering of an input and/or an output waveguide can be applied to many of the interactions described herein, Referring to FIG. 8, the two waveguides 136 and 138 intersect at an angle 158 to make an x intersection, forming a four-port device. This device is a particularly versatile waveguide switch, since two switching operations occur simultaneously (beam 142 into beams 146 and 148, and beam 144 into beams 148 and 146). The grating 130, consisting of a first type 134 and second type 132 of domains, is disposed at an angle to the two guides in the intersection region between them. The angle of the grating is preferably chosen such that the bisector of the angle between the two guides is normal to the domain boundaries of the grating, in the plane of the waveguide.

A first input beam 142 is incident on and is coupled into the first waveguide 136 and a second input beam 144 is coupled into the second waveguide 138. A first electrode 150 and second electrode 152 are laid out on the dielectric material so that an electric field is created in the intersection region between the waveguides, when a voltage source 154 connected between the two electrodes is turned on. The electric field controls the strength of the index grating in the intersection region through the electro-optic effect. When the grating is on, a portion of the in-band component of the first input beam is coupled from the first waveguide to the second waveguide to form a first output beam 146. At the same time, a portion of the in-band component of the second input beam from the second waveguide is coupled into the first waveguide to form the second output beam 148. In addition, the out-of-band components of the two beams, and any unswitched components of the in-band beams, continue to propagate down their respective waveguides to form additional portions of the appropriate output beams. Thus, for two beams with multiple optical frequency components, a single frequency component in the two input beams can be switched between the two output beams.

The waveguide may only be a segment, in which case it is connected to other optical components located either off the substrate, or integrated onto the same substrate. For example, the waveguide segment could be connected to pump lasers, optical fibers, crossing waveguides, other switchable gratings, mirror devices, and other elements. An array of crossing waveguide switches would comprise an optical switching network.

Figure 9:
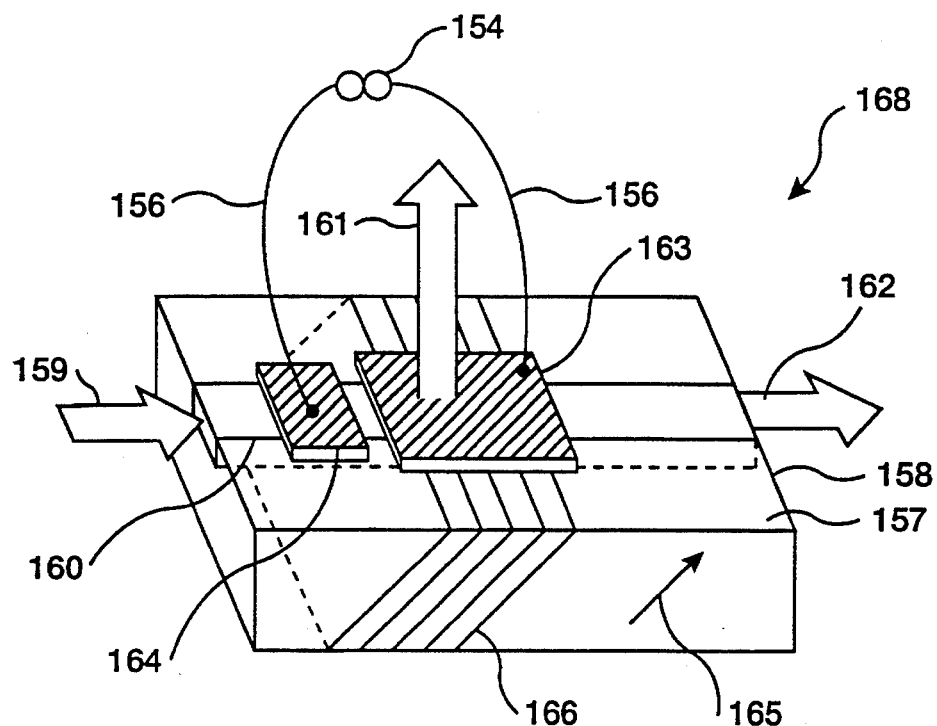
FIG. 9 is an embodiment of a poled waveguide output coupler, with output out of the plane of the waveguide.

In FIG. 9, a further embodiment of the waveguide coupling switch is shown. The domain walls of the grating are now disposed at a non-normal angle to the surface 157 of the crystal 158, so that the input beam 159 in waveguide 160 is reflected out of the plane of the crystal to form a reflected output beam 161. As before, an unreflected beam continues to propagate through the waveguide to form a transmitted output beam 162. An optically transparent first electrode 163, which can consist of indium tin oxide, is disposed on one face of the dielectric material 158, over a portion of the grating that crosses the waveguide. A second electrode structure 164, which may be optically absorbing, is disposed on the material. As in all cases described in this disclosure, the second electrode may be arranged in one of many alternate configurations: surrounding the first electrode as in FIG. 7, on opposite sides of the material 158 as on FIG. 2, tapered similar to the configuration shown in FIG. 6. The electrodes are connected with two wires 156 to a voltage source 154, which controls the power splitting ratio of the in-band beam between the transmitted beam 162 and the reflected beam 161. Alternately, the electrode configuration could be as shown in FIG. 5, in which case both electrodes may be opaque.

Referring again to FIG. 9, the domain walls are preferably formed by electric field poling of a ferroelectric crystal which is cut at an angle to the z-axis 165. Since the electric field poled domains travel preferentially down the z axis, poling an angle-cut crystal by this technique results in domain boundaries parallel to the z axis, at the same angle to the surface. The angle 166 of the cut of the crystal is preferably 45° so that light propagating in the plane of the crystal may be reflected out of the substrate normal to the surface of the material (any angle may be used). The domains shown in FIG. 9 are planar, but can also be configured in more general configurations. A planar grating will produce a flat output phase front from a flat input phase front. If the device shown is used as a bulk reflector without the waveguide, a collimated input beam will produce a collimated output beam. The device is useful as a bulk reflector for example if a beam is incident from outside the device, or if the waveguide is brought to an end within the device with some distance between the end of the waveguide and the poled reflector. In some cases, however, it may be desirable to produce a curved output phase front from a collimated beam, as in the case of some applications requiring focussing, such as reading data from a disk. By patterning a set of curved domains on the upper surface of the substrate illustrated in FIG. 9, a set of curved domains may be poled into the bulk of the material since the domain inversion propagates preferentially along the z axis. A concave (or convex) set of domains may therefore be formed which create a cylindrical lens when excited by a field. Wedges and more complicated volume structures oriented at an angle to the surface may be formed by the same process.

In an alternate method, a z-cut crystal can be used as the substrate if the poling technique causes the domain boundaries to propagate at an angle to the z-axis. For example, titanium (Ti) in-diffusion in a z-cut crystal of lithium niobate produces triangular domains that would be appropriate for reflecting the beam out of the surface of the crystal. The angle of the domains formed by in-diffusion with respect to the surface is typically about 30°, so that an input beam incident on the grating will be reflected out of the surface at an angle of about 60° to the surface of the crystal. The output beam may then extracted with a prism, or from the rear surface (which may be polished at an angle) after a total internal reflection from the top surface.

The electrode structure shown excites both an $E_3$ component, and either an $E_1$ or an $E_2$ component. A TM polarized input wave 159 experiences an index change which is a combination of the extraordinary and the ordinary index changes.

Figure 10:
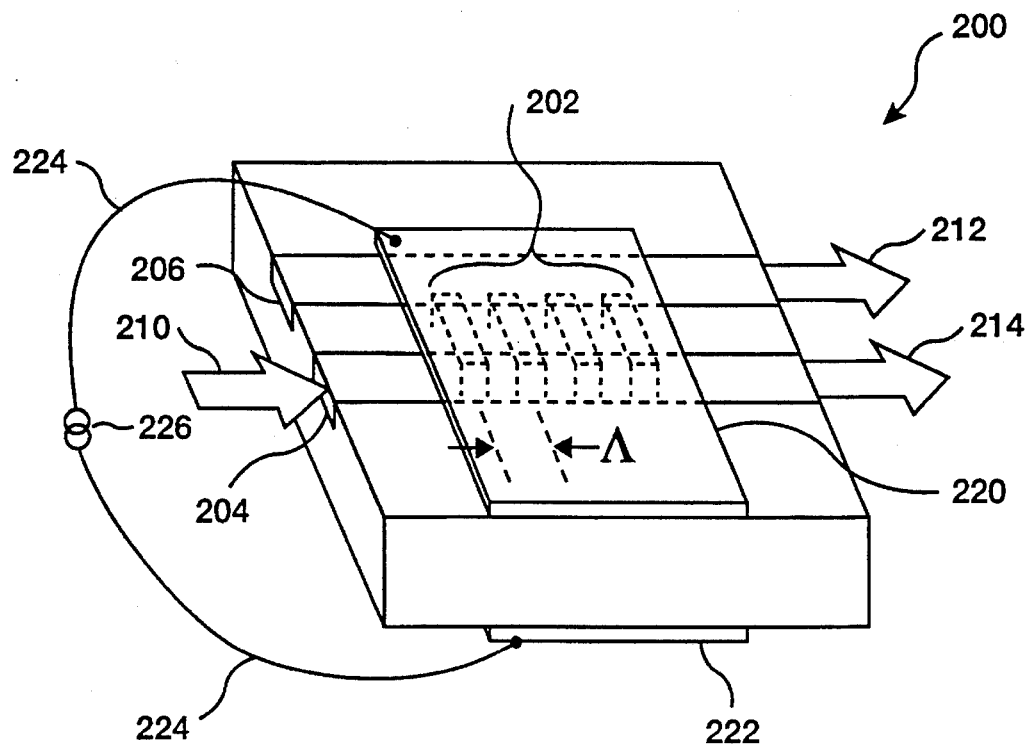
FIG. 10 is an embodiment of a parallel waveguide poled directional coupler.

In FIG. 10 there is shown an embodiment of a switchable waveguide directional coupler. A first waveguide 204 is substantially parallel to a second waveguide 206, over a certain length. While the beams propagate adjacent each other and in a similar direction, their central axes are displaced. The central axes are never brought coaxial so that the waveguides do not intersect. However, the waveguide segments are in close proximity in a location defined by the length of the coupler, so that the transverse profiles of the optical modes of the two waveguides overlap to a large or small extent. The propagation of the two modes is then at least evanescently coupled (which means the exponential tails overlap). The evanescent portion of the mode field is the exponentially decaying portion outside the high index region of the waveguide. The propagation constant associated with a mode of each of the two waveguides is determined by $k=2\pi n_{eff}/\lambda$ in the direction of propagation. The effective index $n_{eff}$ is the ratio of the speed of light in a vacuum to the group velocity of propagation, which varies according to the mode in the waveguide. The value of $n_{eff}$ is determined by the overlap of the mode profile with the guided wave structure.

Preferably, the width of the two waveguides, and thus the propagation constants of the modes in the two waveguides, are different, so that coupling between the modes is not phasematched when the grating is off. (The index of refraction profiles of the two waveguides may also be adjusted to create different propagation constants.) With the grating off, any input beam 210 in the first waveguide will continue to propagate in that waveguide to form a transmitted output beam 214 exiting the first waveguide 204. When the grating is on, the grating makes up the difference in the propagation constants of the two waveguides so that coupling between the two modes is phasematched, and an in-band output beam 212 exits the second waveguide 206. To optimize the coupling, the grating period A is chosen so that the magnitude of the difference of the propagation constants in the two waveguides is equal to the grating constant (within an error tolerance). The propagation constants of the two waveguides may alternately be chosen to be equal, so that coupling between the two waveguides occurs when the grating is off. In this case, turning the grating on reduces the coupling between the two guides.

The strength of the grating determines a coupling constant, which defines the level of coupling between the two waveguides. Along the length of the interaction region of the two waveguides, the power transfers sinusoidally back and forth between the guides, so that coupling initially occurs from the first waveguide to the second, and then back to the first waveguide. The distance between two locations where the power is maximized in a given waveguide mode is known as the beat length of the coupled waveguides. The beat length depends on the strength of the grating.

A first electrode 220 and second electrode 222 are positioned on the material surface to create an electric field across the grating region 202 when a voltage is applied between the two electrodes. A voltage source 226 is connected to the two electrodes with an electrically conductive material 224. The strength of the grating, and thus the beat length between the two waveguides, is controlled by the voltage applied across the grating.

The propagation constants of the two guides are strongly dependent on wavelength. Since the momentum of the virtual photon is essentially or dominantly fixed (i.e. determined by parameters which are not varied in an application), power is transferred to the second waveguide only in the vicinity of a single frequency with a frequency bandwidth depending on the length of the coupling region. Depending on the grating strength, an adjustable portion of the in-band input beam exits the second waveguide as the coupled output beam 212, while the out-of-band portion of the input beam exits the first waveguide as the transmitted output beam 214 along with the remainder of the in-band beam.

The coupling between the two modes can be controlled electro-optically by several means, including changing the strength of the coupling between the modes, increasing the overlap of the modes, or changing the effective index of one of the waveguides. Electro-optically controlled coupling, described above, is the preferable method. In order to couple efficiently between the modes in the two waveguides, the input beam is forward-scattered, which requires the smallest grating period.

The coupling grating can alternatively be implemented as a combination of permanent and switched gratings as described above in conjunction with FIG. 2. Here we give a detailed example of how this can be done. After forming the desired periodic domains, the substrate can be chemically etched to form a relief grating with exactly the same period as the poled structure. For the preferred material of lithium niobate, the etch can be accomplished without any further masking steps, since the different types of domains etch at different rates. For example, hydrofluoric acid (HF) causes the −z domains of lithium niobate to etch significantly (>100×) faster than the +z domains. Thus by immersing the z-cut crystals in a 50% HF solution, the regions consisting of the first type of domain are etched while the regions consisting of the second type of domain essentially remain unetched. This procedure produces a permanent coupling grating which can be used on its own to produce coupling between the two waveguides. After the electrodes are applied, the poled grating can be excited to produce an additive index of refraction grating which is superimposed on that of the etched substrate. The etch depth may be controlled so that the effective index change induced by the permanent etched grating can be partially or wholly compensated by the electro-optically induced grating when the electrodes are excited at one polarity, while the index grating is doubled at the other excitation polarity. A push-pull grating is thereby produced whereby the grating can be switched between an inactive state and a strongly active state.

An etched grating is also useful when the etched region is filled with an electro-optical material, such as a polymer or an optically transparent liquid crystal, with a high electro-optic coefficient and an index close to that of the substrate. Preferably, the filled etched region extends down into the optical beam. When a voltage is applied across the filled etched region, the index of the filler material is also varied around that of the rest of the waveguide.

Alternately, the overlap of the modes in the two waveguides can be electro-optically modified. For example, the region between the two waveguides could have its refractive index raised. This reduces the confinement of the waveguides, and spreads the spatial extent of the individual modes towards each other, increasing the overlap. To implement this approach, the region between the two waveguides may be reverse poled with respect to the polarity of the substrate traversed by the waveguides. If the electrode extends across both the waveguides and the intermediate region, an applied voltage will increase the index of the area between the waveguides while decreasing the index within the two waveguides. The resulting reduction in mode confinement thus increases the overlap and the coupling between the two modes. Care must be taken not to induce undesirable reflections or mode coupling loss in the waveguides, which might occur at the edge of the poled region. These losses can be minimized, for example, by tapering the geometry of the poled regions or of the electrodes so that any mode change occurs adiabatically along the waveguide, minimizing reflections. Art adiabatic change means a very slow change compared to an equilibrium maintaining process which occurs at a definite rate. In this case, it means the change is slow compared to the rate of energy redistribution which occurs due to diffraction within the waveguide and which maintains the light in the mode characteristic to the waveguide.

A third means to change the coupling between the two waveguides is to change the effective index of one of the waveguides relative to the other. Thus, the propagation constant of the guide is changed, which in turn alters the phasematching condition. This effect may be maximized by poling one of the waveguides so that its electro-optic coefficient has the opposite sign from that of the other waveguide. In this case, the coupling grating may be a permanent or a switched grating. A first electrode covers both waveguides and the region between them, while a second electrode may be disposed on both sides of the first electrode. An electric field applied between the two electrodes causes the propagation constant of one waveguide to increase, and that of the other waveguide to decrease, thus maximizing the difference in propagation constants. The grating coupling process is maximally efficient only at a particular difference in propagation constants. By tuning the applied voltage, the phasematching may be adjusted as desired. This effect can be used to create a wavelength tunable filter.

The parallel waveguides shown in FIG. 10 may be non-parallel, and the waveguides may not even be straight. If it is desired, for instance, to spatially modify the interaction strength between the waveguides, this end can be accomplished by spatially adjusting the separation between the guides. These modifications may also, of course, be applied to the subsequent embodiments of parallel waveguide couplers described herein.

Figure 11:
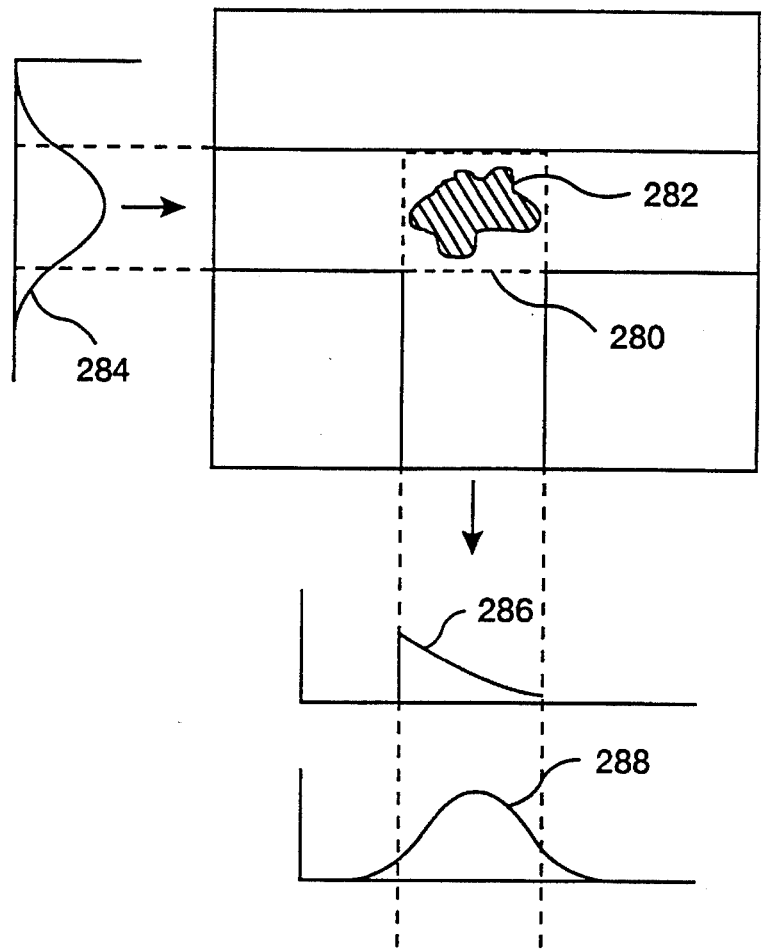
FIG. 11 is a top view schematic diagram of the an x crossing waveguide coupler with illustrations of alternative input and output mode profiles.
Figure 12:
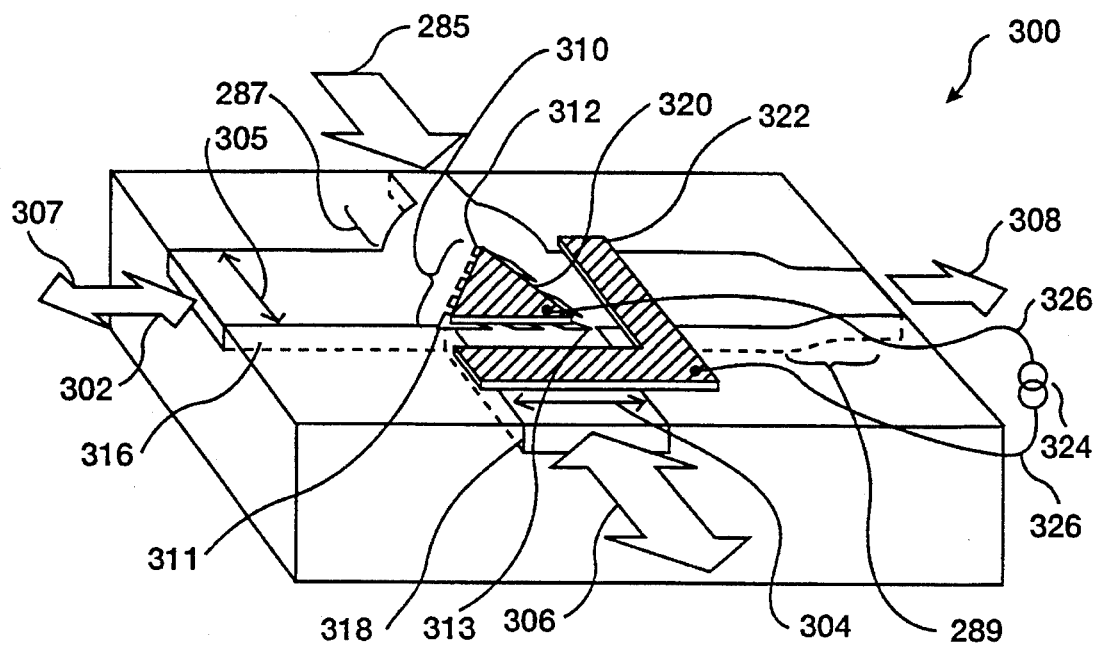
FIG. 12 is an embodiment of an x crossing waveguide coupler with tapered coupling region geometry excited with a tapered electrode gap.
Figure 13:
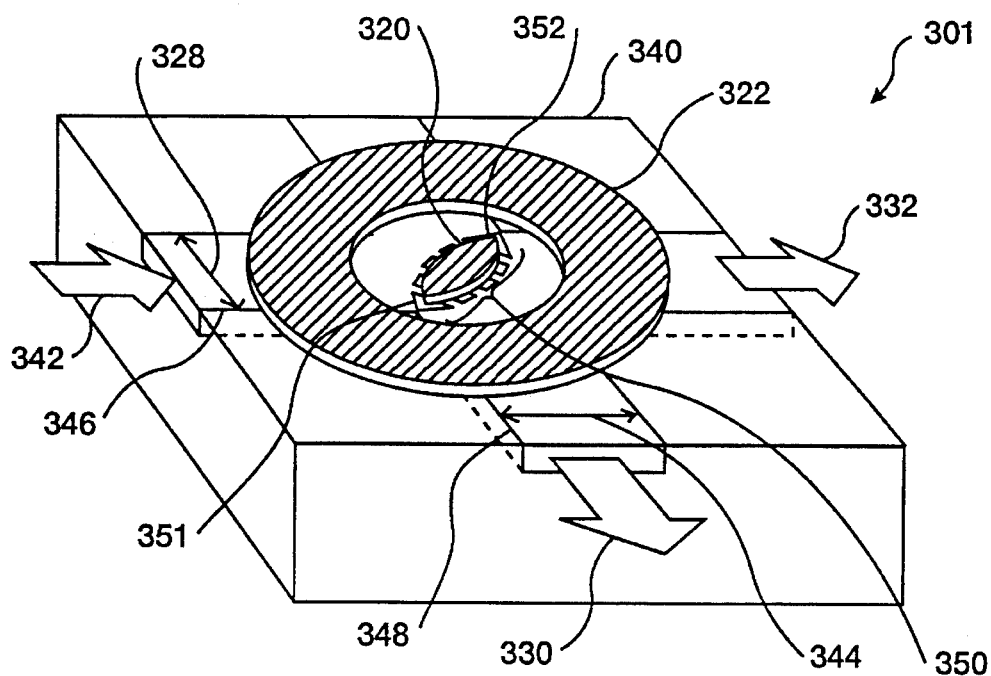
FIG. 13 is an embodiment of an x crossing waveguide coupler with generalized coupling region geometry and electrode pattern.

Referring to FIGS. 12 and 13 there are shown alternate embodiments of the crossing waveguide coupler for controlling the profile of the reflected beam. In each embodiment, the area covered by the grating does not extend entirely across the intersection region of the two waveguides. The motivation for these grating structures is best understood with reference to FIG. 11. Depending on how it is configured, the power coupling structure 282 may distort the spatial profile of the mode 284 it couples into the output waveguide. A power coupler which is uniform in space and which uniformly covers the entire intersection region 280 between two waveguides disposed at a large angle to each other such as 90° will produce an output beam profile such as assymmetric profile 286. The power in the input beam decreases as it passes through the power coupling structure or grating. In the case of a fight angle intersection, the near field profile of the reflected beam matches the monotonically decreasing power in the input beam. The disadvantage with the nonsymmetric profile 286 lies in single mode structures where only a fraction of the coupled power will remain in the waveguide. Much of the power will be lost from the guide.

For single mode devices, a structure is needed which couples power into the Gaussian-like spatial configuration 288 of the lowest order mode of the output waveguide. To accomplish this goal, the region 282 must be extended out into the evanescent tails of the guided modes, and the net interaction must be modulated, either geometrically or by spatially adjusting the local strength of the power coupling grating. FIGS. 12 and 13 show ways to accomplish this end with geometrical arrangements of gratings. It is also possible to accomplish this end by spatially modulating the "duty cycle" of the grating within the power coupling region 282, by changing the order of the grating in selected regions, and in the case of electrically controlled coupling, by tapering the strength of the applied electric fields (by adjusting electrode spacing as illustrated in FIG. 6, or by adjusting the electrode duty cycle in the case of grating electrode structures). The duty cycle of a grating means the fraction of each period which is occupied by a given domain type; the duty cycle may vary with position.

In FIG. 12, a device 300 with a modified grating structure is shown, in which the grating area 310 covers part, but not all of the rectangular intersection region of the two normal guides 316 and 318. With the grating unactivated, the input beam 302 passes through guide 316 undeflected to exit as output beam 308. The dimensions of the intersection region match the widths 304 and 305 of the two waveguides. The presence of a small region of power coupling structure at any point in the intersection region will result in local coupling between a given transverse segment of the beam profile in an input waveguide into a given transverse segment of the beam profile in an output waveguide. The reflected beam profile is constructed from the propagated sum of these phased-coupled contributions. The grating region 310 depicted is triangular in shape, with the points of the triangle 311,312, and 313. The shape of the grating region can be modified from the triangular, and the local grating strength can be modulated. The exact shape of the grating region which optimizes single mode coupling characteristic between the waveguides can be calculated with an established waveguide propagation technique, such as the beam propagation method.

A further embodiment of a single-mode coupling grating device 340 is shown in FIG. 13. The grating region 350 is a double convex shape, with one point at corner 351 common with waveguides 346 and 348 and beams 330 and 342, and the other point on opposite corner 352, common with both waveguides and beams 342 and 332. This structure has the advantage of reflecting most of the power in the middle of the beam, where the optical intensity is the highest, and thus better couples the power between the lowest order modes in the two waveguides 346 and 348. The optimal shape of the grating region again depends on the coupling constant of the grating.

Referring to FIGS. 12 and 13, a first electrode 320 is disposed on the same surface of the substrate as the waveguide, over the grating region, and a second electrode 322 is disposed on the same surface around the first electrode. The distance between the two electrodes may be constant as illustrated in FIG. 13, or it may be tapered as illustrated in one dimension in FIG. 12. A voltage control source 324 is connected with two wires 326 to the two electrodes. An electric field can thus be applied through the grating region to activate one of the electro-optic coefficients and change the coupling between the input beam and the output beam.

For purposes of illustration, FIG. 12 also shows a tapered input waveguide segment 287 and a tapered output segment 289. An input beam 285 expands adiabatically through the tapered segment 287 to increase the intersection area and thereby increase the total reflection from grating 310. The grating is capable of reflecting the now-expanded beam 285 toward the output beam 308. If desired, the output waveguide may also contain a tapered segment 289 to reduce the width of the output beam. (Alternatively, the output beam may be kept wide if desired for later beam switching interactions.)

The grating may extend beyond the intersection region of the two waveguides. A grating extended along the input waveguide enables residual transmitted light after the intersection region to be removed from the waveguide, typically into radiation modes. The extended grating minimizes crosstalk between optical channels in switching arrays, in which an individual waveguide may have more than one signal channel propagating along its length.

Figure 14:
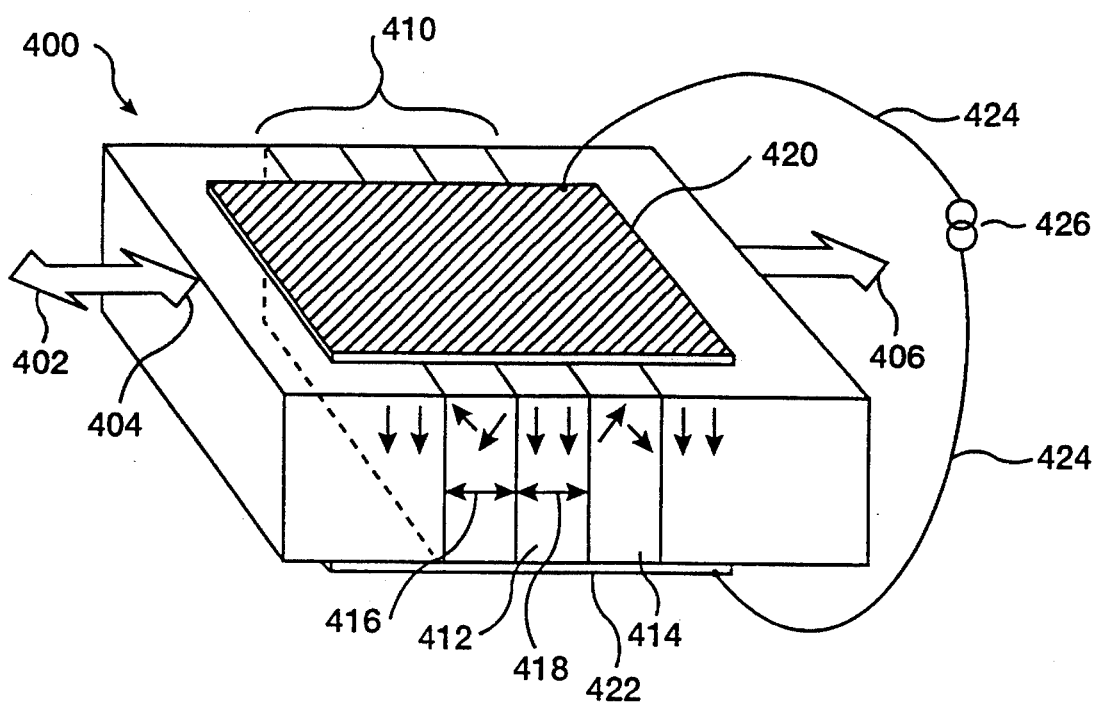
FIG. 14 is a bulk optics embodiment of a tunable-frequency poled electro-optic retroreflector.

Specifically contemplated by the invention is a means for tuning the grating. Several embodiments in which tuning is achieved are shown in FIGS. 14–17. Referring to FIG. 14, there is a bulk optical device 400 in which the strength and center wavelength of a normal incidence reflection grating are controlled by a single voltage source 426. This device consists of a patterned poled grating region 410, which is electro-optically activated by two electrodes 420 and 422 on opposing surfaces of the material and connected to 426 by conductors 424. The strength and the center frequency of the grating are tuned simultaneously by applying a single voltage between the two electrodes of the device. The average refractive index of the grating changes with the applied electric field, causing a change in the center wavelength of the grating that is proportional to the electric field. The average index is calculated over a single period of the grating in a periodic grating, by summing the weighted index changes in the various types of domains. The weighting factor is the physical length 416 and 418 of each domain type, along the optical path of the input beam 404. The condition for frequency tuning is that the weighted sum must not equal zero so that the average index changes as a result of the electric field.

The product of the index of refraction and the physical distance traversed by an optical beam is known as the optical distance. (The index of refraction is replaced by the effective index of refraction for waveguide devices.) A 50% duty cycle is obtained in a grating with two types of domain if the average optical distance across the two types of domains is substantially equal (approximately equal within the error range determined by the needs of the application). The average is taken over many subsequent domains to allow for the possibility of a chirped, nonperiodic, or other more general type of grating. In general the domains may have different indices of refraction as well as different electro-optic coefficients. The general condition for tuning is expressed in terms of the physical distance travelled in the different types of domains. For each domain, the total optical phase advance is given by the optical distance travelled (times $2\pi/\lambda$). However, the change in the phase advance is given by the product of the applied electric field, the appropriate electro-optic coefficient, and the physical distance (times $2\pi/\lambda$). The average change in index of refraction experienced by the wave is equal to sum of the changes in phase advance in all domains traversed by the optical wave within a section of the material of length l (times $\lambda/2\pi l$). This change in average index determines the change in the peak interaction wavelength according to $\delta\lambda/\lambda=\delta n/n$. The grating strength is changed simultaneously with the wavelength in this structure, but such simultaneous change may be undesirable. The structure may be designed so that the operating point about which timing is accomplished maintains a sufficiently high grating strength for the application across the entire wavelength tuning range. Or, a separate tuning structure may be used as is described below in reference to FIGS. 16 and 17.

The change in the average refractive index can be achieved by many different means. One alternative is that of randomly non-electro-optically active domains 414 alternating with electro-optically active domains 412. The electro-optically active regions are poled domains, while the non-electro-optically active domains may be randomly poled or unpoled or radiation-disabled. Thus, the electric field causes an average increase in the index $\Delta n_{avg}$ across the grating. In the poled-random configuration of FIG. 14, $\Delta n_{avg}$ is equal to the product of the index change in the active domains 412 times the duty cycle. The duty cycle is equal to the length 418 divided by the sum of the lengths 418 and 416. The tunability that can be achieved using this technique is $\lambda\delta n_{avg}/n$ in a poled-random structure, where $\lambda$ is the optical wavelength, and n is the original (effective) index of the material. Assuming a wavelength of 1.55 µm and a 10 V/µm electric field in lithium niobate, the tuning range for a 50% duty cycle structure is 1.1 nm.

When the input beam 404 is within the bandwidth of the grating, the grating couples the beam into a retroreflecting output beam 402; otherwise the input beam forms a transmitted output beam 406. Contrast this behavior with that of a 50% duty cycle grating where the two domain types have the same electro-optic coefficients but opposite polarity, as in the case of domain inversion. In this latter case, there is no change in the average index of refraction since the change in index of the first domain type cancels with the change in index of the other domain type. A 50% duty cycle domain reversal grating does not tone its center frequency.

An alternate means to achieve an average effective index change in domain reversed gratings is to use a non-50% duty cycle for the poled domain area with unequal lengths 416≠418. The tunability that can be obtained using this technique is $(2D-1)\Delta n \lambda/n$, where D is the duty cycle of the largest domain type (D>0.5). For example, with a 75% duty cycle, a wavelength $\lambda$ of 1.55 µm, and a 10 V/µm electric field in lithium niobate, the tuning range is 0.54 nm. The domain reversed grating is also stronger than a grating in which the second domain type is not electro-optically active.

Figure 15:
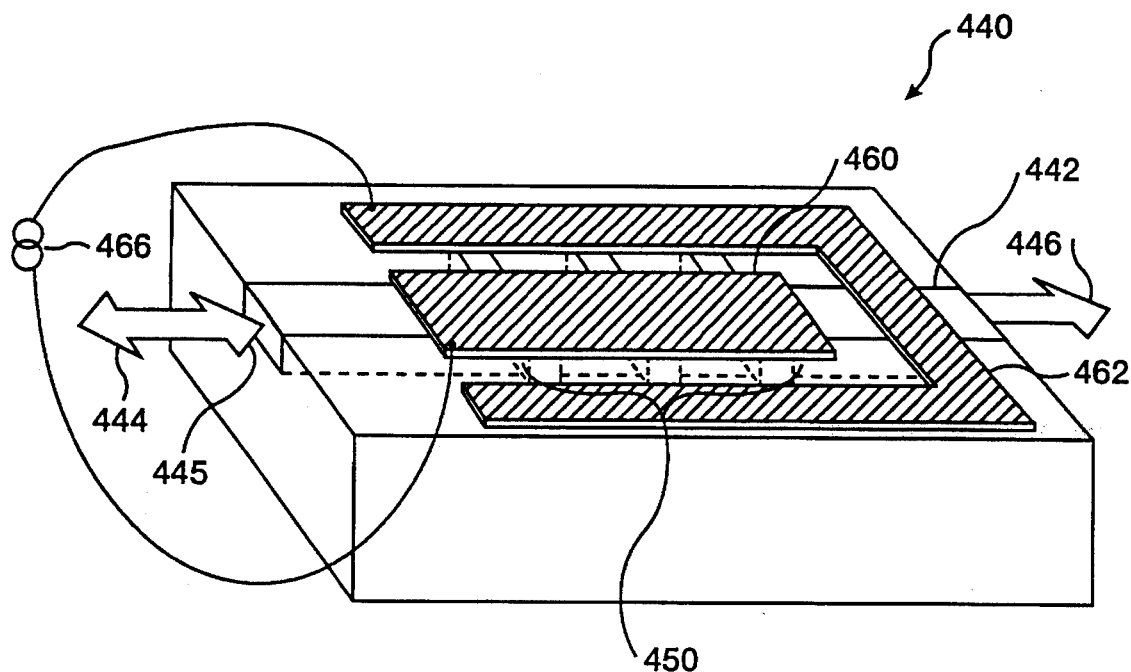
FIG. 15 is a waveguide embodiment of a tunable-frequency poled electro-optic retroreflector.

In FIG. 15, a waveguide device 440 using the same average index effect is shown. In this case, the average effective index of the waveguide 442 in the grating region 450 changes with the applied electric field, causing a change in the center wavelength of the grating. A voltage control source 466 is used to apply an electric field between a first electrode 460 and second electrode 462, which are preferably placed on the same surface of the material. The average effective index can be achieved by a variety of geometries, including non-electro-optically active domains or a domain reversal grating with a non-50% duty cycle. When the input beam 445 is within the bandwidth of the grating, the grating couples the beam into a retroreflecting output beam 444; otherwise the input beam forms a transmitted output beam 446.

Figure 16:
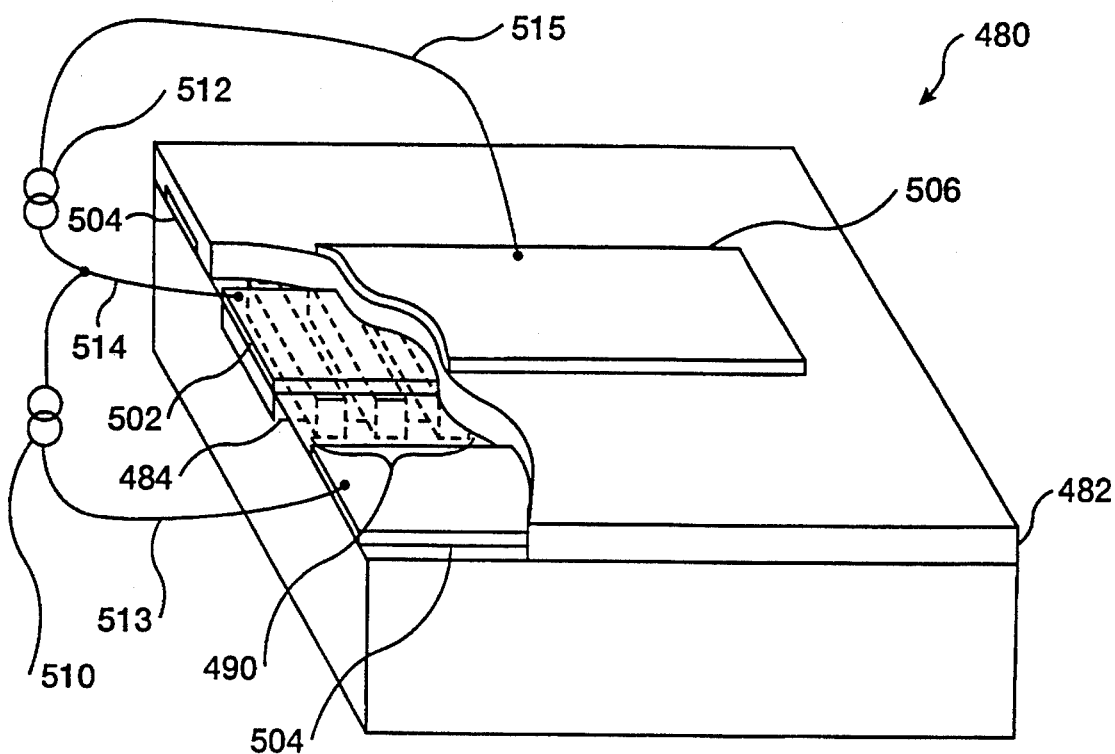
FIG. 16 is a bulk optics embodiment of a tunable-frequency electro-optic retroreflector with electro-optic cladding and independent excitation of poled grating and cladding.

A means to enhance the tunability of a grating in a waveguide device 480 is to overlay a second electro-optic material 482 on the waveguide to form a cladding, as shown in FIG. 16. The cladding should be transparent to the wave propagating in the waveguide and it should be electric field-sensitive to enable adjustable modification of its index of refraction. The average effective index is determined partly by the index of refraction of the cladding. The second material may have a higher electro-optic coefficient than the substrate. Liquid crystals and polymers are good examples of materials which can be used as cladding. The index of the cladding is preferably close to that of the guiding region so that a large portion of the guided beam propagates in the cladding.

For this embodiment, a first electrode 502 is surrounded by a second electrode 504 on the substrate, for applying an electric field across the poled grating 490. Preferably, the electrodes are placed below the cladding, directly on the substrate. If the first electrode 502 is positioned directly above the waveguide 484 as shown in FIG. 16, it must be made of an optically transparent material. The electrodes may also be disposed to either side of the waveguide 484, in which case they need not be transparent. A third electrode 506 is positioned on top of the cladding, above the waveguide and the first electrode. For this embodiment, the center wavelength and strength of the grating are separately controllable. The grating strength is controlled by a first voltage source 510, connected by two wires 513, 514 to the first and second electrodes, while the center wavelength of the grating is controlled by a second voltage source 512, connected between the first and third electrodes with two wires 514 and 515. In an alternate electrode configuration, only two electrodes are used, both of which are preferably positioned on top of the cladding material so that their induced field penetrates both the cladding material above the grating, and the grating structure itself. A single voltage source then controls both the center wavelength and the grating strength, but not independently.

The amount of tunability that can be achieved with an electro-optically active cladding depends on what portion of the guided beam propagates in the cladding. If the two indices are relatively close so that 10% of the beam propagates in the cladding, then the average change in the effective index of the guided mode is equal to 10% of the change in index of the cladding. For a cladding index change of 0.1, the tunability is on the order of 7 nm.

Figure 17:
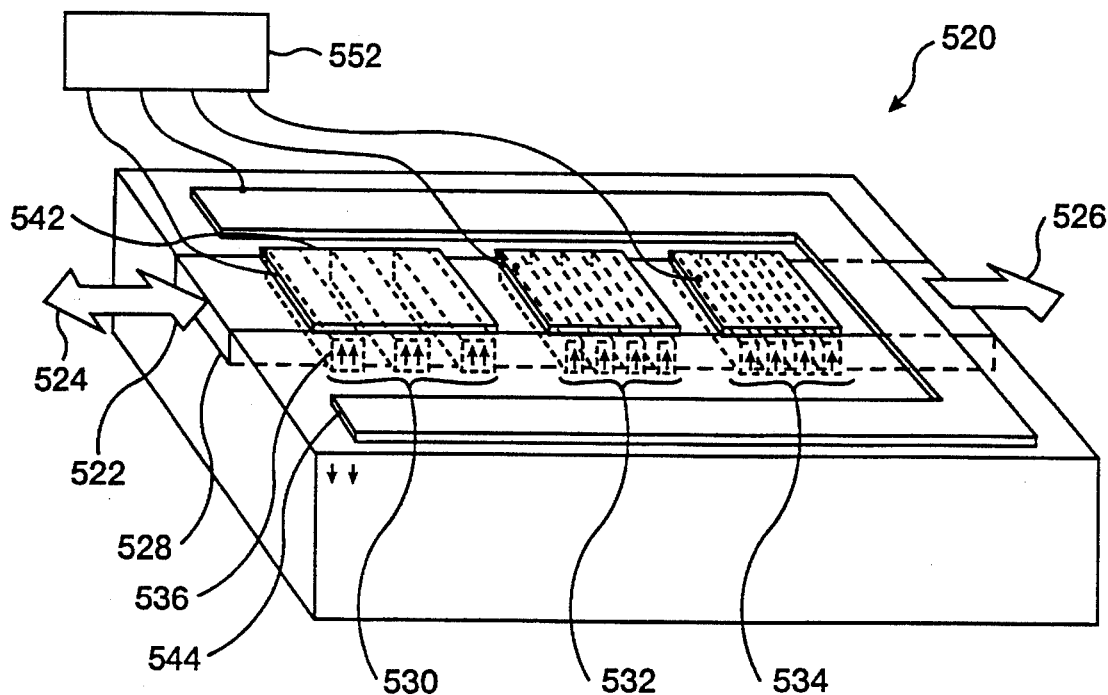
FIG. 17 is a waveguide embodiment of a multiple frequency poled electro-optic retroreflector.

FIG. 17 shows an embodiment of a discretely tunable grating device 520, which consists of several individually controllable gratings 530, 532, 534. The gratings in series, with all gratings in the path of the input beam 522, and forward 523 and reflected 524 beam. Each individual grating in the structure may also be continuously tunable over a small range. Each grating in FIG. 17 has a first electrode 542 and a second electrode 544, which are connected to a voltage controlling network 552 with wires. The gratings can be switched on one at a time, so that only one wavelength in a small passband will be reflected at a time, or multiple gratings can be switched on simultaneously to create a programmable optical filter, with a center wavelength and bandwidth which are separately controlled. The gratings themselves may be implemented with the variations described above, including the possibility of multiple periods in each grating.

The structure can be realized either in the bulk or as a waveguide device. In the latter case, an optical waveguide 528 is fabricated on the substrate so that the waveguide intersects the poled gratings. The poled domains 536 may extend only through the waveguide and do not necessarily extend all the way through the material. Both electrodes are preferably (for higher field strength) deposited on the same face of the substrate as the waveguide. The second electrodes of all the gratings may be connected as shown to minimize the number of electrical connections.

Alternately, the individually-addressable grating structure can be a bulk device, in which case the waveguide 528 is omitted, and the poled regions 530, 532 and 534 are optimally fabricated with sufficient depth to overlap with the propagating optical mode. The two electrodes for controlling each grating are then optimally positioned on opposing faces of the material to optimize the field penetration, as shown for example in FIG. 2 for a single grating. Cross excitation between adjacent gratings caused by fringing of the electric fields between the electrodes can be minimized by separating the grating-electrode groups by an amount comparable to the substrate thickness, or by adding interspersed fixed-potential electrodes.

An alternate means for tuning the grating is to vary the temperature of the active material. The tuning occurs because of two effects: thermal expansion and the thermo-optic effect. For different materials, either one of these two effects may dominate thermally induced tuning. In lithium niobate, the larger effect is thermal expansion, for which the largest (a-axis) expansion coefficient $\Delta L/L$ is $+14 \times 10^{-6 \circ}$ C.$^{-1}$, while the thermo-optic coefficient for the ordinary axis $\Delta n_o/n$ is $+5.6 \times 10^{-6 \circ}$ C$^{-1}$. For a temperature range of 100°

C., the combination of these two effects gives a total wavelength tuning range of 2.6 nm.

Figure 18:
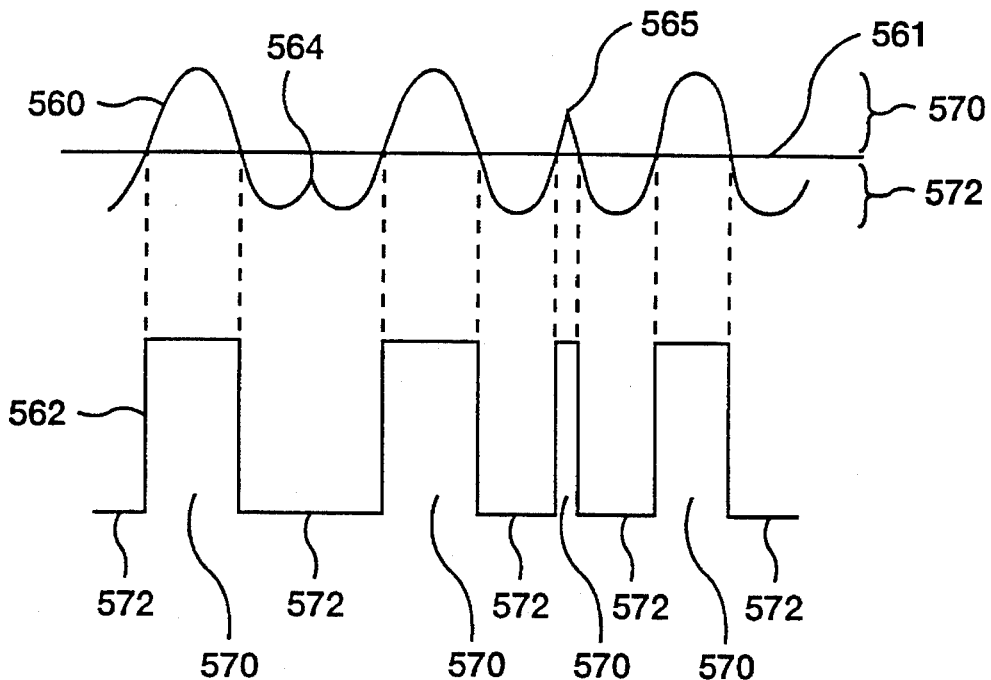
FIG. 18 is an illustration of a phase shifted poled grating.

For many purposes, it is desirable to create poled gratings with a generalized frequency content. Multiple interaction peaks may be desired for example, or simply a broadened bandwidth of interaction. To accomplish this end, some way is needed to determine the pattern of poled region boundaries which corresponds to a given mathematical function containing the desired frequencies. FIG. 18 illustrates the results of the process in the case of a single frequency containing arbitrary phase shifts. Referring now to FIG. 18, optical phase shifts 564 and 565 can be incorporated at one or more positions along a sinusoidal function 560 to modify its wavelength structure. The mean level of the function is given by the straight line 561. Also shown is the corresponding squared wave function 562 with identical phase shifts, as can be achieved by a typical poling process. To achieve the translation of the continuous function into the square wave function, the regions 570 where the curve 560 exceed the average 561 sine wave corresponds to one type of domain, while the regions 572 where the curve 560 falls below 561 corresponds to a second type of domain. The Fourier transform of the square wave curve 562 will have the same frequency components as the transform of the sinusoidal function 560 in the low frequency range below the harmonics of the sine wave frequency. This approach works for any type of generalized frequency distribution as long as the bandwidth does not exceed a small fraction of the carrier frequency.

A phase shifted grating may be implemented in any of the devices described herein such as in FIG. 2 for example, where the location of the domain walls 34 in the grating 22 can be determined by the pattern 562 of FIG. 18 rather than a periodic function. The phase shifted pattern can be controlled with a poling mask incorporating the desired pattern.

Arbitrary multiple period gratings can be specified using a similar technique. Each period present in the grating is represented in a Fourier series (or integral) by a corresponding sign wave of the desired amplitude. All waves are added together to form a resultant wave. The positive portion of the resultant wave corresponds to one type of domain, while the negative portion corresponds to the second type of domain. The number of superimposed gratings can in principle be scaled up to any number, limited in practice by the minimum attainable feature size.

Figure 19:
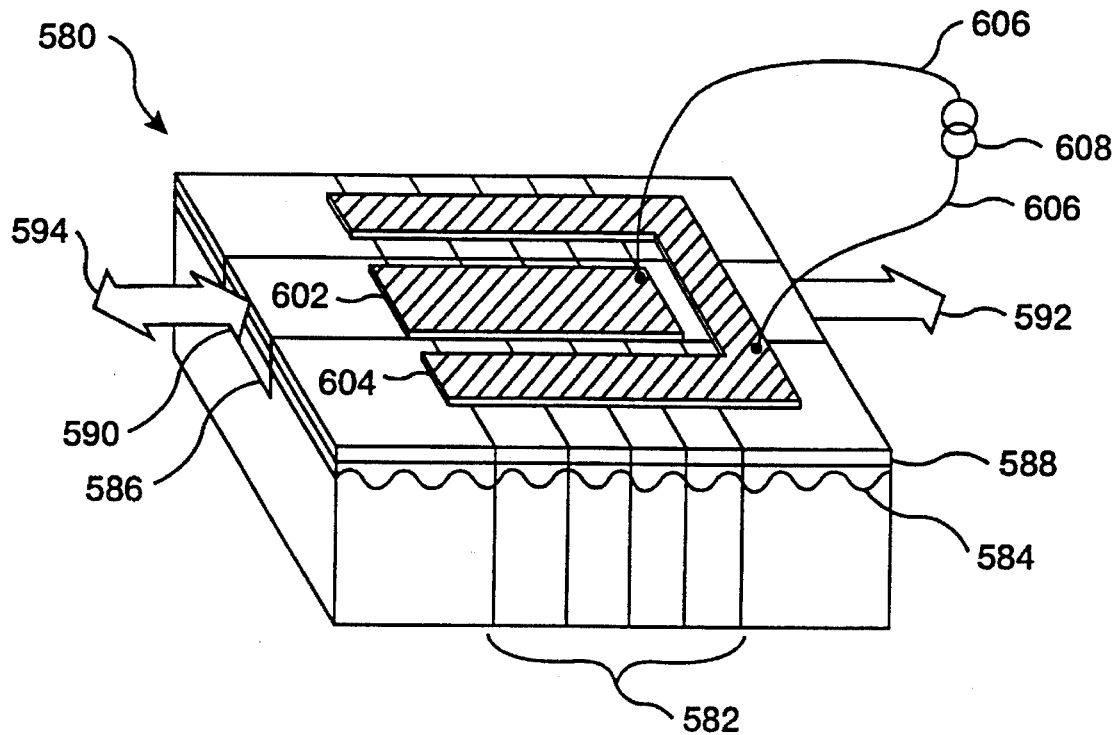
FIG. 19 is an embodiment of a multiple period grating reflector.

FIG. 19 shows an alternate way of fabricating a superimposed multiple-period grating device 580. A two grating waveguide structure is depicted, with a switchable single period poled grating 582, and a permanent relief grating 584 interacting with a single beam in a waveguide. A coating 588 is shown deposited on top of the relief grating to reduce the loss which occurs when the evanescent tail of the guided wave mode overlaps with the metallic electrode. This coating is an important design optimization element for all of the elements described herein, and should be applied between each electrode structure and adjacent optical waveguides. A coating is also useful above the electrodes in all of the elements described herein to reduce the probability of breakdown.

The electrically controllable gratings in the superperiod structure are switched by a single pair of electrodes 602 and 604, connected by wires 606 to a voltage control source 608. The first electrode 602 is preferably centered over the waveguide, while the second electrode 604 runs parallel to the first, on either side of the waveguide. The device depicted is a waveguide device, with a waveguide 586 confining the input beam 590, as well as the transmitted output beam 592 and the reflected output beam 594.

The multiple period grating structure can be configured in many ways. For example multiple independent peaks in the frequency spectrum can be useful as a multiple frequency feedback mirror. Two operations (e.g.., phasematching and reflection) can be achieved in a single grating which incorporates the proper two periods for enabling the processes. As a final example, the grating can be fabricated with the phase and amplitude of its components adjusted for equal effect on the two polarization modes, making a polarization insensitive component.

Another useful modification of a periodic structure is a chirped period. Along the length of the grating structure, the period can be gradually increased or decreased, so that the center wavelength varies from one end of the grating to the other. Thus, the wavelength bandwidth of the grating is broadened over that of a constant period grating. The chirping across the grating is not necessarily linear: many different wavelength reflection profiles in frequency space (e.g.., square wave, Lorentzian) can be achieved, depending on the variation in the chirp rate. As described above, the duty cycle and/or the strength of the exciting electric field can also be spatially adjusted to modify the strength of different portions of the chirped grating. The duty cycle of the grating can be controlled by the mask as desired. The electric field strength can be controlled by adjusting the separation of the electrodes as shown for instance in FIG. 6.

Figure 20:
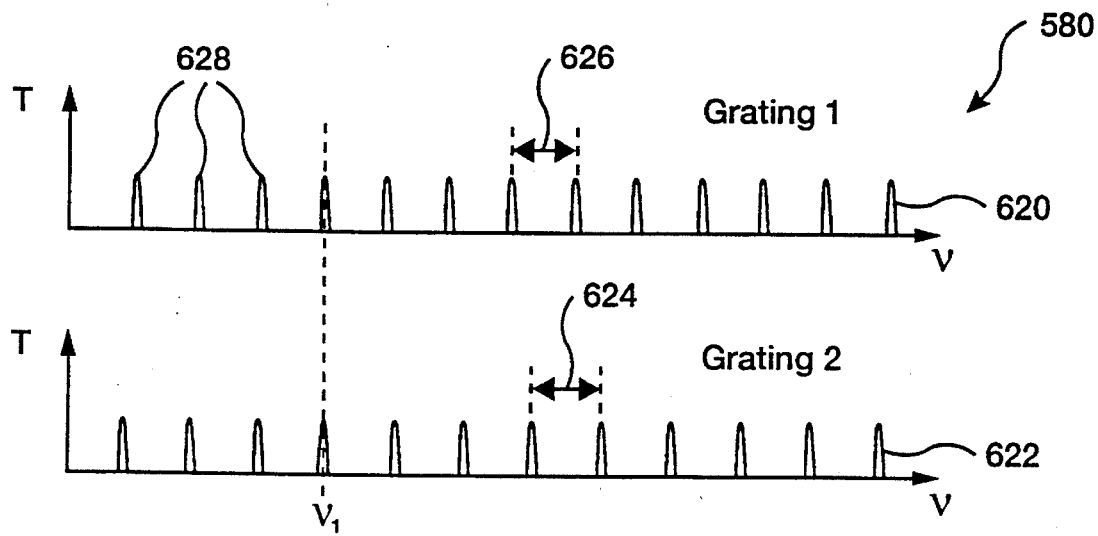
FIG. 20 is an illustration of the frequency response curves of two devices with multiple periodicity and different free spectral range.
Figure 21:
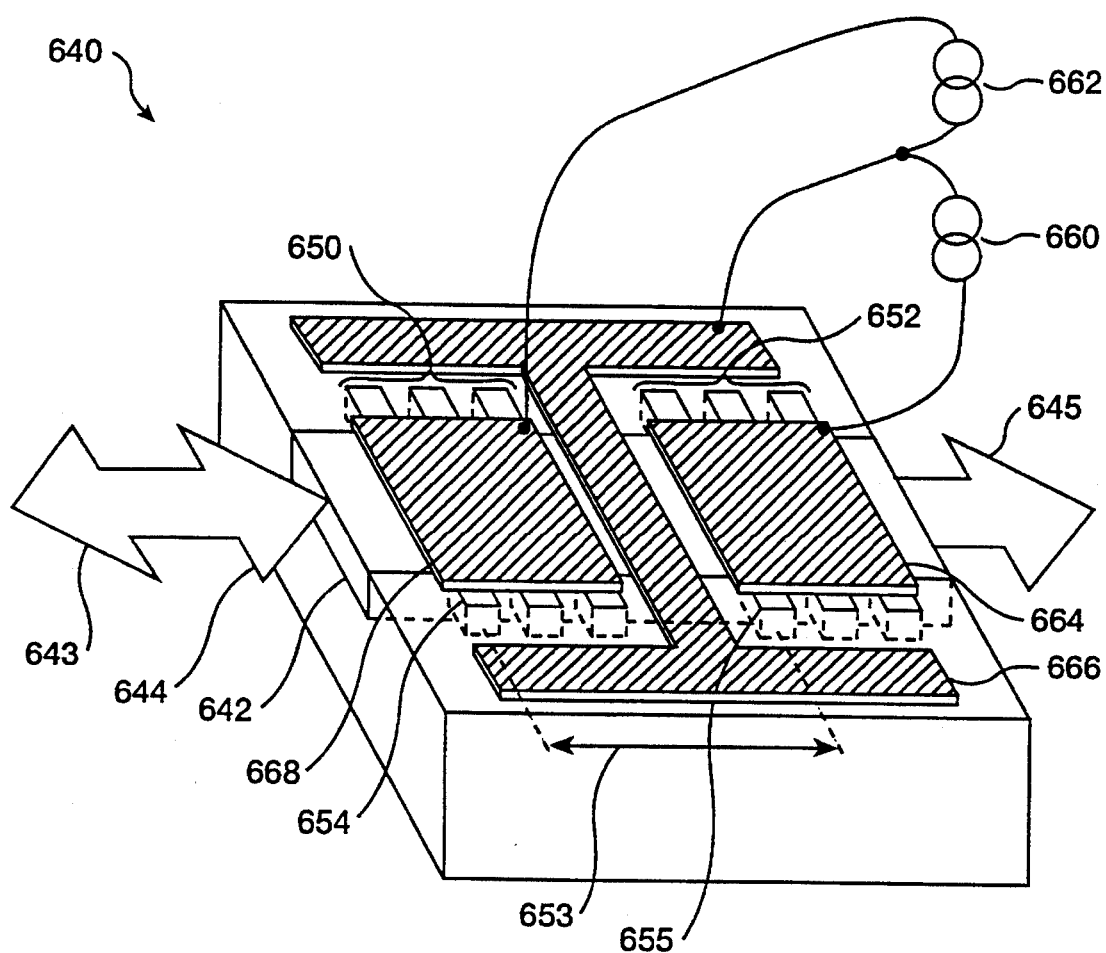
FIG. 21 is an embodiment of a twin grating tunable reflector.
Figure 22:
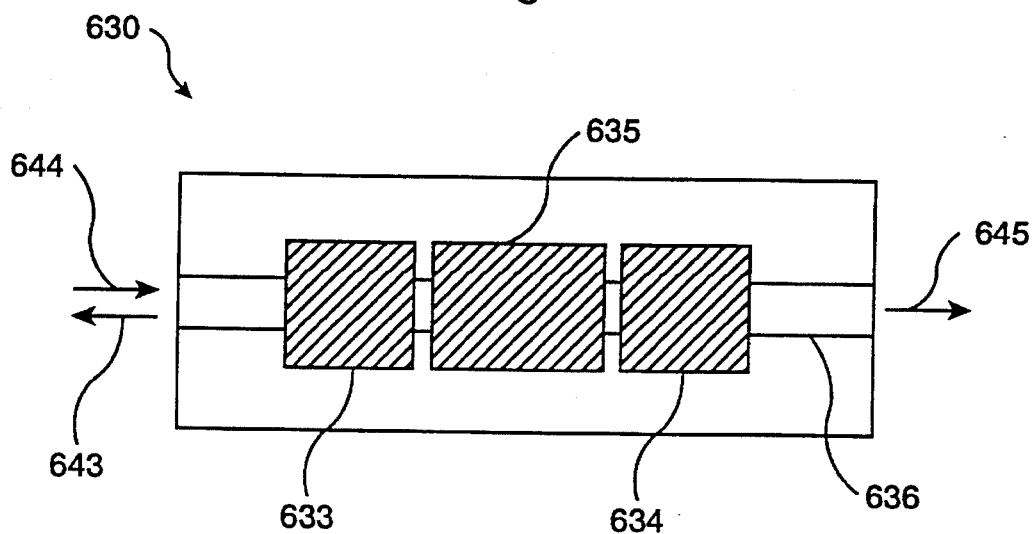
FIG. 22 is a schematic illustration of an integrated etalon consisting of twin gratings with adjustable optical path length.

A wide spectrum tunable device can be realized in a structure containing two separate gratings which have a multiple peak structure, as shown in FIGS. 21 and 22. FIG. 20 demonstrates the basic principle of these devices and depicts the multipeak comb transmission (or reflection) profiles 620 and 622 as a function of the optical frequency for two such gratings. The first grating profile 620 has transmission peaks separated by a first period 626, while the second grating profile 622 has peaks separated by a second period 624 that is slightly different from the first. The key idea is for the device to operate only at a frequency determined by the overlap of peaks from both curves (frequency $v_1$). Tuning is achieved by tuning the comb of transmission peaks of the gratings with respect to each other. Different transmission peaks in the two combs will overlap each other in various ranges of the relative frequency shift, so that the net transmission of the combined gratings jumps discretely over a much wider wavelength range than can be achieved with only thermal or electro-optic tuning. In the example of FIG. 20 where the peak separations differ by 10%, if the frequency of the first grating is increased by 10% of the frequency separation 626, the next higher frequency peaks will superimpose, resulting in an effective frequency shift ten times larger than the tuning amount.

In FIG. 21, a guided wave embodiment of the device is shown, in which two gratings 650 and 652 are placed over a single waveguide 642. An input beam 644 is partially reflected into beam 643 and transmitted as beam 645. A first electrode 666 and second electrode 668 are positioned around the first grating 650 so that a first voltage source 662 connected to the electrodes activates that grating. A third electrode 664 is positioned, along with the second electrode, around the second grating 652. The second grating is controlled by a second voltage source 660 connected to the second and third electrodes. In the preferred embodiment, each grating is a multiple peak structure as described in FIG. 20, and the device forms a frequency-hop-tuned reflector. According to the curves of FIG. 20, the gratings are configured as broadband reflectors, reflecting essentially all the incident radiation frequencies except a comb of equally spaced frequencies where the transmission is high. The cascaded gratings will therefore reflect all frequencies in the frequency range illustrated in FIG. 20, except where the two transmission peaks overlap at $v_1$. Provided that the reflections of the two gratings are arranged to add in phase in the reflected beam 643, the transmitted spectrum will be essentially equal to the product of the two transmission curves 620 and 622. When the center frequency of one of the gratings is tuned, the single transmission peak at $v_1$ will hop to the next adjacent peak, and then the next, and so on. Such a structure is particularly useful as an electrically tuned receiver in, for example, a wavelength-division-multiplexed (WDM) communication system. The receiver can be configured to detect only incoming light in a specific band, while being insensitive to light at other frequencies.

As seen above, a grating structure can be shifted by about 0.5 nm, assuming a 10 V/μm field in a domain inverted grating with duty cycle of 75%. This continuous tuning range can be used to produce discontinuous tuning in the structure 640 across perhaps 100 bands in a 50 nm range, if the width of the individual frequency peaks 628 are narrower than about 1/100th of the frequency separation.

Note that if the frequency of the input light is known to lie only within the transmission bands of curve 620 in FIG. 20, for example, the device can be realized with only a single grating structure with the transmission spectrum of curve 622, using essentially the Moire effect. By tuning the center frequency of the spectrum 622, any one of the desired bands can be selected while reflecting the rest. The tee structure of FIG. 7 is then particularly interesting in this context: the input beam 112 containing multiple frequency components is then split by the grating structure 100 (configured for tuning as described herein) into a single transmitted beam 116 which can be detected or otherwise processed, and a reflected beam 114 which contains all the other frequency components. The power contained in beam 114 is not lost, but can be routed to other nodes in a communications network, for example.

Other variations can be formed of this basic structure, wherein, for example, the spectra of FIG. 20 are the reflection curves of the individual gratings instead of the transmission curves. In this case, the structure acts as an etalon when the frequencies of the reflection peaks align with each other, with reflectivity according to the relative phase of the reflected waves. Otherwise, the net reflection of the compound structure is essentially the sum of the reflection curves of the two individual structures.

It may be important to optimize the relative phase of the two reflections by adjusting the optical path length 653 between the two gratings. The relative phase can be controlled by using an electro-optic structure (as shown for example in FIG. 22) between the two grating entrances 654 and 655 to adjust the optical path length 653. For a lithium niobate crystal and an input wavelength of 1.5 μm, an activated distance between the gratings of at least 250 μm is required to adjust the relative phase between the two beam of up to $\pm\pi$, (using a z-axis applied field of 10 V/μm). The strength of one of the gratings (but not its frequency) may optionally be controlled via a field applied at its electrode if the grating is not designed for tuning (its average index of refraction is configured to be independent of the applied voltage). If both gratings are tuned together, narrow range continuous tuning results. As an alternative or supplement to electronic excitation, the phase of the two reflections and the peak wavelengths of the gratings can all be varied together through thermal or mechanical control of the chip.

FIG. 22 shows schematically two grating reflectors 633 and 634 separated by a phase shifter section 635 and forming an integrated etalon 640 having a characteristic free spectral range (FSR). (The structure 630 is essentially the same as that of FIG. 21, with the addition of the phase shifter section, which consists of electrodes capable of actuating a region of electro-optic material traversed by the waveguide 636.) For simplicity, we consider the case of uniform single-period gratings, but the individual gratings may generally be more complex structures. The gratings may be fixed or electronically actuatable. The reflections off the two gratings can be made to add in phase for a beam at a reference frequency by adjusting the voltage applied to the phase shifter section 635. A beam at a second frequency will also add in phase if the frequencies of the two beams are separated by a multiple of the FSR. Since the FSR is inversely proportional to the optical path length between the two gratings, choice of the path length determines the density of the reflection peak structure of the etalon device. As an example, two short high reflecting gratings separated by 220 μm in lithium niobate can have grating reflection peaks separated by a multiple of 1 nm. The multiple peak structures 620 or 622 described in FIG. 20 can each be implemented as an integrated etalon.

Figure 23:
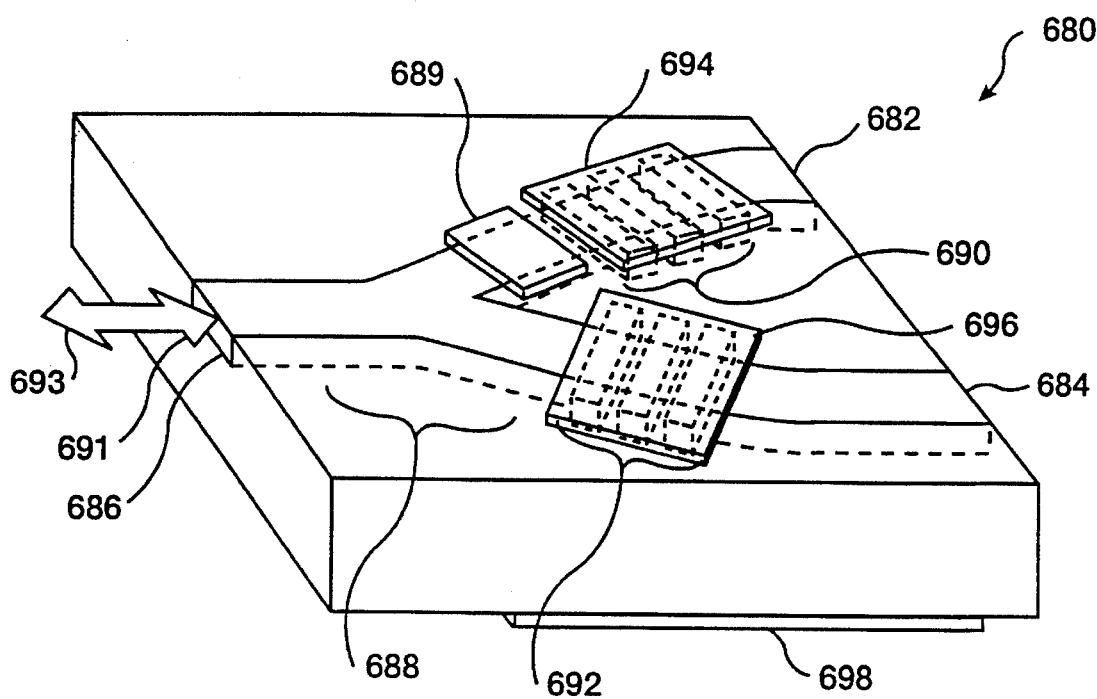
FIG. 23 is an embodiment of a dual grating switchable wye junction with phase shifter.

A dual grating wye junction embodiment is shown in FIG. 23, in which the two gratings 690 and 692 extend across two separate waveguides 682 and 684. In general a wye junction has an input and multiple output waveguides which may lie in a plane or in a volume. The two waveguides are connected to the first waveguide 686 with a wye junction 688. The power in the optical input beam 691 is split between the second waveguide 682 and third waveguide 684 so that approximately 50% of the input beam 691 is incident on each of the gratings. The two gratings may have a simple reflection structure, or they may have a series of high reflection peaks. The gratings may be permanent, or they may be electronically adjustable, in which case electrodes 694 and 696 are provided for exciting the gratings. A common electrode 698 is then provided across the wafer (or alternately on the same surface as the waveguides, adjacent to the other electrodes similarly to FIG. 21).

The relative optical path length of the two branches of the waveguide can be adjusted by the electrode 689 which is disposed on one waveguide over a region of electro-optic activity. By adjusting the voltage on the phase adjusting electrode 689, the two reverse-propagating reflected beams may be adjusted to have the same phase when they meet at the wye junction. The reflected modes superpose and form a wave front profile which may have a phase discontinuity in the center, depending on the relative phase of the two waves. As the combined wave propagated, the spatial concentration of the optical mode in the region of the guide is strongly affected by the phase shift. If they have the same phase, the profile forms a symmetric mode which couples efficiently into the lowest order mode of the input waveguide to form the retroreflected output beam 693. Two reflected beams which add out-of-phase at the wye junction will have very low coupling into any symmetric mode (such as the lowest order mode) of waveguide 686. If the waveguide 686 is single mode, this reflected energy will be rejected from the waveguide. Thus, by adjusting the optical path length of one of the arms of the wye with the electrode 689, the reflection can be rapidly adjusted from almost 100% to a value very close to zero. Furthermore, if the gratings are implemented as electronically tunable reflectors in one of the tunable configurations described herein, the modulated reflection property can be shifted into different regions of the spectrum.

Figure 24:
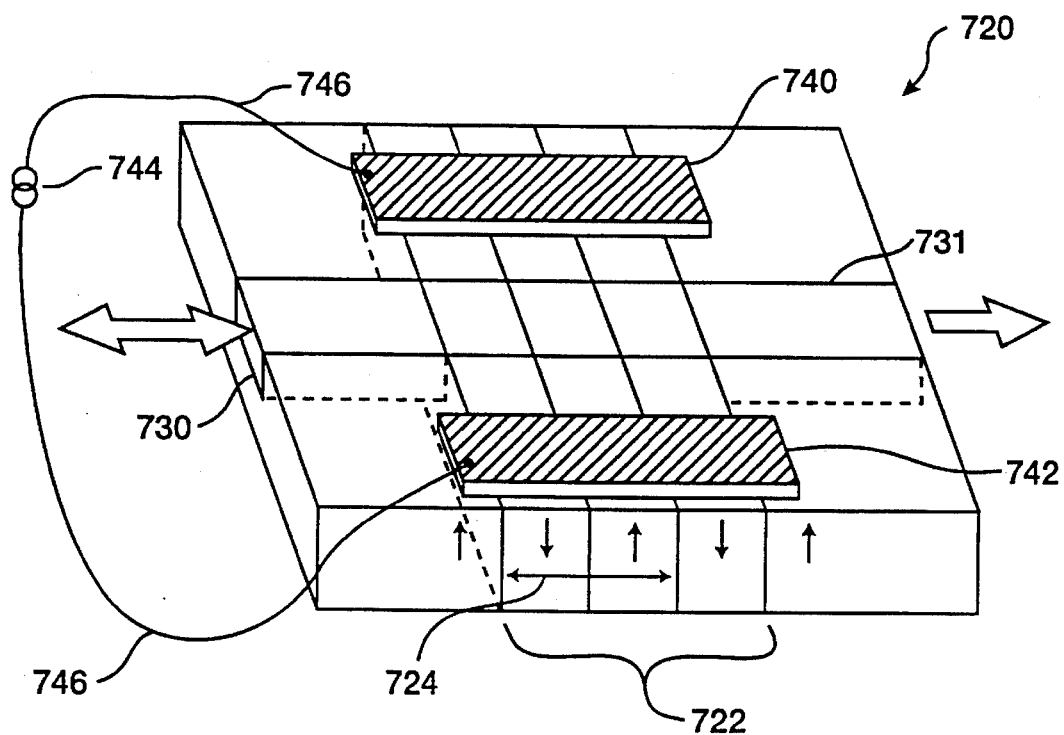
FIG. 24 is an embodiment of a poled waveguide mode converter.

Referring to FIG. 24, there is shown a switchable waveguide mode converter 720 using a poled grating 722.

The waveguide 730 preferably supports both an input mode and an output mode, which may be two transverse modes or two modes of polarization (e.g. TE and TM). The two modes in the waveguide typically have different propagation constants, which are determined by the effective indices of the modes. The grating 722 is excited electrically by electrodes 740 and 742, coupled to the source of electrical potential 744 by the connections 746. The grating period Λ (724) is chosen so that the magnitude of the difference of the propagation constants in the two waveguides is equal to the grating constant $2\pi n/\Lambda$. When the grating is on, the grating makes up the difference in the propagation constants of the two waveguides so that coupling between the two modes is phasematched. The grating strength and the device interaction length in the grating should be set to optimize the flow of power from the input mode into the output mode. The net rate of power conversion from one mode into the other is determined by the strength of the electro-optic coefficient ($r_{51}$ in lithium niobate) and by the strength of the electric field.

For two transverse modes, the coupling depends on the spatial overlap of the two modes in the presence of the grating structure, and on the strength of the grating. The two modes may be orthogonal by symmetry, so that even if the modes are phasematched, there will be no conversion in a symmetric structure. In this case, the phasematching structure itself can be made asymmetric to eliminate the problem. In the preferred embodiment of FIG. 24, the asymmetry can be introduced via the electric fields which excite the poled structure. The vertical component of the electric field reverses sign midway between the two electrodes 740 and 742. It is best to center the electrodes on the waveguide to optimize mode conversion between transverse modes of different symmetry. The reverse is true when coupling transverse modes of the same symmetry: now the phasematching structure should be made symmetric to optimize the conversion. Several alternative approaches can also be used. A three electrode structure has a symmetric vertical component of the electric field and an asymmetric horizontal field. The horizontal field can be used in conjunction with one of the horizontally-coupled electro-optic coefficients to couple modes of different symmetry. Or, the poled structure may have a phase reversal plane that essentially bisects the waveguide, in which case a symmetric component of the electric field can be used to couple modes of different symmetry (vertical field in the case of three electrodes, horizontal field in the case of two).

Since the propagation constants of the two modes are strongly dependent on wavelength, the beat length of their interaction also depends on the wavelength. Thus, for a given length of the coupling region between the two modes, the power coupled into the second mode is frequency-sensitive. The coupling has a frequency bandwidth associated with it. For a given grating strength, a portion of the in-band input beam is coupled into the output mode which exits as the coupled output beam, while the remainder of the input beam exits the first waveguide as the transmitted output beam.

The structure shown in FIG. 24 can also be used to couple between TE and TM polarized modes. The electro-optic coefficient $r_{51}$ enables coupling between the two orthogonal polarizations in a lithium niobate crystal, for example. As before, the period of the grating is chosen so that the grating constant is equal to the difference in propagation constants between the two modes. The interaction length is chosen to optimize the power transfer.

A waveguide, such as a titanium-indiffused waveguide which supports both TE and TM modes, is used in applications where both polarizations can enter or leave the converter. A waveguide such as a proton exchanged waveguide which supports only one polarization (TM in z-cut lithium niobate substrates or TE in x- or y-cut) can be useful in applications where only a single polarization is desired. Such a one-polarization waveguide can act as a very effective filter for the other polarization. The wrong polarization component will rapidly disperse away from the waveguide due to diffraction, leaving only the guided polarization in the waveguide. For example, the proton exchanged output waveguide 731 may act to guide only the input polarization or only the output polarization, as desired. This device can be used as an optical modulator with excellent transmission and extinction if the grating coupling is strong, and the interaction length and electric field are selected correctly. A modulator configured with a proton exchanged waveguide will transmit essentially all of the correctly polarized input light, and produce very low transmission of light which is coupled into the perpendicular polarized mode. Alternately, the input waveguide may be titanium-indiffused to accept either polarization at the input. The index profiles that form the waveguides for the two beams are preferably similar so that the profiles of the TE and TM modes overlap well, and the coupling efficiency is maximized.

To activate the $r_{51}$ coefficient, an electric field is applied along the Y or the X axis of the crystal. The electrode configuration that will achieve the appropriate field direction depends on the cut of the crystal. For a z-cut crystal with a waveguide oriented along the x axis, the first electrode and second electrode can be placed on either side of the waveguide. Alternately, for a y-cut crystal with a waveguide oriented along the x axis, the first electrode can be placed directly over the waveguide, with the second electrode on either side of the waveguide, parallel to the first electrode.

Since the poled domains in the grating 722 can be made to extend through a bulk substrate (such as 0.5 mm thick or more), the structure of FIG. 24 is also useful for a controllable bulk polarization converter. In this case the waveguide 730 is unnecessary, and the electrodes are optimally configured on either side of a thin bulk slab of poled material.

Figure 25:
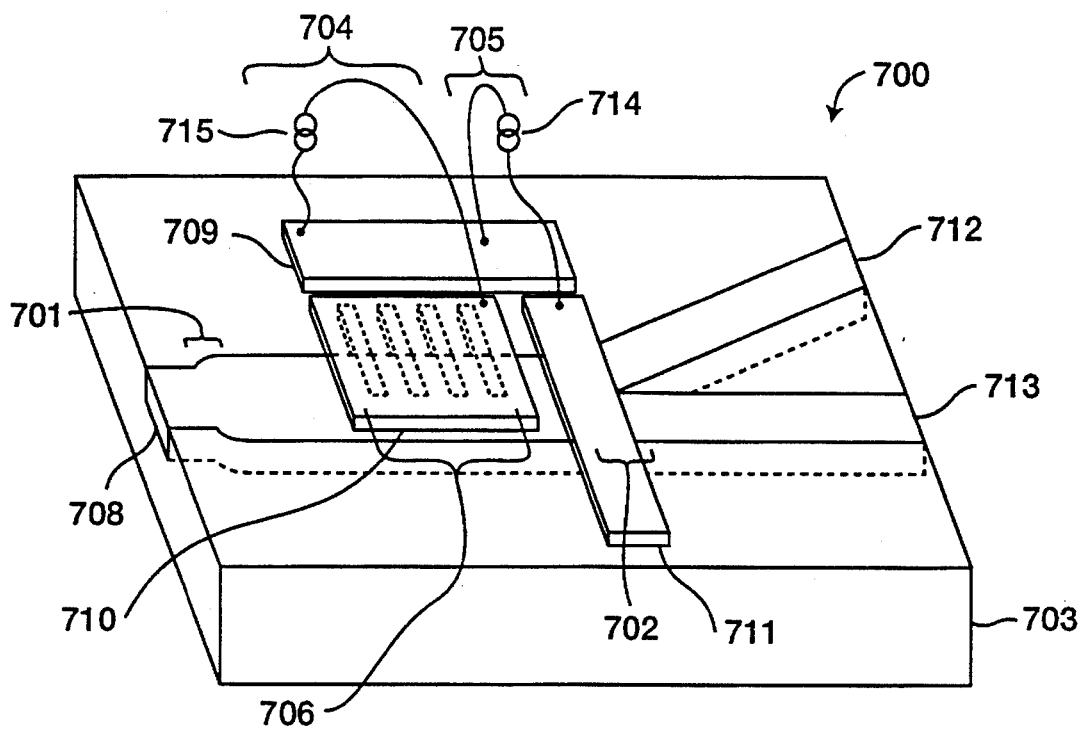
FIG. 25 is an embodiment of a waveguide router using the waveguide mode converter.

Referring to FIG. 25, there is shown a switched beam director 700 incorporating a wye power splitter 702 and a transverse mode converter 704. The mode converter works in a similar way to the transverse mode converter described above in relation to FIG. 24. The grating structure 706 phase matches energy conversion from the lowest order (symmetric) mode incident in waveguide 708 into the next higher order (antisymmetric) mode of the waveguide. The length and strength of the interaction region where the waveguide and the grating structure overlap are chosen to convert approximately half of the input single symmetric mode power into a higher order antisymmetric mode. Furthermore, the optical path length between the grating mode converter section 704 and the wye splitter 702 is chosen so that the phase of the two modes adds constructively at one of the branches 712 of the wye and destructively at the other branch 713. The result is that the power is routed primarily into the waveguide 712 with the constructive interference, with very little power leakage into the other waveguide 713. In this condition, any reverse propagating power in the guide 713 is essentially excluded from coupling into a reverse propagating mode in the guide 708 after the mode coupler 704. The device forms an efficient power router in the forward direction and an isolating structure in the reverse direction.

By adjusting the optical path length between the grating mode converter section 704 and the wye splitter 702, it is possible to switch the output power from guide 712 to guide 713. This is done by adjusting the relative optical path length for the lowest order mode and the higher order mode so that the two modes slip phase by $\pi$ relative to each other, now producing constructive interference in the guide 713 and destructive interference in the guide 712. The relative path length adjustment can be achieved in the path length adjustment section 705 by exciting the electrode pair 711 and 709 with the voltage source 714, changing the index of refraction under the electrode 711 via the electro-optic effect in the substrate 703, which is preferably lithium niobate (but may be any electro-optic material with transparency for the waves such as lithium tantalate, KTP, GaAs, InP, AgGaS$_2$, crystalline quartz, etc.). The propagation distance of the waveguide 708 under the electrode 711 is selected, along with the excitation voltage, to enable changing the relative phase of the two modes by at least the desired amount.

The grating 706 may be a permanent grating fabricated by any of the techniques known in the art. However, to optimize the functioning of the device, it is desirable to have almost exactly equal power in the symmetric and the antisymmetric modes. It is difficult to achieve sufficient control in existing fabrication techniques to achieve this goal, and it is therefore desirable to have some adjustment in the grating strength. This adjustability can be achieved with the use of at least some poled grating sections, excited by the electrodes 709 and 710, which are driven by the power supply 715, and which can be used by themselves to accomplish the desired mode conversion, or to adjust the strength of a combined poled-permanent grating.

The input waveguide 708 is best implemented as a single mode waveguide incorporating a (preferably adiabatic) taper 701 to permit guiding of the two modes between the transverse mode coupler 704 and the wye splitter 702. The waveguides 712 and 713 are both preferably single mode. While any order modes may be used in the device as long as their symmetry is opposite, it is most desirable for interconnection purposes to work with the lowest order mode at the input and output legs. The intermediate excited mode is less critical, and could be, for instance, a higher order antisymmetric mode.

Figure 26:
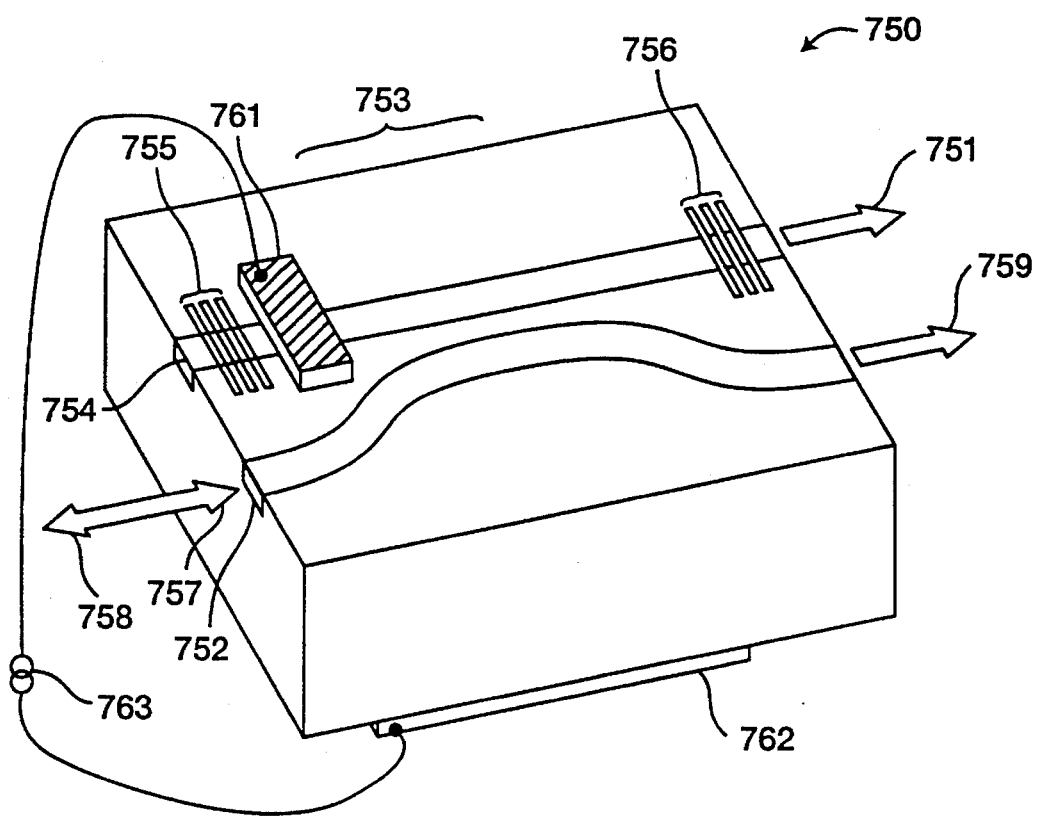
FIG. 26 is an embodiment of a switchable parallel waveguide resonator.

FIG. 26 shows a parallel waveguide switchable resonator 750 in which an input waveguide 752 is coupled to a parallel waveguide 754 along an interaction region 753. Grating reflectors 755 and 756 are disposed across the waveguide 754 in such a way as to retroreflect light propagating in the guide. The pair of separated reflectors and the waveguide 754 form an integrated etalon coupled to the input waveguide 752. The length of the coupling region 753 and the separation of the parallel waveguides in the coupling region are chosen so that a certain desired fraction T of the input beam 757 is coupled into the waveguide 754. The light coupled into the etalon structure 754, 755, and 756 resonates between the reflectors 755 and 756, and couples out into two prinicipal output channels: the forward propagating wave 759 and the reverse propagating wave 758 in waveguide 752. The same fraction T of the power circulating in the etalon couples into each of the two output channels 758 and 759.

As for any etalon, the integrated etalon has a frequency acceptance structure comprised of multiple peaks in frequency space with width dependent on the loss of the resonator, and separation equal to the free spectral range. If the optical frequency of the input beam 757 matches one of these resonant frequencies, the power circulating in the etalon will build up to a value $P_{circ}$ determined by $P_{circ}= P_{inc}T/(T+\Gamma/2)^2$ where $P_{inc}$ is the incident power 757 in the waveguide 752, $\Gamma$ is the loss of the etalon not including the output coupling into the forward propagating wave 759 and the reverse propagating wave 758 in waveguide 752, and we have assumed weak coupling and low loss. The output coupled wave from the etalon which propagates in the reverse direction in waveguide 752 forms the reflected wave 758. The reflected power in beam 758 is equal to $P_{ref}=P_{inc}/(1+\Gamma/2T)^2$ on the peak of the resonance. When $T > \Gamma/2$, essentially all of the incident power is reflected. The output coupled wave from the etalon which propagates in the forward direction in waveguide 752 is out of phase (on a cavity resonance) with the uncoupled portion of the input wave 757, and the two beams destructively interfere, producing a low amplitude output beam 759. Because the two beams have unequal amplitude, the residual power $P_{trans}= P_{inc}/(1+2T/\Gamma)^2$ in the output beam 759 is not quite zero, but it can be very close. If the coupling T is made very large compared to the loss F of the etalon, the transmission of the device is greatly suppressed (by 26 dB if $T=10\Gamma$). This structure then acts as a very low loss reflector at a comb of frequencies separated by the FSR.

The device can be switched by changing the optical path length between the two reflectors 755 and 756. Electrodes 761 and 762 are disposed to produce an electric field through the waveguide 754 between the mirrors 755 and 756. The electrodes are excited with a voltage source 763, changing the effective index of the substrate under the electrode 761 via the electro-optic effect, thereby changing the optical path length between the mirrors and shifting the resonances of the integrated etalon. If the resonances are shifted by more than either the width of the resonances or the frequency bandwidth of the incident beam, the reflection will drop to zero, and the transmission will rise to essentially 100% as the circulating power within the etalon is suppressed to approximately $P_{inc}T/4$.

The gratings 755 and 756 may be permanent gratings, or they may be poled gratings excited by electrodes as shown in previous diagrams and discussed above. If the grating 756 is a poled grating, the device may also be switched by switching it off. With grating 756 off, i.e. not reflecting, the loss to the incident wave 757 is equal to the coupling constant T, but now the comb structure is eliminated instead of just being frequency shifted as by the electrode 761. The difference in switching function between these two modes of operation may be significant with for example a broadband input signal where it is necessary to switch off the reflection rather than just change its frequency. For a single frequency input beam, the reflection can be switched equally well by changing the path length with electrode 761 or by spoiling the Q of the resonator by switching off the mirror 756. However, if the reflectivity of the mirror 756 is retained and only the frequency spectrum of the etalon is shifted with the electrode 761, other frequency components of a broadband input wave would be reflected, and this might be highly undesirable in some applications.

The power $P_{circ}$ which builds up in the etalon can be quite large if T and $\Gamma$ are small, and can be useful in applications such as second harmonic generation, for example. In this application, a quasi-phasematched (QPM) periodic poled structure in a section of the lithium niobate substrate is incorporated into the resonator between, say, the mirror 756 and the interaction region 753, or possibly within the interaction region itself. One of the resonant frequencies of the etalon is then tuned to coincide with the phasematching frequency for the QPM frequency doubler. The power buildup which occurs enhances the frequency conversion efficiency of the device as the square of the buildup factor $P_{circ}/P_{inc}$. The high reflection which occurs at this frequency can also be used to injection lock the pump laser to the desired frequency if the FSR is large enough that the other resonant modes are not injection locked simultaneously. The linear integrated etalon geometry described above in reference to FIGS. 21 and 22 can also be used to accomplish the same purposes.

To optimize the power building up in the etalon between the reflectors 755 and 756, the losses in the resonator must be minimized. The coupling of FIG. 26 cannot be "impedance matched", in analogy to the process known in the art of bulk buildup cavities, where the input coupling into the resonator is adjusted to cancel by destructive interference the portion of the incident beam which is not coupled into the cavity. This is the condition of the etalon transmission interference peak. As described above, what happens in the integrated structure is that the transmitted beam can be nearly cancelled while the power builds up in the coupled resonator, but a strong reflected wave emerges. The reflected wave may be eliminated in a ring waveguide structure, as is illustrated in FIGS. 27 and 28.

An output 751 proportional to the power circulating within the etalon may be taken through the grating 756, if desired, or alternately through the grating 755.

Figure 27:
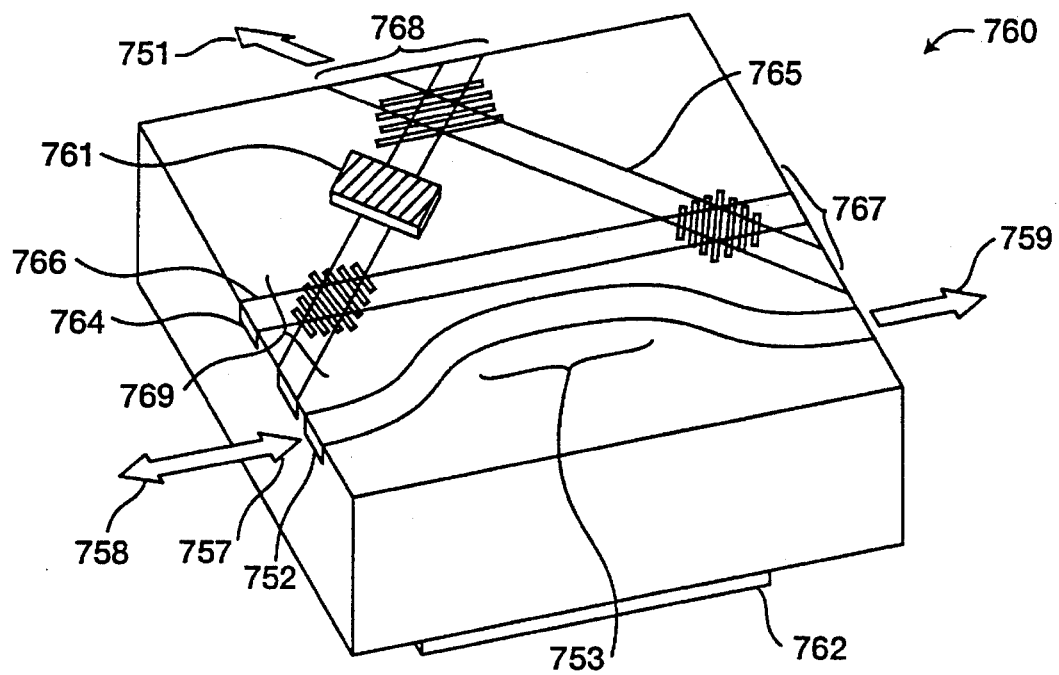
FIG. 27 is an embodiment of a three-arm waveguide etalon.
Figure 28:
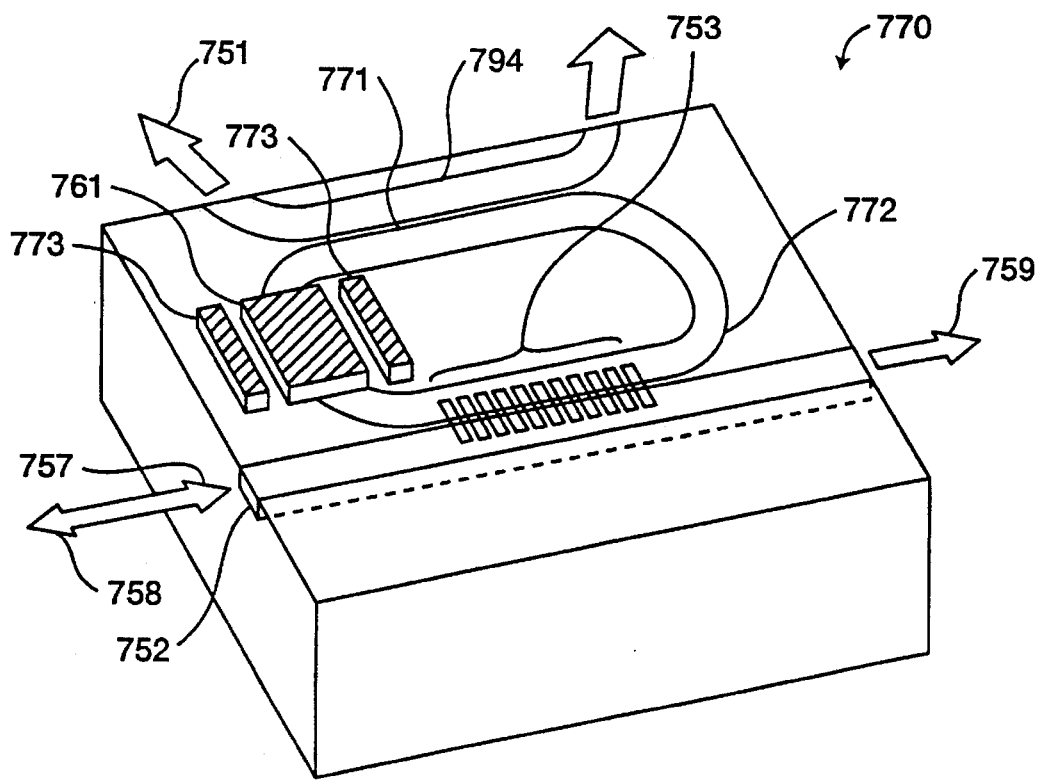
FIG. 28 is an embodiment of a ring waveguide etalon.

In FIG. 27, a three-arm etalon 760 is shown with an input waveguide 752, a parallel waveguide coupling region 753, a ring resonator formed by three waveguide segments 764, 765, and 766, three grating reflectors 767, 768, and 769. The optical path length adjustment section formed between the electrodes 761 and 762 is optional. The grating reflector 767 is disposed to optimally reflect the power arriving from waveguide 764 into the waveguide 765. In a single mode system, the spatial configuration of the grating (and its electrodes if any) is designed to couple from the lowest order mode of waveguide 764 into the lowest order mode of 765. The gratings 768 and 769 are similarly configured to optimize the power flow from waveguide 765 into waveguide 766, and then into waveguide 764 again, forming a Fabry-Perot resonator with a determinate optical path length, FSR, optical loss coefficient, and coupling T with the input waveguide 752. Now, impedance matching is possible, and is accomplished when the coupling coefficient T equals the total round-trip loss coefficient of the resonator less the output coupling loss, principally in the coupling region 753. If a phase matched frequency doubler is disposed within the resonator, the converted power out of the fundamental frequency beam circulating in the resonator does count as one of the losses in the total round-trip loss.

If an input beam 757 is incident on the device with a frequency equal to one of the resonances of the three-arm etalon, power will couple across the parallel waveguide interaction region into the etalon and build up to a circulating power of $P_{circ}=P_{inc}T/(T+\Gamma)^2$. Because of the ring structure, the power will circulate primarily in one direction, from waveguide 764 to waveguides 765, 766, and back to 764. There is now only a single output coupled wave from the etalon onto the waveguide 752, and it propagates in the forward direction. The output coupled wave interferes destructively with the reminder of the input wave 757, forming a weak transmitted wave 759. The transmitted power $P_{trans}$ in the output beam 759 is given by $P_{trans}=P_{inc}(1-\Gamma/T)^2/(1+\Gamma/T)^2$, and can be brought to zero if $\Gamma=T$, which is the impedance matched condition. In this case, all the incident power flows into the resonator. In the impedance matched condition, the two beams have equal amplitude, and the transmitted power drops to zero. There is essentially no reflected power in beam 758 except for reflections from discontinuities in the waveguide 752, which can be minimized by good design.

The grating 767 or any of the other gratings n-lay be configured as a switchable grating, in which case the quality Q of the etalon may be spoiled by turning off the grating, eliminating the comb structure entirely but leaving some optical loss due to power coupled into the waveguide 764. An output beam 751 may be taken in transmission through the grating 768, and/or through the gratings 767 or 769.

FIG. 28 shows a ring waveguide etalon 770. As before, the input waveguide 752 is coupled to a waveguide 772 in a parallel interaction region 753. The interaction region 753 includes a grating in FIG. 28 (although it is not required) to emphasize that grating coupling is a useful option in the etalon geometry of FIGS. 26, 27, and 28. The waveguide 772 follows a curved closed path (with any geometry including potentially multiple loops with crossings), feeding a portion of the power emerging from section 753 back into the interaction region 753. As before, electrodes 761 and 773 are supplied to allow the optical path length, and hence the FSR to be adjusted, although in this case they are shown disposed on the same face of the substrate. A straight section 771 is provided where certain critical functional components may be fabricated, according to the application of the etalon structure. If the etalon device 770 is used for frequency doubling, it would be advantageous to insert the frequency doubling structure into a straight section such as 771 of the ring, but provision must be made to couple the frequency converted light out of the ring waveguide.

The functioning of the device 770 is otherwise similar to that of the device 760. While the device 760 may consume less surface area on a substrate, the device 770 may have lower optical loss in the etalon, particularly if the diameter is one cm or larger.

The devices 760 and 770 can function as buildup cavities for frequency doubling in which the feedback into the optical source is minimal. They can also switch the transmission of a given frequency without retroreflection, which is useful in applications including optical communications.

In WDM communications, many communications channels separated by their optical wavelength may be carried on the same optical fiber. To detect a channel, the light in the desired wavelength region must first be separated from the remaining channels which are routed to other destinations. This separation function is performed by a channel dropping filter. A channel dropping filter is a communications device which is used in a wavelength division multiplexed (WDM) environment. It is desired to multiplex several channels across a single transmission fiber by carrying the channels on different wavelengths. A critical component in such a system is a channel dropping filter which allows the extraction of a single channel for routing or detection purposes. The ideal filter will extract essentially all of the light in a channel with good extinction ratio, so that the same wavelength may be used later in the network without undesirable crosstalk. It must have very low insertion losses for the out-of-band components because multiple channel dropping filters may be installed on any given line. Preferably, it should be switchable so that a channel may be dropped at a destination location, and after the communication is finished, the channel may continue past that location to another destination. The inverse of the channel dropping filter is the channel adding filter which adds a channel to a fiber without significantly affecting the power propagating in the other channels. Transmission and reflection filters have been analyzed in detail [HL91, KHO87]. Several of the above structures may be used for channel dropping filters, including the devices described in reference to FIGS. 7, 10, 26, 27 and 28.

The grating coupled waveguide tee of FIG. 7 is a channel dropping filter with low loss for the out-of-band components. With prior art gratings, this configuration has difficulty with crosstalk, since achieving 99.9% outcoupling for the in-band component requires a very long grating. The coupling strength of our periodic poled gratings is significantly increased over the prior art, due to the ability to use higher order gratings with sharp interfaces which extend entirely across the waveguide. Whereas the prior art is limited to shallow waveguides to optimize the overlap between the necessarily shallow grating and the waveguide, we are able to use the lower loss waveguide configuration with essentially equal depth and width because our grating structure extends entirely across the depth of the waveguide. This structure can also be used as a channel adding filter.

The device of FIG. 10, if the grating is configured as described in Haus et al. "Narrow band optical channel dropping filters" J. Lightwave Technol. 10, 57–62 (1992), is also a channel dropping filter. Our contribution in this case is only the poled grating coupling technique, which enables strong coupling between the waveguides in a short distance, and which relieves fabrication difficulties in permitting efficient higher order gratings to be produced.

The devices 750, 760 and 770 can be used as channel dropping filters by tuning a resonance of the etalon to the frequency of the channel to be extracted from the input waveguide 752. If the integrated etalon is nearly impedance matched, essentially all the power at the resonant frequency is transferred into the etalon. In the ring geometries of FIGS. 27 and 28, the transmitted and reflected powers in the waveguide 752 can be reduced to any desired level, minimizing crosstalk. The light corresponding to the desired channel is completely extracted (dropped) from the input waveguide, leaving neither reflections or transmissions. In the linear geometry of FIG. 26, some light is lost to reflection, which does not significantly reduce the detection efficiency, but which may cause crosstalk problems in a communications network. The signal carried by the light can be detected by placing a detector over a waveguide segment of the etalon and coupled to the light in the waveguide. Or, the detector can be coupled to one of the output waveguides such as 754 in FIG. 26, 764, 765, or 766 in FIG. 27, and 794 in FIG. 28. In the case of the device 760, the outcoupling can be accomplished by adjusting the reflection of one of the resonator grating reflectors 767, 768 or 769 so that a small portion of the circulating power is coupled out into the continuation segments of the waveguides as shown for output beam 751. Those continuation waveguide segments may also be connected to ports of other devices, which may be either discrete devices or integrated on the same substrate. In the case of the device 770, a parallel waveguide output coupler (with or without grating) may be placed in the straight section 771 of the ring. Although only a fraction of the circulating power may be outcoupled at these ports, the total outcoupled power may be very close to 100% of the channel power entering the waveguide 752 due to the buildup which occurs in the etalon. Output coupling is shown with an adjacent waveguide 794, producing the output beam 751.

The ring geometries excel in terms of extinction ratio (which is high when the light separation efficiency is high) and low crosstalk because they can be adjusted to have almost total transfer of power into the etalon. All of the etalon devices can be designed with very low insertion loss for the out-of-band beams. All of the devices of FIGS. 26–28 are switchable by means of the phase shifting electrodes 761, and 762 (and 763 in FIG. 28).

As described before, the optical path length may be adjusted using electrode 761 to shift the frequency of the integrated etalon resonances. The desired channel may be selected this way directly. Or, multiple channels may be selected by this technique using the approach described above in reference to FIGS. 20, 21, and 22; if the FSR of the etalon is selected to be slightly different from the channel separation, the Moire effect is used to select widely spaced channels with a minimum of continuous tuning. (A good choice is to make the FSR equal to the channel spacing plus a few times the frequency width obtained when convolving the channel bandwidth with the etalon resonance bandwidth).

As a variation on the structures 750, 760, and 770, the coupling region 753 may be implemented as a grating-assisted coupler as described above in reference to FIG. 10. This has the advantage, in the poled-grating implementation, that the coupling fraction T can be adjusted. Particularly for the ring resonator designs 760 and 770, an adjustable coupling is useful to achieve impedance matching. As a further variation, the electrodes may be implemented on the same face of the substrate, as described above to obtain lower voltage excitation.

The structures of FIGS. 27 and 28 may also be used as efficient channel adding filters if the signal to be added to the output beam 759 is brought in on the waveguide 766, for example, or if it is coupled into the straight section 771 via the waveguide 794. These input interactions will preferably be impedance matched.

Figure 29A:
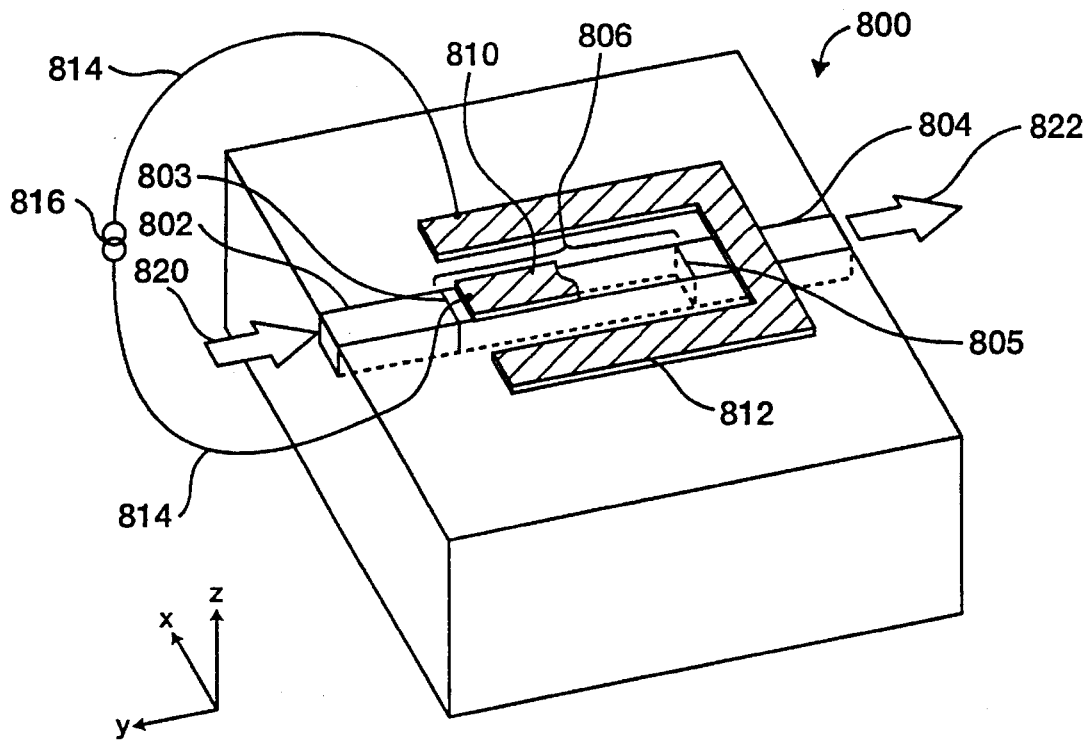
FIG. 29A is an embodiment of a modulator/attenuator with controllable poled mid-structure.

Referring now to FIG. 29A, there is shown a waveguide modulator/attenuator 800 using a poled segment 806. The function of the poled segment 806 is to (switchably) collect the light emitted from an input waveguide segment 802 and launch it into an output waveguide segment 804 when switched on. In this device, an input light beam 820 is coupled into the input waveguide 802. A poled segment 806 is positioned between the input segment and the output waveguide segment 804. The input and output waveguide segments are preferably permanent waveguides which may be fabricated by any of the standard techniques including indiffusion and ion exchange. The segment 806 is preferably a reverse poled region within a uniformly poled substrate so that there is essentially no difference in index of refraction and hence no waveguiding effect when the electric field is off. The segment 806 is a waveguide segment as shown in FIG. 29A. (It may alternatively be configured in several geometrically different ways such as a positive lens structure, a negative lens structure, or a compound structure for relaying light between many such elements: see FIG. 29B.) The segment 806 is turned on by applying an electric field through the segment. The electric field changes the index of refraction of the poled segment and surrounding regions. Because the segment 806 is poled differently (preferably reverse poled) from the substrate material, the index of the segment can be raised relative to the surrounding material by applying the correct field polarity, forming a waveguide. The index inside the boundary of the waveguide may be increased, or the index at and outside the boundary may be depressed. When the poled segment is on, a continuous waveguide is formed, joining the input and output segments. This is achieved by butting the waveguides together, aligning them to the same axis, and adjusting the width of the poled segment so that its transverse mode profile optimally matches the mode profile of the input and output waveguides 802 and 804.

With the poled segment off, the input beam is not confined in the poled region, so that the beam expands substantially by diffraction before it gets to the output waveguide segment. If the separation of the input and output waveguide segments is much greater than the Rayleigh range of the unguided beam, so that the beam expands to a dimension much larger than that of the output waveguide, only a small portion of the input beam will be coupled into the output waveguide segment to form the output beam 822. By adjusting the length of the segment 806 relative to the Rayleigh range, the amount of power transmitted in the off condition can be reduced to the desired degree.

The location of the ends of the poled segment 806 are adjusted relative to the locations of the ends of the input and output waveguides to minimize the loss caused by the discontinuity. Because the permanent waveguides have a diffuse boundary, the poled waveguide has a discrete boundary, and the index change in the switched segment adds to the pre-existing index, it is desirable to leave a small gap on the order of half the diffusion length between the lithographically defined boundary of the waveguides 802 and 804, and the ends of the poled segment 806. To further reduce the reflection and other loss at the junction between waveguides 802 and 806, it is also advantageous to taper the onset of the index change in the segment 806 by either making the exciting electrode 810 slightly shorter than the segment 806 or by tapering the electrode width near its end, in both cases taking advantage of the reduction of the electric field by the fringing effect.

One distinguishing aspect of this configuration is that the reflected power can be minimized in both the on and the off conditions. With the switch off, the reflection is dominated by the residual reflection at the end 803 of the waveguide 802. This reflection may be minimized by tapering the reduction of the index difference along the length of the waveguide. The reflection from the end 805 of the waveguide 804 is suppressed by the square of the "off" transmission. In the "on" condition, the reflection is minimized by also tapering the index difference of the structure 806 along the direction of propagation, creating a smooth boundary rather than a sharp interface.

The boundaries of the excited poled region confine the beam laterally when they are activated because of the increase in the index of refraction within the boundaries. If the depth of the poled region equals the depth of the waveguides 802 and 804, the beam is also confined in the vertical direction by the poled segment boundaries. However, it is difficult to control the depth of the poling in a z-cut lithium niobate wafer. It is easiest to pole a deep domain, and take one of several alternative measures to obtain confinement in the vertical dimension. The preferred approach is to arrange the electrodes so that the amplitude of the electric field falls off in the vertical dimension. This is achieved by the same-side electrode configuration shown in FIG. 29A, but not with electrodes placed on opposite sides of the substrate. The penetration depth of the electric fields can be reduced by narrowing the gap between the two electrodes and by reducing the width of the overall electrode structure.

In addition or as an alternative, a weak permanent waveguide can be fabricated in the volume between the input and output waveguides, which is insufficient to convey much energy by itself, but which in combination with the index elevation produced in the poled segment 806 can optimally confine the light in two dimensions to convey essentially all the light into the output waveguide 804. This can be done, for example, by adjusting the permanent index change (relative to the substrate) within the segment to about 0.6 of the index change in the waveguides 802 and 804. If the "on" index change in the segment 806 is adjusted to about 0.5 of the same value, the combined index change is sufficient to achieve reasonable guiding while the permanent index change is insufficient. In the "on" condition, the mode is confined in both transverse dimensions even though the switched index change produced in the poled region may be considerably deeper than the desired waveguide dimension: the effective depth of the "on" waveguide is mainly determined by the permanent index change. The weak waveguide may be fabricated in a second masking step, or it may be fabricated in the same masking step with a narrower mask segment defining the weaker waveguide segment.

As a related alternative, the region between the input and output waveguides may be a planar waveguide, in which case the propagating mode can at minimum diffract in one dimension. Switching on a poled section will in this case add the needed transverse confinement despite having a deeper index change than the planar waveguide. Since in both cases the confinement of the waveguide in the two dimensions is achieved by two independent techniques, switchable waveguides of essentially any aspect ratio (the ratio of the waveguide width to depth) can be formed. Both the planar and channel waveguides can be fabricated by the same technique, which is preferably the annealed proton exchange process. Separate proton exchange steps may be used to define the planar guide and channel waveguide. The waveguide fabrication process is completed by annealing, during which the index changes are diffused down to the desired depth, and the optical activity of the material is restored. Preferably, the two sets of guides are annealed for the same length of time, although one set can be made deeper by partially annealing before the second proton exchange step is performed.

An important alternative is to use a full, uniform permanent waveguide traversing the poled segment 806, and to use the electrically excited segment to turn off the guiding. In this case, the polarity of the field is chosen to depress the index in the poled region, and the depth of the poled region can be very large (in fact this has some advantage in terms of mode dispersal). This type of switched waveguide is normally on (i.e. transmitting), and requires the application of an electric field to switch it off. There are advantages to both normally-on and normally-off switch configurations in terms of their behavior during a power failure, so it is important that this invention is capable of providing both modes. To switch the waveguiding off in the segment 806, an index change is desired which is approximately equal and opposite to the index change induced in the permanent waveguide. The effect of the variation with depth of the electric field on the "off" state is quite small because it is sufficient to suppress the majority of the waveguide in order to strongly disperse the light.

Confinement can be achieved in both dimensions without the need of a planar waveguide, by a finite-depth poling technique. Several poling techniques (such as for example titanium-indiffusion in lithium niobate and lithium tantalate and ion exchange in KTP), produce poling to a finite depth, which can potentially be optimized to form a poled channel waveguide with a particular depth. These techniques, however, produce an index change along with the poling, forming somewhat of a permanent waveguide depending on the processing parameters. Depending on the strength of this index change, the poled waveguide segment may be fabricated in either the "normally on" or the "normally off" configuration.

Preferably, the electric field is created in the poled region by applying a voltage across two electrodes, which are laid out on the same face of the crystal as the polled waveguide segment. A first electrode 810 is laid out over the poled region, while the second electrode 812 is placed in proximity to one or more sides of the first electrode. For a z-cut crystal, this configuration activates the $d_{33}$ electro-optic coefficient of the substrate. A voltage source 816 is electrically connected via two wires 814 to the electrodes to provide the driving voltage for the device. This device can be used as a digital or nonlinear analog modulator. A full-on voltage is defined to be the voltage at which the loss across the poled region is the lowest. The off voltage is defined as that voltage which reduces the coupling to the output waveguide segment to the desired extent. By continuously varying the voltage between the on and the off voltages, the device can be used as either an analog modulator or a variable attenuator.

In an alternative structure, the structure 806 forms a switched curved waveguide, which again aligns with the input 802 and output 804 waveguides. The mode of such a structure is called a "whispering gallery" mode in the extreme case where the curvature is small and the mode confinement on the inside edge becomes independent of the inside waveguide edge. For larger curvatures, the mode is a modified whispering gallery mode where some confinement is provided by the inside edge of the waveguide. The poled structure provides an advantage in addition to the switchability, namely that the sharp index of refraction transition on its outside wall greatly improves the confinement of the modified whispering gallery mode which propagates in the curved waveguide. The input and output waveguides need not be coaxial or parallel in this case, potentially increasing the forward isolation in the switched-off condition. If the input and output waveguides are arranged along axes at an angle to each other, the structure 806 may be a curved waveguide segment with a single radius of curvature or a tapered radius of curvature, used to optimally couple power between them when the curved waveguide structure 806 is turned on.

Figure 29B:
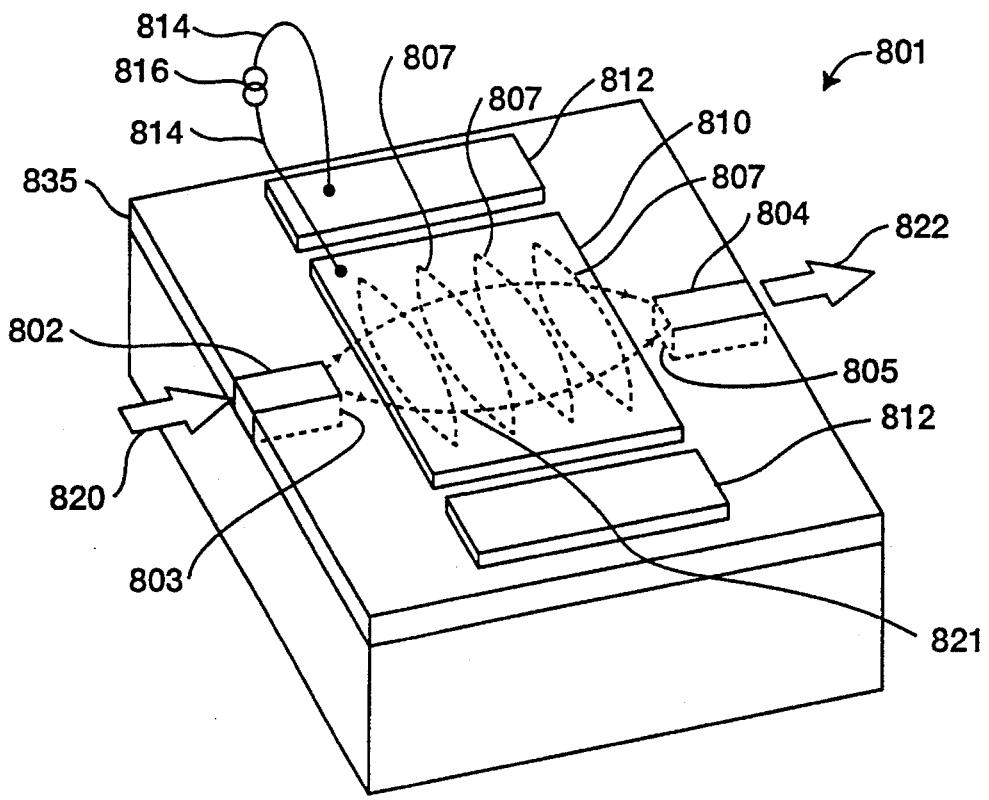
FIG. 29B is an embodiment of an adjustable lens structure.

FIG. 29B shows an alternative structure 801 which is a switched lens modulator/attenuator in which the prismatic structure of segment 806 is modified into a lenslike structure in which the product of the local optical path length and the local (signed) index change is reduced quadratically with transverse distance away from the axis of the guides 802 and 804. The lenslike structure is placed such that it concentrates or refocuses the beam 821 emerging from the end 803 of the input waveguide 802 into the end 805 of the output waveguide 804. The optical wave is allowed to diffract away from the end 803, and passes through the lenslike structure 807. Note that in this structure, multiple elements may be placed adjacent each other, increasing the net focussing effect. The index of refraction within the regions 807 is increased to obtain a focussing effect. If the surrounding region is poled in a reverse direction to the regions 807, or if the electro-optic coefficient of the surrounding region is otherwise opposite to that of the regions 807, the spaces between the lenses also act as focussing regions. (The negative lens shape formed by the regions between the lenses 807, excited to a lower index value, acts as a converging lens structure.) The electrode 810 is placed over the structure 806 with electrodes 812 being placed outside the structure but adjacent the electrode 810 with a gap as desired. When the electrodes are not actuated, the beam continues to diverge, and very little power is refocussed into the waveguide end 805. When the switch is on, the beam is refocussed, and a fraction of the power continues through the guide 804. Vertical confinement is needed for efficient power collection in the on state, while it is undesirable in the off state. Vertical confinement may be provided as needed by, for example, providing a uniform planar waveguide 835 across the entire surface on which the structures are patterned. Vertical confinement may also be provided by the lenslike structure 806 if it is poled deep into the substrate, and the electric field reduction as a function of depth is tailored to collect and refocus the energy back to the waveguide end 805. The structure of FIG. 29B may of course also be used in other contexts which may not have one or both waveguides 802 and 804.

Figure 30:
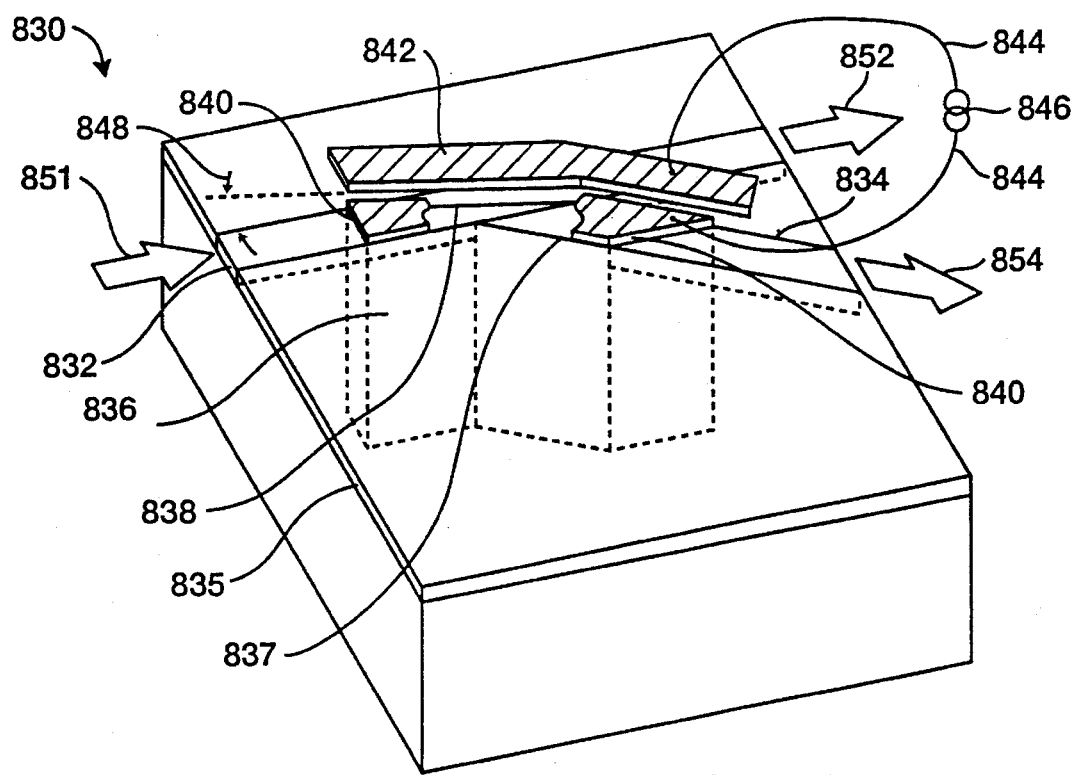
FIG. 30 is an embodiment of a poled total internal reflecting (TIR) waveguide switch with switched poled waveguide stub.

Referring to FIG. 30, there is shown a poled total internal reflecting (TIR) optical energy redirector 830 using a poled waveguide segment. This figure illustrates both a poled TIR reflector for high switched reflection combined with a poled waveguide segment for low insertion loss. An input waveguide 832 extends entirely across the device. A poled region 836 extends across the waveguide at an angle 848, forming a TIR interface for the beam propagating in the guide when the poled region is electro-optically activated. A portion of the poled region also forms a poled waveguide segment 837 that is connected to an output waveguide segment 834. The poled waveguide segment and the output waveguide segment are both laid out at twice the angle 848 with respect to the input waveguide. A voltage source 846 provides the electrical activation for the switch, and is connected to it through two wires 844.

The poled region 836 is defined by six vertical faces according to the diagram, with one face traversing the waveguide 832 at a shallow angle 848 equal to the TIR angle and less than the critical angle for total internal reflection for a desired electrode excitation. This face is the TIR reflecting interface. The next three consecutive vertical faces of the poled region enclose a projection outside of the waveguide 832. The projection is a switchable waveguide segment. The placement of the next two vertical faces is not critical, and may follow the waveguide boundaries and cross it at 90°.

The domains (836 and the region of the substrate outside 836) are characterized by a quiescent index of refraction distribution, which is the spatial distribution of the index in the absence of applied electric field. When an exciting electric field distribution is applied through the domains, they will have an excited index of refraction distribution which is different from the respective quiescent distribution. The excited distribution will also have a range according to the accessible range of the applied electric field. The advantage of juxtaposing two domain types near one another is that the electric response may be opposite in the two domains, producing a transition with double the change in index across the region of juxtaposition. In the case of index or refraction changes, the transition forms a reflection boundary with larger reflection than would be attained with a single domain type.

When the switch is on, an input beam 851 that is coupled into the waveguide reflects off the TIR interface, propagates down the poled waveguide segment, and passes into the output waveguide segment 834 to form a deflected output beam 854. When the switch is off, the input beam propagates through the poled interface and continues through the input waveguide to form an undeflected output beam 852. Because the index change at the TIR interface is low, the reflection in the off state is very low. Because the permanent waveguide segment 834 is separated by several mode exponential decay lengths from the guide 832, the power lost due to scatter as the beam passes by the switching region is also extremely low. An "off" switch is essentially invisible to the waveguide, producing extremely low loss in the input guide.

The additional loss of the switched region in the off state compared to an equal length of unperturbed waveguide is called the insertion loss. Low insertion loss is especially desirable when the input waveguide is a bus with many poled switches.

The angle θ (848) of the poled interface with respect to the input waveguide must be less than the maximum or critical TIR angle $\theta_c$, as derived from Snell's law:

$$\theta \leq \theta_c = \cos^{-1}\left(1 - \frac{2|\Delta n|}{n}\right) \cong 2\sqrt{\frac{|\Delta n|}{2}} \quad (3)$$

where

θ=TIR angle (between the waveguide and the poling interface), n=index of refraction of waveguiding region, and Δn=electro-optic change in index on each side of poling boundary Since the index change occurs on each side of the poling boundary with opposite sign, the effective index change is 2Δn. This expression assumes slowly varying (adiabatic) changes in the index away from the boundary. Due to the doubling in the effective index change, the maximum switching angle that can be achieved with a poled TIR switch is increased by √2 over the prior art switches with a pair of electrodes and no poled interface. This is a very significant increase since it increases the maximum packing density of switch arrays which can be achieved using a TIR switch.

The critical angle $\theta_c$ depends on the polarization of the input beam because the index change Δn depends on the polarization. In z-cut lithium niobate, for example, with a vertical field $E_3$, the TM wave is sensitive to the change in the extraordinary index of refraction through the $r_{33}$ and the TE wave to the change in the ordinary index through $r_{13}$. Since $r_{33} > r_{13}$, it is far easier to switch TM waves. Use of annealed proton exchanged waveguides is very convenient because they guide only waves polarized in the z-direction. In x-cut y-propagating (or y-cut x-propagating) lithium niobate, on the other hand, the TE wave has the higher change in index. Note that in this case, the electrode configuration must be changed to produce a field component in the z direction in the plane of the substrate, instead of in the vertical direction.

The design angle for actual TIR switches must be chosen after optimizing several factors. The mode to be switched includes two angular distributions (in the waveguide fabrication plane and out of the plane) which can be different if the widths of the waveguide in the two planes are different. The angular content δφ of the mode in a given plane covers approximately $\delta\phi = \pm \lambda/\pi w_o$ where $w_o$ is the $1/e^2$ mode waist in that plane. We wish most of the light to be reflected at the TIR interface, so the angle of incidence must be less than the critical angle $\theta_c$ by approximately the angular content δφ in the plane of the switched waveguides. The angular content δφ is inversely related to the waist size, but so is the packing density which we wish to optimize. The angular content of the mode in the direction out of the plane of the waveguides also must be taken into account because it also contributes to the effective incidence angle, although in a geometrically more complex way.

An alternative way of producing a TIR switch is with a strain field instead of or in addition to the electric field. The strain field is most conveniently implemented in a permanent fashion; the electric field is most useful for producing changes in the reflection. An oriented strain field applied at a domain boundary produces different changes in the index of refraction, via the photoelastic effect, in the two domains, resulting in an index of refraction interface. As mentioned above in reference to FIG. 2, the strain field may be produced by heating the sample to a high temperature, depositing a film with a different coefficient of thermal expansion, and cooling to room temperature. A pattern applied to the film by etching away regions such as strips will produce a strain field about the gap in the film. This strain field can then be used to actuate an index of refraction difference at domain boundaries. If the applied film is a dielectric an electric field may be applied through it to the poled regions provided that the deposition of electrodes does not undesirably change the strain field. The film is preferably a film with low optical absorption so that it can be contacted directly to the substrate instead of being spaced by a buffer layer.

The poled region includes a portion of the input waveguide and has an interface normal to the propagation axis of the waveguide. The portion of the input waveguide that contains the TIR interface crossing defines the length of the switch:

where θ is previously defined, $$L = W\cot(\theta) \cong \frac{W}{\theta} \quad (4)$$

L=length of the switch measured along the input waveguide, and

W=width of the waveguide

Thus, in order to minimize the size of the switch, the width of the waveguide must be made as small as possible. For space-critical applications, it is preferable that the waveguide segments be single mode. As a numerical example, if the width of the single-mode waveguide is 4 μm, the maximum index change Δn is 0.0015, and the index of refraction is 2.16, then the TIR angle θ is 3° and the length of the switch L is 76 μm.

The poled waveguide segment forms an angle with respect to the input guide equal to 2θ, which is the deflection angle of the TIR interface. In order to efficiently modematch the beam reflecting off the TIR interface into the poled waveguide segment, the poled segment should have nearly the same transverse mode profile as the input waveguide. Efficient mode matching can be achieved by selecting the proper combination of width and index difference of the poled waveguide. The poled waveguide segment intersects the input waveguide along the latter half of the side of the waveguide occupied by the switch interface. The exact dimensions and placement of the waveguide are determined to optimally match the near field mode profile emerging from the total internal reflection process to the mode of the waveguide in terms of direction of propagation and transverse profile. The same is true of the match between the poled waveguide segment and the permanent waveguide segment 834, similarly to what was described above in reference to FIG. 29A.

The permanent waveguide segment is essentially a continuation of the poled waveguide segment. The length of the poled segment depends on optimizing losses in the input waveguide and the switched waveguide. In order to avoid scattering interaction between the undeflected beam in the input waveguide when the switch is off, the permanent waveguide segment must be separated by some distance (at least an optical wavelength) from the input guide. For a bus waveguide with many switches, the loss in the input guide must be reduced to a value related to the inverse of the number of switches. The modal profile of a beam in the input guide extends a certain distance beyond the indiffused edge of the guide, where it decays exponentially. If the permanent segment is separated from the input guide by several of these exponential decay constants, the loss can be reduced to an acceptable level for a bus waveguide.

The length of the poled segment affects the loss in the reflected beam as well. The poled waveguide segment may have higher losses per unit length than an indiffused waveguide, due to higher wall roughness. In addition, there are the above mentioned mode conversion losses at each end of the waveguide, which are minimized by optimally matching the mode profiles. If the poled segment is short (on the order of the Rayleigh range of the beam), the transmitting beam does not substantially convert into the mode of the poled segment, thus reducing the coupling losses. The optimal length of the poled segment depends on the relative loss that is tolerable in beams in the input waveguide and the switched waveguide.

As in the case of the waveguide segment modulator/attenuator shown in FIG. 29A, there is a need for vertical confinement of the mode in the switched waveguide segment 837. The same options described there can be implemented here. Shown in FIG. 30 is a planar waveguide 835 which confines the beam in a plane parallel to the surface of the substrate. Since the planar waveguide is uniform, its presence does not affect the loss of the waveguide switch junction in its off state. In place of the planar waveguide, or in some combination, the other alternatives may also be implemented, including tailoring the depth of the electric fields to obtain vertical confinement, using short depth poling, using a partial waveguide which is augmented by the field induced index change, and using a full permanent waveguide which is turned off by a field activated poled region. The latter two alternatives have the disadvantage that the loss to the beam through waveguide 832 is higher due to the adjacent index discontinuities.

Horizontal confinement is also an issue in optimizing the switching region. If high switched efficiency is desired, it is preferable to have a large TIR reflection angle. The left half of the input wave 851 reflects first off the interface 838, forming the fight half of the reflected wave. However, after reflection, the fight half of the reflected wave is unconfined in the transverse dimension until it arrives into the waveguide segment 837. During its unconfined passage, it will expand by diffraction, reducing the fraction of the beam power which couples into the output waveguide 834. This effect degrades the efficiency of the switch in its on position. However, the mean unguided distance is limited to approximately the waveguide width divided by four times the sine of the angle 848. The right half of the input wave remains confined after it passes the waveguide segment 837 until its reflection off the interface 838 because of the permanent index change due to the fight hand side of the waveguide 832. It then matches well into the output waveguide 834. Both portions of the input beam 851 suffer an undesired reflection from the side of the waveguide 832 after reflecting from the TIR surface 838. Since this surface is at the same angle to the axis of propagation of the beam as the surface 838 was, but with only a fraction of the index difference, there only be a partial, not a total, reflection from this surface which also adds to the loss of the switch.

The electrode design is a critical aspect of this switch, in order to optimize the efficiency of the reflector and minimize the loss of the waveguide. Preferably, two electrodes are used to activate the switch. A first electrode 840 is placed over the TIR interface 838, while a second electrode 842 is placed alongside the first electrode, adjacent to that interface. The main parameters for optimization are the separation of the two electrodes and the distance between the edge of the first electrode and the poling boundary, which may or may not overlap. The spacing between the two electrodes influences the voltage required to activate the device, as well as the width of the electric field pattern which penetrates the substrate and produces the index change profile. Electrodes that are spaced further apart require higher voltages, but create an electric field that extends deeper into the substrate than closely spaced electrodes.

The electric field penetration depth is critical to obtaining a large net reflection. Because the fields get weaker the farther they are away from the electrodes, the induced index change at the poling boundary also drops with depth, as does the TIR angle. At a certain depth called the effective depth, the index change becomes insufficient to maintain total reflection for the central ray of the optical beam at the angle of the switch structure. Since the reflection drops rapidly with index change at values below the minimum TIR value, the TIR mirror essentially stops functioning at this depth. For high net reflection into the guides 837 and 834, the device design should be adjusted to create an effective depth below the majority of the field profile in the guide 832.

The second important operating parameter influenced by the electrode design is the penetration of the evanescent fields of the reflecting wave beyond the TIR interface 838. Although no power may be transmitted beyond the TIR interface in the "on" condition, the electromagnetic fields penetrate the TIR surface by a distance on the order of a wavelength. There will also be spatial dependence of the applied electric field beyond the TIR surface, the field strength being reduced (and in fact inverted) in regions closer to the other electrode 842. The index change is therefore reduced beyond the TIR interface. Care must be taken that the evanescent fields decay to a negligible value before substantial variation in the field occurs, or power will leak through the TIR interface. Optimally, the first electrode will overlap the poling interface by a distance chosen for maximum index change and for sufficient constancy of field beyond the interface 838.

The first electrode also extends across the poled waveguide segment 836, and possibly into adjacent areas. The shapes of the two electrodes exciting this region 836 are determined by optimizing the power flow through the waveguide segment and into the permanent waveguide 834. Other electrode structures can be used to modify the strength of the electric field in the poled region. If, for example, the second electrode is extended around the first to form a U shape, the electric field under the first electrode is increased on the average, but it forms somewhat of a two-lobed waveguide, which may not provide an ideal index profile.

The TIR switch is an optical energy router and can also be used as a modulator. If the voltage source is continuously variable, then the modulator is analog, with a nonlinear relationship between voltage and reflectivity. As the applied voltage is increased, the depth of the total reflecting interface is increased, producing a continuously adjustable reflection out of the wave 851 into the wave 854. The modulator can be used in reflection or transmission mode, depending on whether the transmission should go to zero or 100% when the voltage is removed. For special nonlinear applications, the nonlinearity of the reflection and transmission coefficients as a function of voltage, such as where the receiver is logarithmically sensitive to the level of the signal, might be useful.

Figure 31:
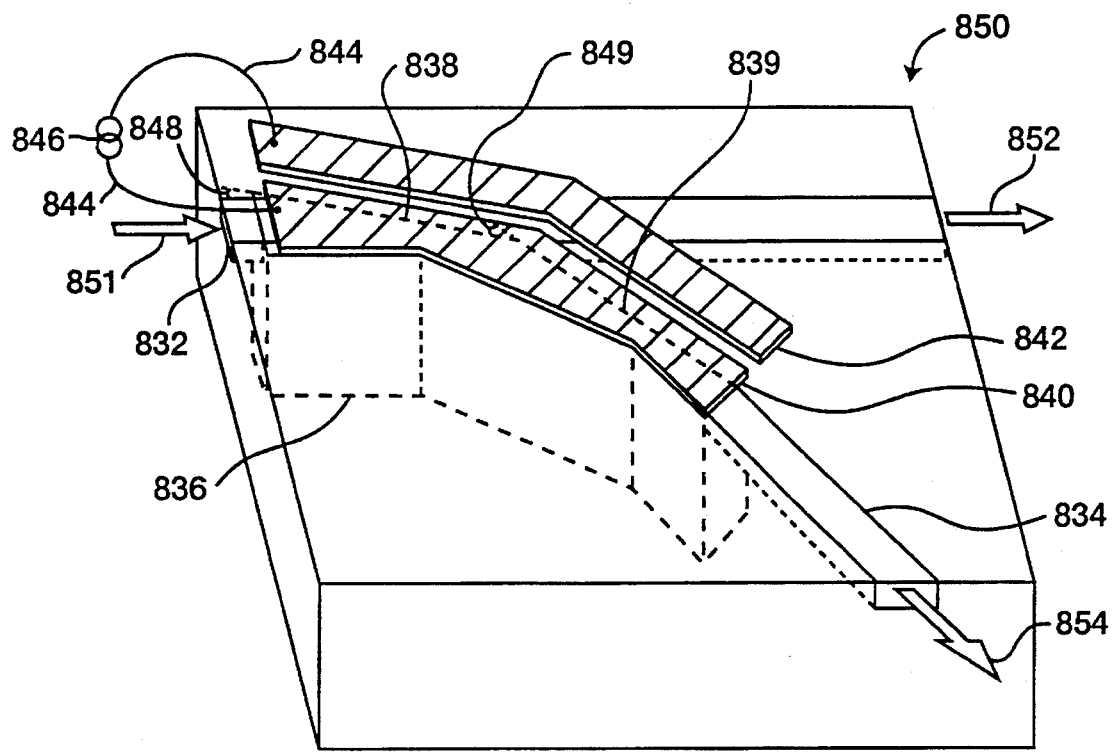
FIG. 31 is an embodiment of a dual TIR waveguide switch.

FIG. 31 shows a TIR switch with two TIR reflectors. If it is desired to increase the angle between the output waveguide 834 and the input waveguide 832, a second TIR interface 839 may be added. The angle between the input waveguide 832 and the output waveguide 834 is doubled relative to that of FIG. 30, and may be doubled again and again by adding additional TIR interfaces. The interface 839 is created at an angle 849 relative to the interface 838 equal to twice the angle 848. (Subsequent TIR interfaces, if any are added, should be added at the same angle 838 relative to the previous TIR interface.) The switched waveguide portion 837 of FIG. 30 is no longer required since the dual TIR mirror structure brings the light so far away from the input waveguide 832 that the permanent waveguide 834 may be butted directly against the end of the poled region 836 without contributing significant loss to the waveguide 832. Again, vertical confinement is provided in the poled segment 836. The poled segment 836 and the output waveguide 834 are configured and aligned so that the field profile propagating in the chain of TIR and waveguide segments optimally matches the local lowest order mode field profile of the input waveguide 832. After the TIR reflectors, the deflected beam is matched into a permanent waveguide 834 to form the output beam 854 when the switch is on.

The shape of the inside boundary of the poled region outside the input waveguide 832 is defined by the reflection of the input waveguide through the TIR mirrors, one after the other. This definition of the inside boundary achieves optimum guiding of the inside edge of the waveguide mode while it is reflecting from the two TIR mirrors.

Figure 32:
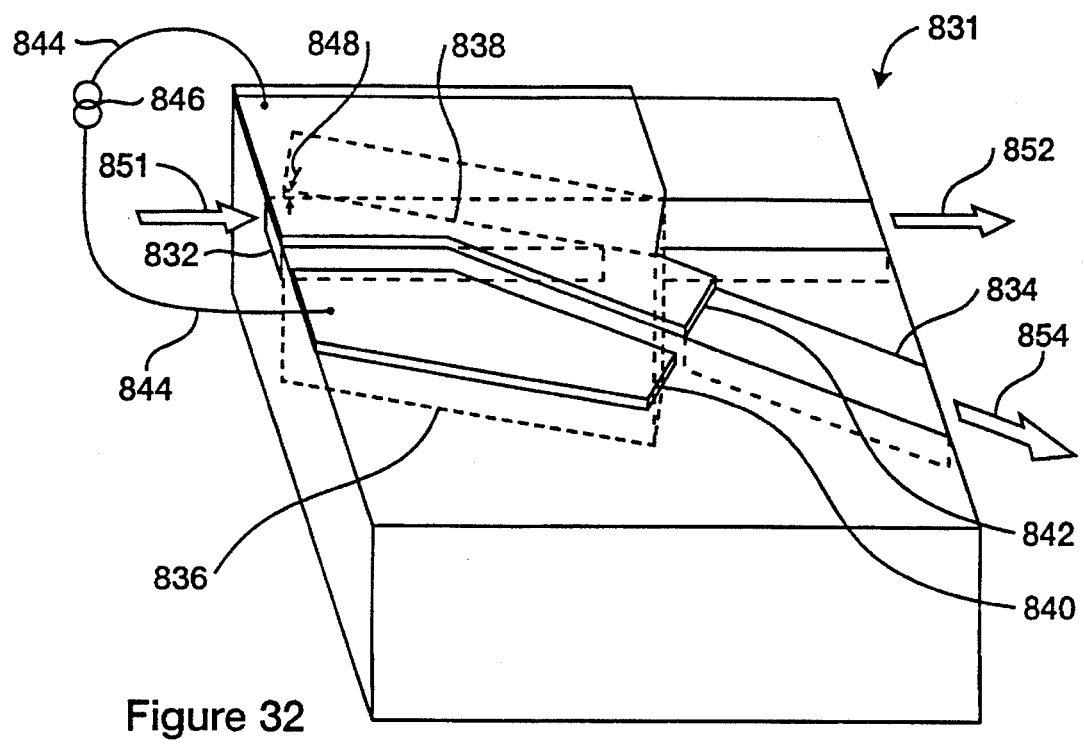
FIG. 32 is an embodiment of a TIR electrically switched beam director with switched unpoled waveguide stub.

FIG. 32 shows a TIR switched beam director with a poled TIR switch 831 with an electrically switched waveguide segment. In this structure, the region 836 is reverse poled, lies behind the interface 838, and is excited as before by a pair of electrodes 840 and 842, which are activated by voltage source 846 and connected via conductors 844. The polarity of the excitation is again selected to produce a negative index change coming from the direction of the input beam 851. When the switch is on, the beam is reflected off the TIR interface 838 towards the permanent waveguide 834, but unlike in FIG. 30, there is no poled waveguide segment joining them. Instead, the electrode 842 is extended over the intermediate region between the input waveguide and the output waveguide 834. A coupling waveguide segment may be formed by applying an electric field to a region between a lateral boundary of the segment of the input waveguide 832 containing the TIR reflection boundary and an input boundary of the output waveguide 834. The three dimensional distribution of the electric fields is determined, as always, by the shape of the electrodes and Maxwell's equations. The electric fields produced by that electrode produce a positive index change through the electro-optic effect, providing the desired switched waveguiding section. As described elsewhere, this waveguide segment is also configured and aligned to optimize the coupling of the input mode 851 into the output mode 854. As an alternative in this and any of the TIR switch implementations, the output waveguide may originate at the input waveguide with negligible gap. This alternative has higher insertion loss in the switch off (straight through) configuration, but it has a simpler structure.

Figure 33:
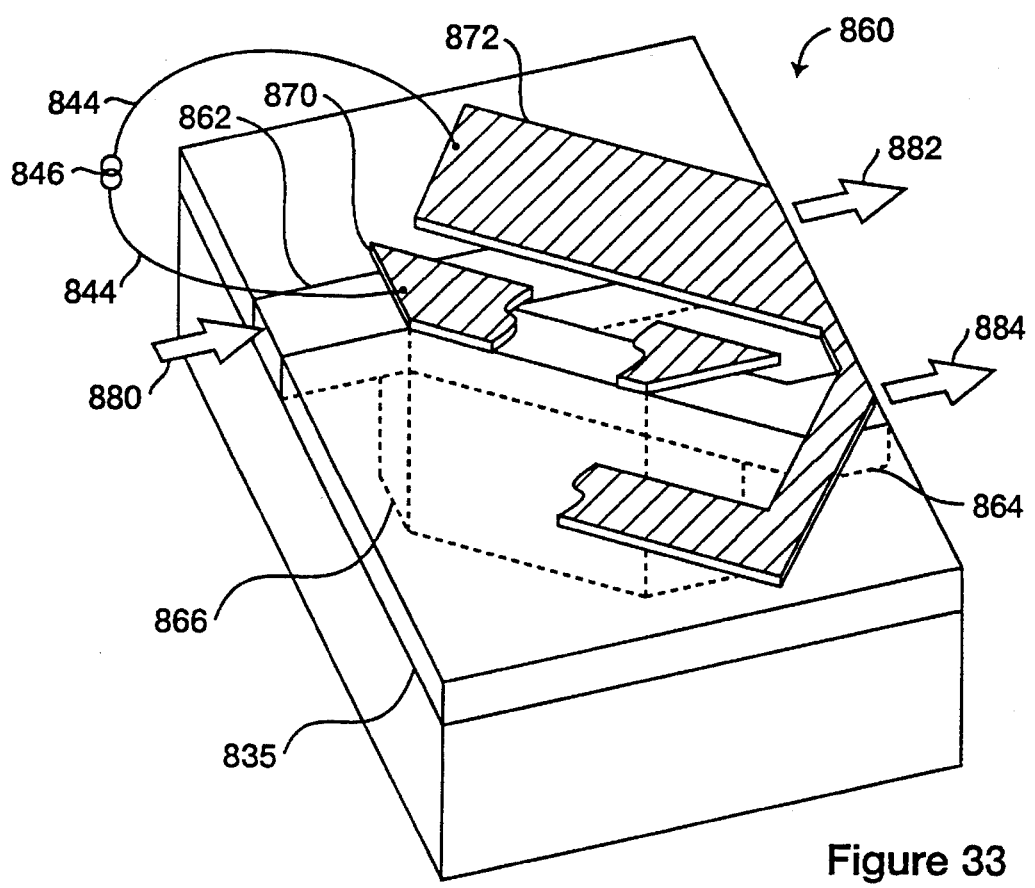
FIG. 33 is an embodiment of a two position poled waveguide router without TIR.

Referring to FIG. 33, there is shown a two position waveguide router using a poled segment, which is not based on total internal reflection. The poled region 866 forms an electrically excitable waveguide segment which crosses the input waveguide 862 at a small angle. When the field is applied, the index in the segment 866 is increased, while the index in the adjacent region in the input waveguide is decreased. Thus, the input beam 880 is at least partially coupled into the poled waveguide segment. When the switch is off, the input beam continues to propagate through the input guide to form an unswitched output beam 882. The small angle may be tapered adiabatically, forming a low loss waveguide bend, if it is desired to switch all or most of the input light into the output guide 864 to exit the device as the switched output beam 884.

At least two electrodes are used to apply an electric field across the poled region to activate the waveguide. A first electrode 870 is positioned above the poled waveguide segment, while a second electrode 872 is positioned adjacent to the first electrode. The second electrode 872 is adjacent to the first electrode and may be placed on both sides of the poled waveguide segment, in order to achieve a high power splitting ratio. As before, the electrodes are excited by the power supply 846 through conductors 844, and a planar waveguide 835, or the electric field falloff with depth, or one of the other approaches described herein is used to obtain vertical confinement for the switched propagating modes.

Figure 34:
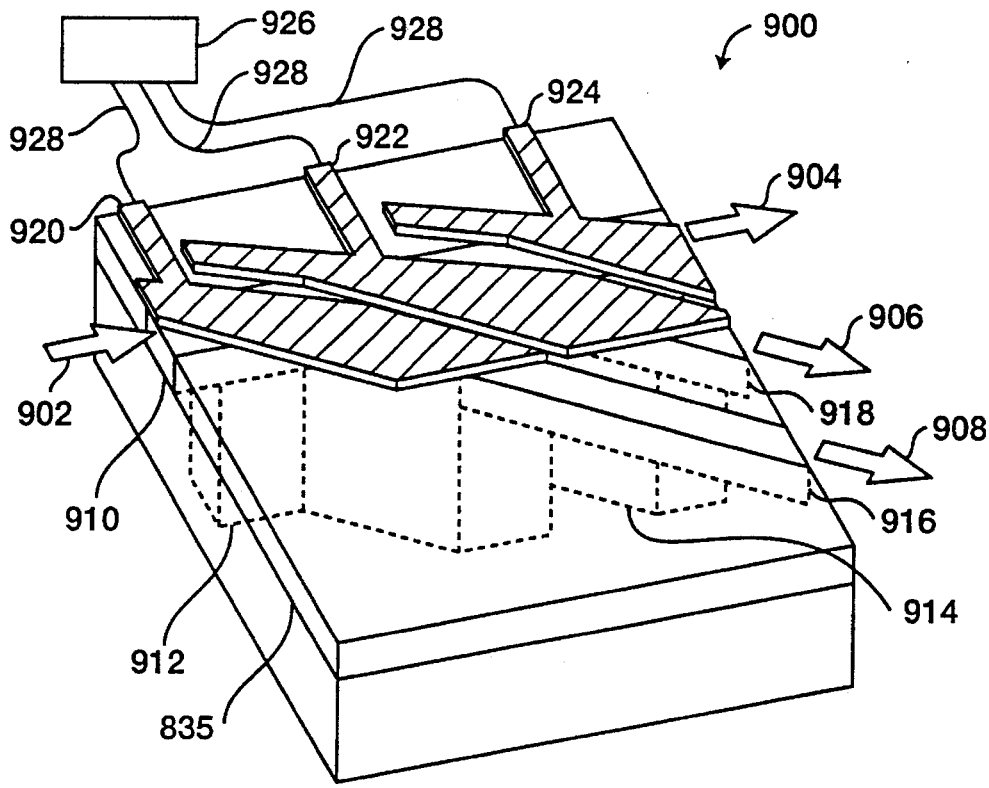
FIG. 34 is an embodiment of an array of poled TIR switches with a 50% switch packing density.

Referring to FIG. 34, several poled TIR switches are placed side by side to form an array 900. The poled regions 912 and 914 forming the TIR interfaces are placed one after the other along the waveguide 910. Each poled region has the same crystal orientation, with the z axis of the crystal in the regions 912 and 914 reversed relative to that of the reminder of the crystal. The other aspects and many variations of this configuration have been described above in reference to FIG. 30.

Each of the switches are individually activated using a multi-output voltage control source 926, which is connected to the electrodes with wires 928. When all switches are off, the input beam 902 propagates down the input waveguide 9 10 to form an unswitched output beam 904 with negligible loss. If the first switch is on, then the input beam reflects off the first TIR interface to form a first reflected output beam 908 in waveguide 916. If the first switch is off and the second on, the input beam reflects off the second TIR interface to form a second reflected output beam 906 in waveguide 918, and so on for the subsequent switches. This multiple switch structure can be extended to n switches.

An electrode is laid out over each TIR interface as described above. One or more of the electrodes 920, 922, and 924 serve as the cathode for one switch and the anode for another. For example, a voltage is applied between the second electrode 922 and the first and third electrodes 920 and 924 to activate the second switch forming the output beam 906. An electrode 922 that acts as both an anode and a cathode should preferably extend adjacent to the TIR interface of the prior poled segment 9 12 while also covering the TIR interface of one poled region 914 and one waveguide segment of one poled region 914. Only a portion of the structure is shown, with two complete poled segments 912 and 914 and one complete electrode 922. This structure can be replicated into n switches by aligning duplicate complete electrodes and poled segments.

In order to avoid crosstalk in the channels, the voltage on the electrodes may be applied in such a manner that the input beam does not see any electro-optic index changes until it enters the region of the activated switch. For example, to activate the TIR interface of the second poled region 914, a voltage may be applied between electrodes 922 and 924, keeping the same potential on electrodes 920 and 922 and prior electrodes.

Although the total length of the poled regions is longer than L, the distance occupied along the waveguide by a given region is equal to L by definition. A linear array of TIR switches with a 100% packing density would therefore have new poled regions starting every distance L. This is called 100% packing density because at this density the adjacent regions just barely touch each other at the inside corner of the poled region in the waveguide. Having adjacent regions touch each other is disadvantageous because some of the light guided in the previous poled structure can leak out into the next poled structure where the structures touch.

We have noted above that the corner which touches the preceding poled region is formed by two vertical faces of the poled region whose placement is not critical. By moving these faces so that the width of the poled region is thinned on the side of this inside corner, it can be arranged that the regions no longer touch each other, reducing the leak of optical energy. For example, the inside corner can be moved to the middle of the waveguide by halving the length of the face which traverses the waveguide at 90°. The face which used to parallel the waveguide now parallels the TIR interface, and becomes a critically positioned surface. We call the poled regions with this geometry "dense packed" poled regions. (There are other ways the objective of minimizing the light leak may be accomplished, such as adding a seventh vertical face between the two noncritical faces, but the alternative just described has another advantage in dense packing.)

Figure 35:
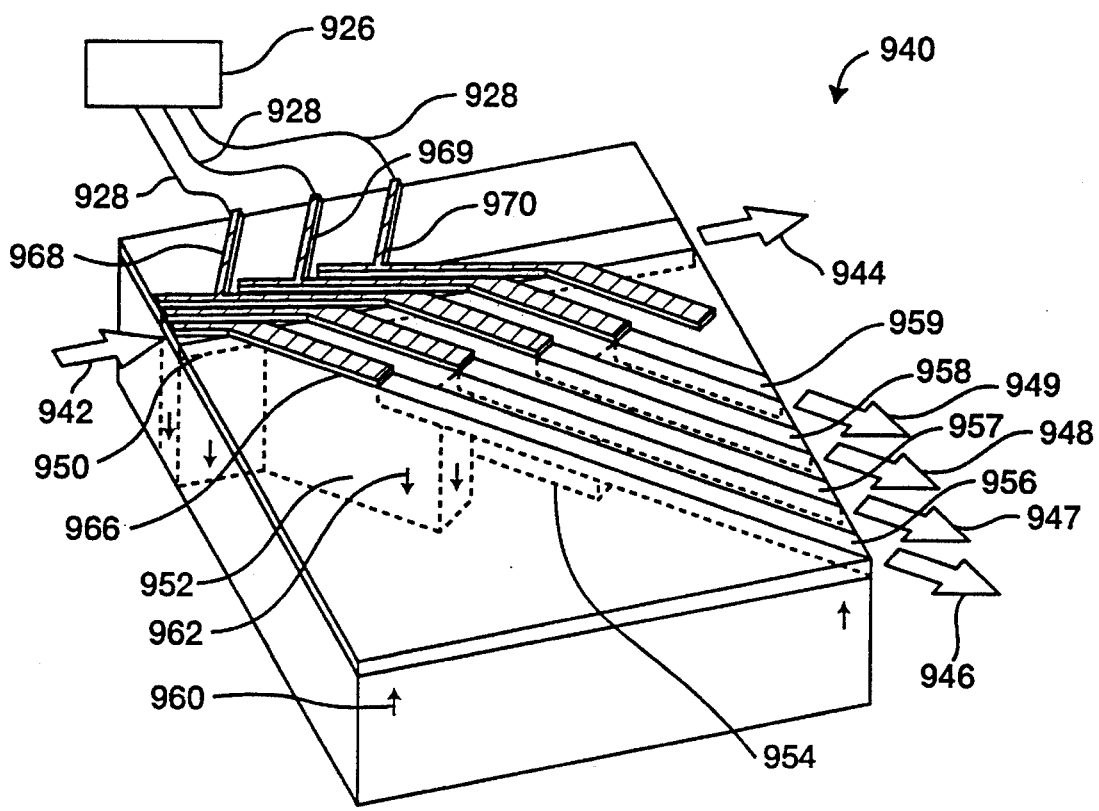
FIG. 35 is an embodiment of an array of poled TIR switches with a 100% switch density.

FIG. 35 shows a configuration wherein the linear density of switches is be doubled by using the dense packed geometry for the poled region and reversing the polarity of the adjacent poled regions. The interfaces of the poled regions transverse to the waveguide are now identical but for a translation along the axis of the waveguide. The poled regions will therefore stack solidly along the waveguide, doubling the switch density. In fact, only the reverse poled region is fully spatially defined, since the other region has the same poling direction as the substrate (in the optimal case where the substrate is fully poled). Two regions 952 and 954 of reverse poling are shown in FIG. 35. The TIR interfaces can be thought of as the first face or the input face and the second face or the output face of the poled region where unswitched light travelling in the waveguide 950 potentially enters or leaves, respectively, the unexcited poled region.

The TIR interface for the output beam 946 is formed between the poled substrate and the first (input) face of the reverse poled region 952, and is excited by electrode 966. The TIR interface for the output beam 947 is formed between the second (output) face of the reverse poled region 952 and the poled substrate, and is excited by electrode 967. The TIR interface for the output beam 948 is formed between the poled substrate and the first face of the reverse poled region 954, and is excited by electrode 968. The TIR interface for the output beam 949 is formed between the second face of the reverse poled region 954 and the poled substrate, and is excited by electrode 969. The electrodes extend above the respective TIR interfaces, and along the switched waveguide segments which connect to the permanent output waveguides 956, 957, 958, and 959. Preferably, one or more of the electrodes 966, 967, 968,969 and 970 serve as the cathode for one switch and the anode for another. Each electrode therefore extends parallel to and along the full length of the TIR interface of the previous switch.

Each of the switches is individually switchable by applying electric fields with voltage source 926 via conductors 928. When all switches are off, the input beam 942 propagates down the bus waveguide 950 to form an unswitched output beam 944. When the first switch is on, the input beam reflects off its respective TIR interface to couple into the first output waveguide segment 956 to form a first reflected output beam 946. For the subsequent switches, the input beam reflect off the respective subsequent TIR interface to couple into a waveguide segment 957, 958, or 959 to form a reflected output beam 947, 948, or 949. The voltage on the electrodes is typically set so that there is no optical interference from adjacent switches: all preceding switches are off. This can be accomplished for example by maintaining all the preceding electrodes at the same potential as the switched electrode. This multiple switch structure can be extended to n switches.

It is desirable to extend the upstream end of the dense packed poled regions significantly beyond the edge of the input waveguide 950, maintaining the angle of the vertical surfaces with respect to the waveguide. This extension captures the full exponential tail of the input waveguide mode, and pushes the remaining noncritically positioned surface of the extended dense packed poled region out of the waveguide 950, thereby diminishing the optical loss. (Upstream and downstream are defined in relation to the direction of propagation of the input beam 942.)

If the switched waveguide segment of the poled regions is designed as described above in reference to FIG. 30, the separation of the output waveguides becomes equal to their width in the highest density packing, so that they merge into a planar waveguide. While a planar output waveguide may be useful for some applications, the output waveguides may be separated using a second poled TIR interface within each switch. The use of two TIR interfaces in a switch has been described in reference to FIG. 31. Note that in the case of FIG. 35, the geometry of the poled region is slightly different to accomplish the stacking. The "output waveguide" section of the extended dense packed poled regions is rotated about the end of the first TIR interface to an angle 3θ relative to the input waveguide 942, maintaining the parallelism of its faces. This "output waveguide" section therefore becomes a second TIR reflector segment.

The width of the second TIR reflector segment is about 50% larger than the input waveguide. The mode propagating in the second TIR reflector segment is unconfined on its inner side for a distance of about 2W/sinθ where W has been defined as the waveguide width. Any diffraction which occurs on this side will result in reduced power coupling into the output waveguides 956–959. It is desirable to keep this distance less than about a Rayleigh range. In the case of a 4 μm wide waveguide operating at a TIR angle of 4.5°, the total unconfined distance is about 100 μm, which is approximately equal to the Rayleigh range for a blue beam. One solution to optimizing the performance of an array of such switches lies in adding a permanent reduction of index of refraction (without degrading the electrooptic coefficient) in a strategic location within the second TIR reflector segment. This strategic location is the zone bounded by the inside wall of the extended dense packed poled region, and by the inside wall of the poled region 836 as defined in reference to FIG. 31. The permanent index of refraction reduction defines a permanent waveguide boundary at the optimal location for confinement of the mode as it is reflecting from the two successive TIR mirrors. The added index reduction tapers to zero as it approaches the input waveguide, and the loss added to the input waveguide can be reduced sufficiently by truncating the index reduction region sufficiently far from the guide. The index reduction also does not interfere with the TIR function of the previous TIR interface (indeed, it helps).

Thus, the switched beam reflects from two consecutive TIR interfaces, doubling the total deflection angle of the switch to 4θ. By doubling the output angle, space is now made available for output waveguides of width equal to the input waveguide, with a separation equal to their width in the densest configuration.

The output waveguides connect to the poled region in FIG. 35 at the final corner of the second TIR reflector, at an angle θ relative to the second TIR interface and optimally aligned to collect the light reflecting off the second TIR interface. Preferably, the two TIR reflectors for a given switch are connected without an intervening waveguiding segment. This minimizes the path length that the deflected beam must travel in the poled waveguide, which may have a higher loss than a permanent channel waveguide due to wall roughness and asymmetry.

In an alternate poling boundary structure, the boundary between two adjacent poled regions may be a curved TIR structure. The mode of such a structure is again a whispering gallery mode, possibly modified by some confinement on the inside boundary of the waveguide. The radius of curvature of the poling boundary is made small enough so the whispering gallery mode matches well with the waveguide mode for large power coupling between the two types of guide, yet large enough for practical total internal reflection to occur for the distribution of angles within the mode.

Figure 36:
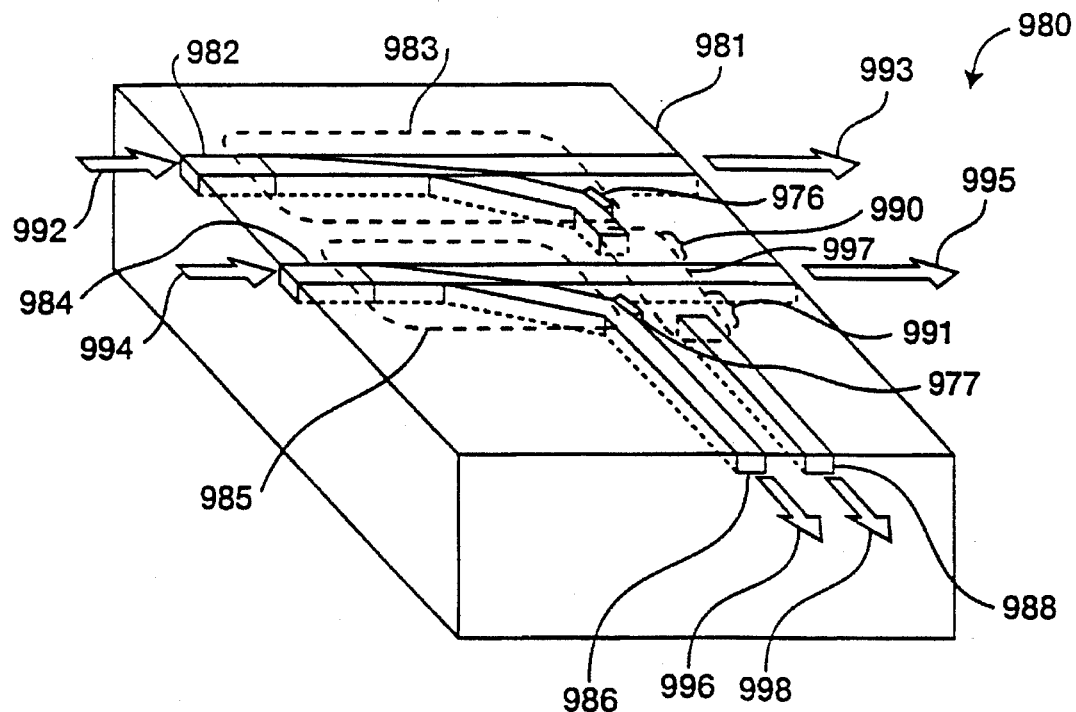
FIG. 36 is an embodiment of a dual waveguide structure for high density packing architectures with permanent turning mirror and asymmetric loss crossing region.

FIG. 36 shows a dual crossing waveguide structure 980 for higher packing density. This structure incorporates two innovations: an asymmetric loss waveguide cross 997, and 90° mirrors 976 and 977. The density is increased with the addition of a second input waveguide 982 parallel to the first input waveguide 984, on the same surface of the substrate 981, effectively doubling the packing density. The switching elements 983 and 985 have been illustrated schematically as one of the variants of the poled TIR switch described above, but can alternatively be any integrated optic switch described in the literature, so we do not describe the switch in detail here or in the FIG. 36. (The switches may also be implemented in alternate ways described herein such as the grating switches described in reference to FIG. 7, the coupler described in reference to FIG. 10, the splitter described in reference to FIG. 25, and the guiding switch described in reference to FIG. 33.)

A first input beam 992 propagates down the first waveguide, while a second input beam 994 propagates down the second waveguide. The two beams may originate from distinct sources or from the same optical source via an active or passive splitter. When the corresponding switch is off, the input beam 992 and 994 propagate through to form the undeflected output beam 993 and 995, respectively. If the corresponding switch is on, the first input beam 994 is deflected into the output beam 996, while the second input beam 992 is deflected into the output beam 998.

In the asymmetric waveguide cross 997, two waveguides cross each other with the index of refraction profiles adjusted to minimize the loss in one guide at the expense of somewhat higher loss in the other. The crossing guides are laid out at a large angle with respect to each other (herein illustrated at 90°), in order to minimize the crossing loss. Referring to the geometry of FIG. 36, the second deflected beam 998 crosses over the first waveguide 984 (in this case so that the switched output light beams can propagate in parallel output waveguides 986 and 988). The waveguide 988 is broken at the crossing point with the waveguide 984, leaving the gaps 990 and 991. This is done to minimize the loss in the waveguide 984, producing an asymmetric loss structure with higher loss in waveguide 988 than in waveguide 984 in the crossing region. For later convenience, we say that the asymmetric cross "points" along the waveguide with lower loss. The asymmetric cross 997 points along the waveguide 984. If the gaps 990 and 991 are wider than several exponential decay lengths for the mode in the guide 984, the cross structure will provide essentially no additional loss to the waveguide 984. A large number of asymmetric cross structures may then be sequenced pointing along the waveguide 984 to produce a low loss waveguide crossing many others. The gaps 990 and 991 will produce some reflection and scatter to the beam 998 propagating in the broken waveguide 988, and the width of the gap may be minimized subject to the combined constraints of desired low loss in the two waveguides. To minimize the optical loss from the beam 998 propagating in the waveguide 988 at the cross structure, the index profile transverse to the axis of propagation of the guide may be modulated or tapered along the axis of the guide. The goal is to maintain very low loss in the waveguide 984 while minimizing the loss in 988. This purpose is achieved if the index of refraction change in the regions adjacent to the guide 984 is small and slowly varying compared to the index of refraction change of the waveguide 984 itself. (All index of refraction changes referred to are relative to the substrate.)

The loss in the second waveguide has two components: one due to reflection from the index discontinuities, and one due to diffractive spreading. The reflection loss is determined by the magnitude of the index change in the waveguides, and by its taper profile at the ends and sides of the waveguides. For example, if the index change at the core of the waveguides is the same in both at $\Delta n=0.003$, the net reflection loss at the four interfaces will be less than 5%, neglecting corrections due to the exact index profiles which can reduce the reflection. The diffractive loss is even lower because the gap width is typically much less that the free space Rayleigh range. If, for example, the narrowest mode dimension is the depth, at 2 μm, then the Rayleigh range is 55 μm, assuming an index in the material of 2.2 and a wavelength of 0.5 μm. The diffractive loss at each gap is less than 1%, assuming a 3 μm wide gap. If the waveguide depth is 4 μm, the diffractive loss is substantially smaller. The diffractive loss may be minimized by increasing the dimensions of the waveguide relative to the gap size.

In general, the "gaps" 990 have an index of refraction distribution adjacent the crossing region. This index of refraction distribution is defined relative to the index of refraction of the substrate. The index of refraction in the gaps may taper from a value equal to the index of refraction distribution of the waveguide 988 to another value adjacent the crossing region. The important part of the crossing region is the volume within which propagates the optical mode of the waveguide 984. To minimize the loss in the waveguide 984, the index of refraction adjacent the crossing region in this important part is much smaller than the index of refraction distribution within the waveguide 984.

The crossed waveguide geometry with asymmetric optical loss may be combined in many geometric variations. For example, three or more input waveguides may be used with multiple crossing points where switched output waveguides traverse input waveguides. The selection of preferred waveguides, preferred in the sense of having its loss minimized at the crossing point, can be also done in many ways. We have discussed an example in which the preferred guides are parallel. However, in a more complex system, there may be preferred guides which cross each other as well as crossing unpreferred guides. The selection of how to accomplish the crossings of the preferred guides depends on the application. The waveguide crossing structures in a device may be any combination of asymmetric loss crossings and symmetric loss crossings where the gap widths are zero.

For switches that deflect the beam at a small angle (such as a TIR switch), additional beam turning means such as 976 and 977 may be provided, in order to achieve the desired large angle of intersection at the waveguide cross. The beam turning means 976 and 977 is preferably a vertical micromirror, and is installed at a fixed position. Each micromirror is formed by removing the substrate material within its volume, leaving a flat vertical surface (preferably with low roughness) adjacent to the waveguide and oriented at such an angle so as to direct the reflected light optimally down the output waveguide 986 or 988. The micromirrors may be fabricated using conventional processing techniques, including laser ablution with, for example, a high power excimer laser or ion beam etching, both of which might define the mirror geometry with the aid of a mask. The volume may be filled with a low index, low loss material such as aluminum oxide or silica to prevent contamination of the mirror surface, and to maintain the total internal reflection property of the mirror.

The angle of the micromirror relative to an input of one of the waveguides is preferably adjusted to provide total internal reflection. The thickness of the micromirror volume in the direction normal to its reflective surface is preferably much greater than a wavelength of light in order to minimize leakage through the micromirror volume of the evanescent tail of the reflected light wave. The angle relative to the other waveguide is adjusted so that the mean propagation direction of the reflected beam is parallel to the central axis of the other waveguide. The location of the micromirror is adjusted to optimize the coupling of the light from one waveguide to the other. The location of the mirror in the junction region is preferably adjusted so that the "centers of gravity" of the two beam profiles illuminating the mirror surface are at the same place. The length of the mirror transverse of the incident and reflected beams is greater than about twice the width of the waveguide to reflect essentially the entire mode, including the exponentially decreasing intensity in the beam tails. Light input from one of the waveguide modes diffracts through the waveguide junction region to the micromirror, reflects, and diffracts back through the waveguide junction region at the reflected angle before coupling into the output waveguide mode. The junction region between the two waveguides in the vicinity of the mirror is optimally kept small compared to the Rayleigh range of the unconfined beam, which can be accomplished with waveguides having widths in the 2 to 5 micron range.

The structure of FIG. 36 makes possible a large interdigitated array of switched light distribution waveguides. The entire structure 980 may be replicated many times along a pair of input waveguides, producing a set of interleaved output waveguides with a simple pattern of alternating parentage (in this context, parentage means deriving optical power from a specific "parent" input waveguide). Each input waveguide may be connected to a large number of output waveguides as long as the switching elements have a very low insertion loss, as is the case for the elements listed above and described herein. Because of the asymmetric cross structures, adding more input waveguides above the others (with additional switches, micromirrors, asymmetric waveguide crosses, and interleaved output waveguides) does not significantly increase the loss of the lower input waveguides or affect their ability to distribute light over a long distance to many output waveguides. It will increase moderately the optical source power required for each additional input waveguide in order to deliver the same power to the end of their respective output waveguides. As many input waveguides as desired may be used in parallel to distribute a potentially large total power of light. Their output waveguides may be interleaved in many alternative patterns using the approach of FIG. 36. The same result may be achieved using grating reflectors in the place of the TIR switches. If the grating reflectors are oriented at a large angle to the input waveguides, the micromirrors are also no longer needed.

The structure described in the previous paragraph is a one-to-many architecture in that it has one output per switch with a multiplicity of switches per input. There is no way to connect many inputs into the same output. What is needed is a many-to-one architecture. The many-to-many configuration is then obtained by combining the one-to-many and the many-to-one configurations.

Figure 37:
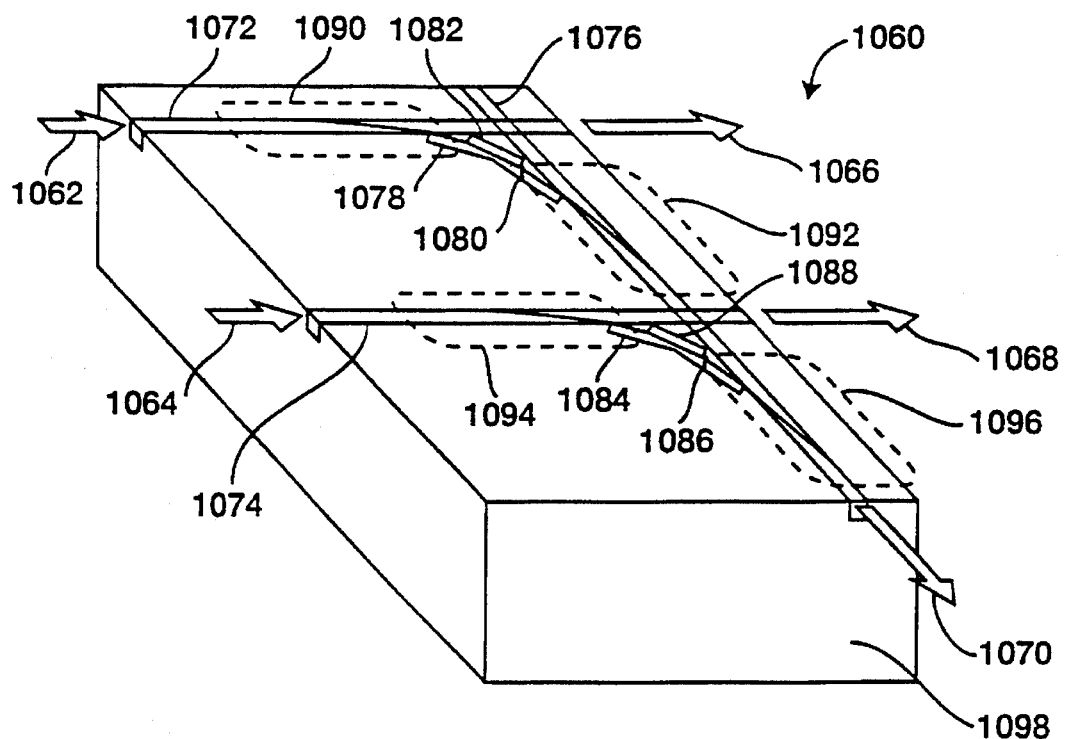
FIG. 37 is an embodiment of a switched waveguide array with TIR switches.

FIG. 37 shows an array 1060 of waveguides with TIR switches arranged in a many-to-one configuration. In the structure shown, two Input waveguides 1072 and 1074 switch two input beams 1062 and 1064 into an output beam 1070 in one output waveguide 1076. The input TIR switches 1090 and 1092, and the output switches 1094 and 1096 have been described before in reference to FIGS. 30–32 and 36, so they are shown only schematically, leaving off many elements (such as the electrodes, the contacts, the power supply, the controller, the vertical confinement means, the depth of the poled regions, the type of output waveguide confinement) for clarity. The input TIR switch is arranged with the beam propagating in a forward sense as described in reference to FIG. 36, while the output TIR switch is arranged with the beam propagating in a reverse sense. The switches 1090 and 1092 are switched at substantially the same time, as are switches 1094 and 1096, because both are required to accomplish injection of power into the output waveguide 1076. As described in reference to FIG. 36, when the switches 1090 or 1094 are on, a fraction of the beams 1062 and 1064 are switched, respectively, into the waveguide 1078 or 1084. The remainder of the input beams propagates along the extension of the input waveguide into an output path as beams 1066 or 1068, which may be used in some other component or brought into a beam dump for absorption or scatter out of the system. Micromirrors 1082 and 1088 are provided to reflect the beams from waveguides 1078 and 1084 into the waveguides 1080 or 1086, respectively. In their on condition, TIR switches 1092 or 1096 receive the beams propagating in the waveguides 1080 or 1086, respectively, forming the output beam 1070. If it is desired to switch the beam 1062 into the output beam 1070, clearly the switch 1096 and all subsequent switches must be off. (It would otherwise reflect much of the desired beam out of the waveguide 1076.) A similar constraint applies for all the other switched beams in multiple switch arrays.

The substrate 1098 is processed as described herein to produce the structures illustrated. When the switches 1090 or 1094 are off, the input beam propagates through the switching regions 1090 or 1094 with negligible loss, traverse the waveguide 1076 (in an asymmetric cross if desired), and emerge as output beams 1066 or 1068, respectively, possibly for use as inputs to additional switches.

Additional input waveguides may also be provided, coupling into the waveguide 1076 (or not coupled, as desired), in a modified repetition of this structure in the direction of the output beam 1070. Additional output waveguides may also be provided, coupled if desired to the input waveguides 1072 and/or 1074, in a modified repetition of this structure in the direction of the beams 1066 and 1068.

Figure 38:
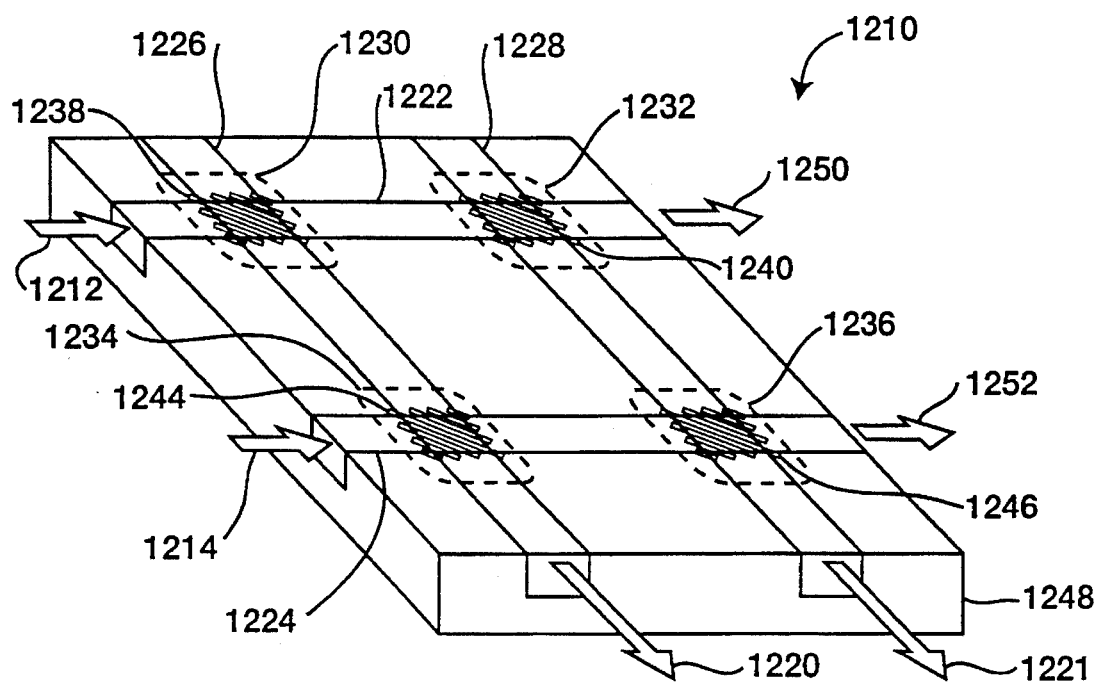
FIG. 38 is an embodiment of a switched waveguide array with grating switches.

FIG. 38 shows an array 1210 of grating reflectors in a many-to-many configuration. In the structure shown, two input waveguides 1222 and 1224 switch two input beams 1212 and 1214 into two output beam 1220 and 1221 in two output waveguides 1226 and 1228 which abut or encounter the input waveguides. The grating switches 1230, 1232, 1234, and 1236 containing the gratings 1238, 1240, 1244, and 1246 have been described before in reference to FIGS. 7, 8, 12, and 13, so they are shown only schematically, leaving off many elements (such as the electrodes, the contacts, the power supply, the controller, the vertical confinement means, the depth of the poled regions, the tapering of the poled regions or electrode spacing) for clarity. When the switches 1230 or 1232 are on, a fraction of the beam 1212 is switched into the output beams 1220 or 1221, respectively. The remainder of the input beam propagates along a continuation of the input waveguide into an output path as beam 1250, which may be used in some other component or brought into a beam dump for absorption or scatter out of the system. When the switches 1234 or 1236 are on, a fraction of the beam 1214 is switched into the output beams 1220 or 1221, respectively. The remainder of the input beam propagates along a continuation of the input waveguide into an output path as beam 1252, which may be used in some other component or brought into a beam dump for absorption or scatter out of the system. It should be understood that the structures admit to bidirectional propagation.

The substrate 1248 is processed as described herein to produce the structures illustrated. When the switches are off, the input beams propagate through the switching regions (in which the waveguides may be configured as an asymmetric cross if desired), and emerge as output beams 1250 and 1252, respectively, possibly for use as inputs to additional switches. The waveguides may cross each other in simple large-angle junctions as shown, or the junctions may be asymmetric crosses, which do not substantially affect the placement of the gratings 1238, 1240, 1244, and 1246. Note that the gratings may in fact be parts of a single large grating which covers the substrate and which is only activated in the regions of the different switches by the desired electrodes. If the gratings are constructed from poled domains, for example, this allows the entire substrate to be poled for the gratings, which may be simpler in production. Alternatively, the gratings could be arranged in stripes or other groupings.

Additional input waveguides may also be provided, coupling into the waveguides 1226 or 1228 (or not coupled, as desired), in a modified repetition of this structure in the direction of the output beams 1220 and 1221. Additional output waveguides may also be provided, coupled if desired to the input waveguides 1222 and/or 1224, in a modified repetition of this structure in the direction of the beams 1250 and 1252.

Figure 39A:
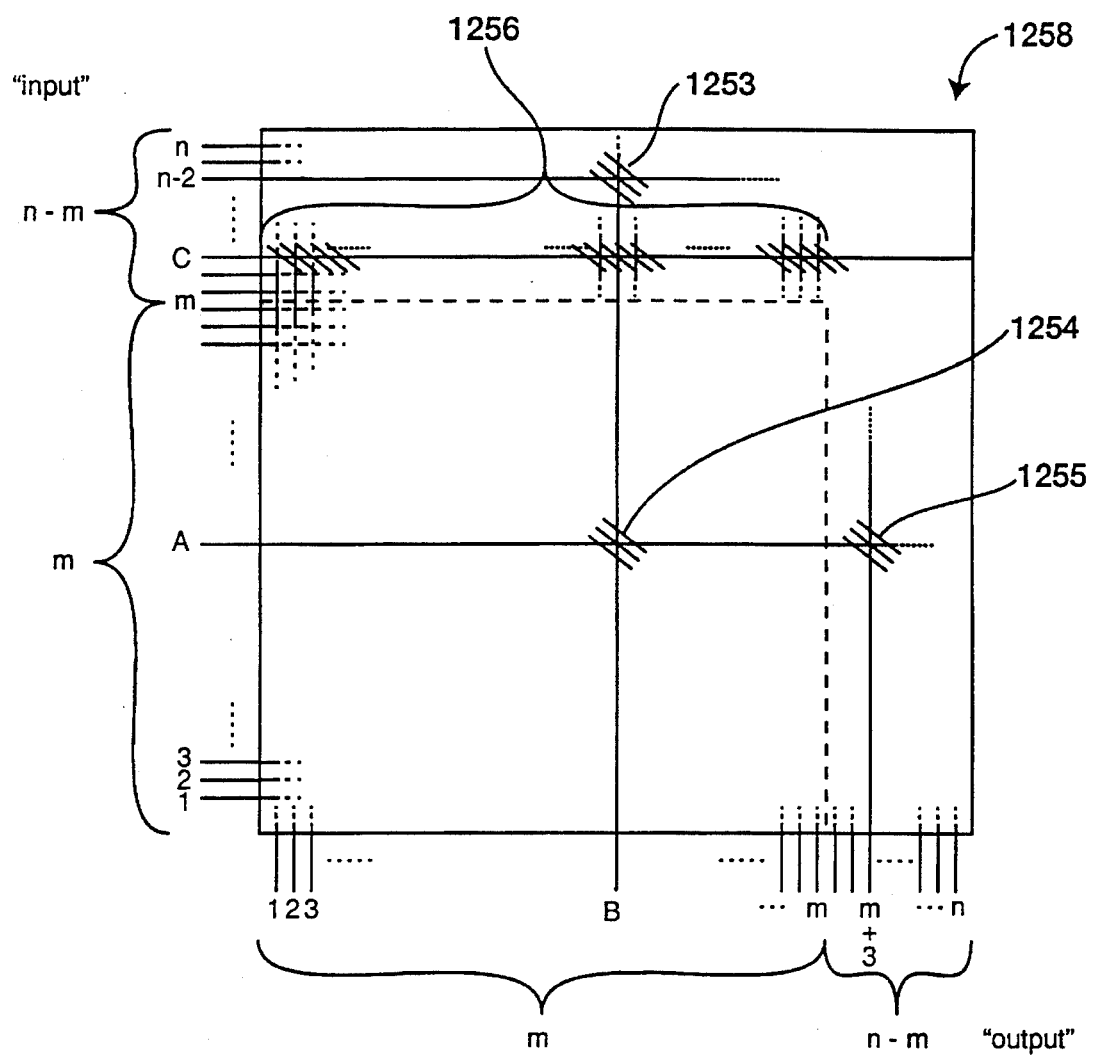
FIG. 39A is an embodiment of an m×m communications switch array with system control lines.

FIG. 39A shows schematically an example application of the alternative switch arrays in the n×n communications routing application. In this application, the optical power in n input optical channels is to be routed to n output optical channels with minimal loss and minimal crosstalk. A controller sets up an addressable path between one channel and another. A simple square array is formed by repeating the structure of FIG. 38 until n inputs are arrayed on the left and n outputs are arrayed on the bottom, with switches at all $n^2$ of the waveguide intersections. The intersection angle may be any convenient angle. In this structure, the switching of any channel into any other is accomplished by activating one of the switches. The light beams cross each other at the waveguide crosses with a small amount of crosstalk which can be reduced by optimizing the waveguide geometry. This structure is capable of independent one-to-one connections between any input and any output. Note also that the connections are bidirectional so that a communications channel can be used equally well, and in fact simultaneously, in both directions. The switches are shown as implemented with gratings for specificity, but they may be implemented with dual FIR switches as described in reference to FIG. 37 by replicating the structure of FIG. 37 forming the n×n inputs and outputs, or with any other optical switching technique now known or yet to be discovered. Note that in the case of the TIR switches, the optical data path does not pass through the vertex of the intersection between the input and the output waveguide. Instead, it passes through another waveguide near the intersection. According to the specific geometry of the switch, the input and output waveguides may intersect at a large angle as shown in FIGS. 37, 38 and 39, or at an oblique angle. The fixed reflectors 1088 and 1082 in the dual-TIR switching geometry may not be required in the case of the obliquely intersecting waveguides.

In this simple square geometry with n parallel input waveguides, there will be one input waveguide which can be connected into the closest output waveguide with a single switch, forming a best case connection with lowest loss. At the other extreme, there will be one waveguide which must traverse 2(n−1) waveguide crosses to be switched into the farthest output waveguide. This worst case connection will have much higher loss then the best case connection. To reduce the maximum insertion loss of the switch array structure, asymmetric cross junctions may be used as described in reference to FIG. 36. The loss of the worst case connection will be best helped with every waveguide cross it traverses being an asymmetric cross pointing in the direction of propagation of the light along either the input or the output waveguide. This structure is clearly not generalizable to the inner waveguides because use of asymmetric switches in the intermediate junctions will help some switching paths at the expense of others. What is needed is an algorithm for selecting the optimal direction for the asymmetric crosses. A good way to dispose the asymmetric crosses is for roughly half of the crosses to point in each direction. Observe that the n(n−1) crosses on the upper left of the diagonal (but not including the diagonal) are predominantly used to distribute energy to the right. These crosses therefore should point along the direction of the input waveguides, while the crosses on the lower right should point in the direction of the output waveguides. In a bidirectional structure, the crosses on the diagonal should be simple symmetric crosses, herein called the simple diagonal arrangement of the asymmetric crosses. Other arrangements may be used according to different usage patterns, but this is a good general purpose arrangement.

A n×m (where n>m) arrangement will permit full connectivity only between m "input" lines and m "output" lines. Here, "input" and "output" are only used for identification purposes since all lines are bidirectional. The additional n−m "system" lines may be useful for system control in both monitoring and broadcast functions. If line A wishes connection to line B, for example, it would send system requests for that function until answered. Line m+3, for example, might be dedicated to scanning all the "input" lines for system requests. (To provide a similar line to monitor the "output" lines, a larger matrix of lines is required, such as the n×n matrix shown in FIG. 39A where m lines are dedicated to users in a sub group of m×m lines. A line such as line n−2 may then be used to monitor the "output" lines.) In monitoring, the system will turn on successive gratings corresponding to the "input" or "output" lines, and detect whether the line is active. Some power will be switched into the monitor detector by the successively switched-on gratings in line with the monitor detector if any one of the monitored lines is active. An active line will have an activated reflector connecting it to another selected line. However, the activated reflector will leak some power through to form a beam which can be detected by the monitor detector. When the monitor detector connected to line m+3 in this example switches on the switch 1255 (drawn as a grating switch for specificity) and receives the request from line A, the control system will have to check whether line B is busy. When the connection is made to line n–2 through switch 1253, the residual beam which leaks past the line B connection switch will alert the system that line B is active. If no activity is sensed, a system request can be sent to both lines A and B (possibly through the same monitor line if it has multiplexed send/receive capability, or possibly through a separate system line), and the switch 1254 can be closed to establish the connection.

The broadcast function is not feasible from lines within the basic m×m switching block which is used for one-to-one connections, because even partially turning on the required row of switches corresponding to all the outputs from a given input would interfere with some of the already established and potentially active communications connections between other channels. Broadcast is best accomplished from the system lines which are "outside" of the m×m switching block illustrated in FIG. 39A. (The "inside corner" of the geometry is the best case waveguide connection with the lowest loss, between lines 1 on the "input" side and line 1 on the "output" side.) Line C is shown to be actively connected to most or all of the "output" lines in FIG. 39A by means of gratings 1256 as an example of broadcast. The switches 1256 on line C must be only partially turned on so that sufficient power is delivered to each "output" line. A similar protocol may be used to prevent collisions between channels in the case of broadcast as in the case of simple communications connection. Broadcast connections would only be set up with inactive channels, and the system can group channels together and/or wait for individual channels to permit broadcast to them.

To increase switching efficiency, the waveguides may be large multimode waveguides, which in the case of a single mode communications network will be connected to the single mode input and output ports 1 through m with adiabatic expanders described elsewhere herein.

The entire structure described above in reference to FIG. 39A is useful as an asynchronous transfer mode (ATM) switch, or in any point-to-point switched communications application. One useful variation of the structure is for multiple wavelength operation in a WDM network. Wavelength selective optical switches can be implemented as described herein by using poled grating switches, or by using tunable fixed gratings which tune into and out of a specified communications band. In a WDM network, the desire is to switch a specific wavelength between channels without affecting other wavelengths which may be travelling (bidirectionally) in the same channel. With a tunable switch which can select a frequency of reflection while essentially transmitting the other set of frequencies in the WDM spectrum, the simple geometry of FIG. 39A is appropriate. However, if a switched grating is used which has a single frequency of operation, separate connection paths are necessary for each wavelength.

Figure 39B:
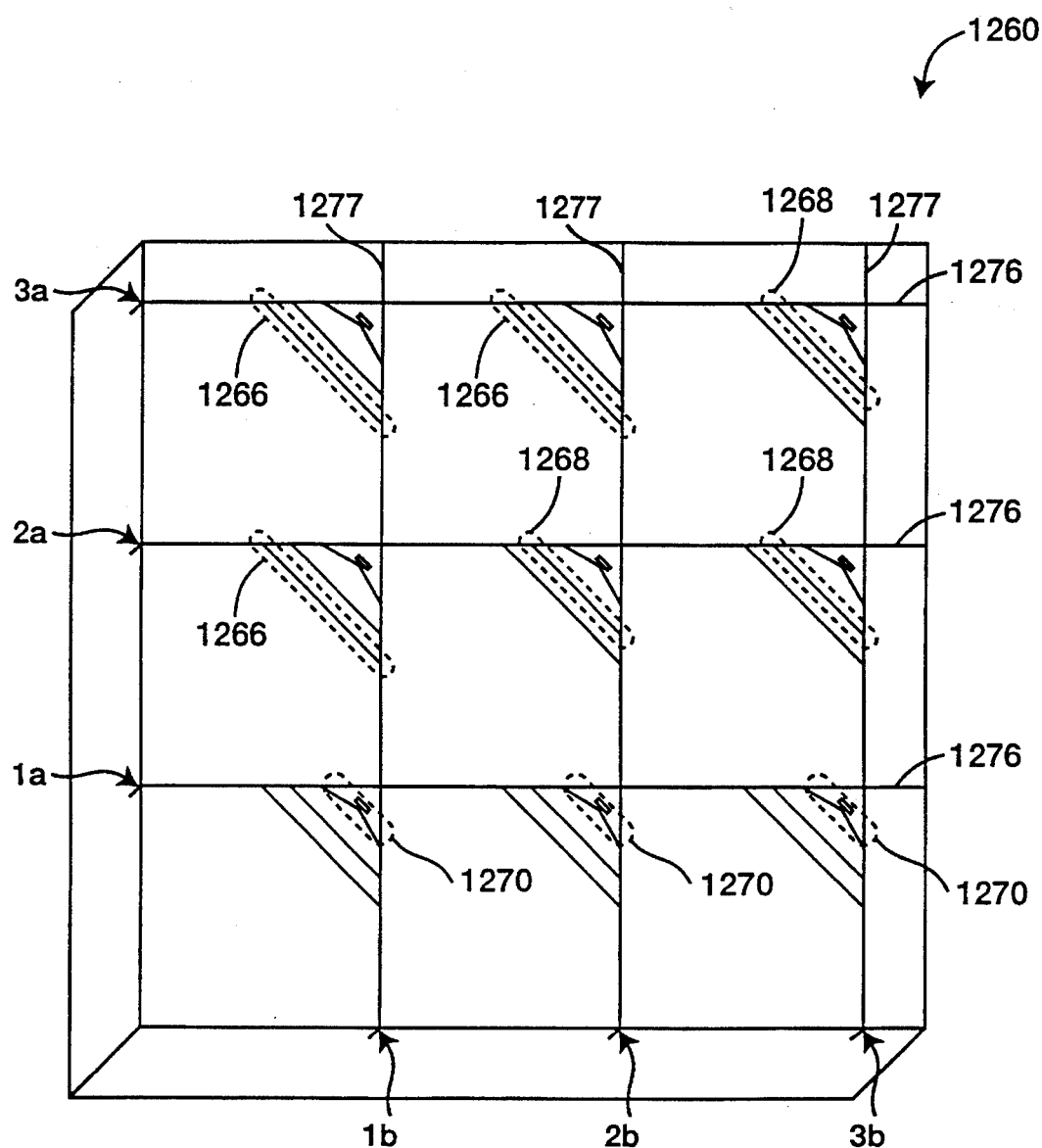
FIG. 39B is an embodiment of a 3×3 switch array with WDM capability.

FIG. 39B shows a switched WDM communications network 1260 with separate paths for each frequency used in the network. This example is for a two frequency WDM network, but may be generalized to any number of frequencies of communication. Three "input" waveguides 1276 are shown in FIG. 39B connected to three ports 1a, 2a, and 3a, and three output waveguides 1276 are shown connected to three ports 1b, 2b, and 3b. The waveguides form nine intersections. At each intersection, there are three additional optical paths connecting each "input" and each "output". The additional paths are identical in this example, and consist of three types. The first type 1266 of optical path consists of a pair of fixed frequency switched reflectors both capable of reflecting the first one of the two signal frequency bands of the WDM system. The reflectors are preferably gratings transverse of the "input" and the "output" waveguides associated with the intersection, and reflect power in the first frequency band between the corresponding waveguide and an additional waveguide segment connecting the two gratings. The second type 1268 of optical path consists of a second pair of fixed frequency switched reflectors both capable of reflecting the second one of the two signal frequency bands of the WDM system. Again, the reflectors are preferably gratings placed transverse of the respective waveguides and reflect power in the second frequency band between the corresponding waveguides and an additional waveguide segment connecting the second two gratings. The third type 1270 of optical path consists of a pair of frequency independent switched reflectors both capable of reflecting both signal frequency bands of the WDM system. This third type of optical path may be implemented as the pair of TIR reflectors connected by waveguides and fixed mirror (described in reference to FIG. 37).

In this case, ports 1a, 2a, 1b, and 2b plus the associated waveguides 1276, 1277 form a 2×2 switching network capable of switching two frequency channels simultaneously between any "input" port and any "output" port. System control ports 3a and 3b with associated waveguides 1276, 1277 provide monitoring and system communication functions. If the first frequency of the WDM system is desired to be switched between port 2a and 1b, for example, the two switches associated with the optical path of type 1266 at the intersection of the waveguides connecting to ports 2a and 1b are turned on, routing optical power at the first frequency between ports 2a and 1b through the waveguide connecting the two switches. If all frequencies associated with a given port are to be routed into another port, the switches and optical path of type 1270 are turned on at the intersection corresponding to the two ports. The optical paths 1270 are really superfluous in a 2×2 network because to switch both WDM frequencies between any two channels, both corresponding paths 1266 and 1268 may be activated. However, in a high order communications network with many WDM frequencies, a single all-frequency connection is desirable since it will have the lowest loss.

Figure 40:
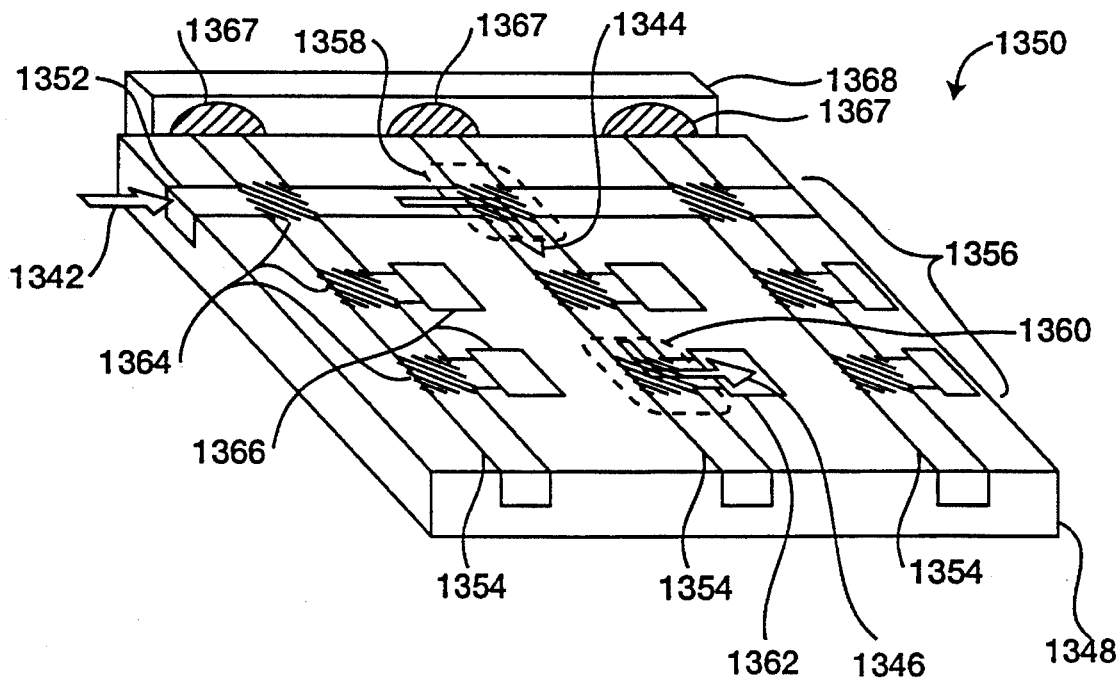
FIG. 40 is an embodiment of a two dimensional switching array with pixel elements.

FIG. 40 shows a two dimensional one-to-many routing structure. A first row of waveguide routing switches connects optical power from an input waveguide into columns of pixel waveguides. Again, no details of the switches are shown; they are shown schematically only as gratings, but may be implemented in several different ways. A two dimensional array of "pixel" switches routes power out of the pixel waveguides at "pixel locations". (What happens to this power at the pixel locations depends on the application.) Two levels of switching are used to reach all the pixels. This structure may be used for display, to actuate or control processes or devices, or to read certain types of data. In the latter case the direction of the power flow is reversed, and the device operates as a many-to-one routing structure.

An input optical beam 1342 propagates in an input waveguide 1352 and is coupled into one of many pixel waveguides 1354 by one of a two dimensional array 1356 of switching elements. The switching elements 1364 may be implemented as grating switches as described above in reference to FIGS. 7, 8, 12, 13, and 38, or they may be TIR switches as described in reference to FIGS. 30–32 and 37, or they may be any other switchable element. The beam 1344 is shown being switched by switch element 1358 into a pixel waveguide whereupon it is switched for a second time by switch element 1360, forming beam 1346 which propagates into the pixel element 1362. The pixel elements 1366 may be separated from the waveguides 1354 by waveguide segments as shown, or they may abut the waveguides at a short distance so that little of the switched light passes by the pixel elements.

In the case of the display application, the pixel elements may be for producing emission of the light 1346 out of the plane of the substrate 1348. The pixel elements may then be roughened patches on the surface of the substrate 1348, or angled micromirrors, or roughened angled micromirrors for light diffusion, or phosphor-filled pits, or other means of producing visible light. In the case of the display, the input beam 1342 may contain several colors, in which case the waveguides are capable of guiding all of the colors and the switches are capable of coupling all of the colors. The waveguide switches are scanned in a sequence to produce the image of the display. A grating switch is implemented as a multiple period grating, but the TIR switch needs little modification for this purpose. The waveguides, if single mode, must effectively guide the shortest wavelength beam. The input beam 1342 is preferably modulated externally (including all its color components) so that the switching elements are simple on-off devices. Note that a single row electrode may be disposed across the columns of waveguides to actuate a row of pixel switches if the pixel elements are arranged in a more-or-less straight line and are connectable electrically along a row.

In the case of a projection display, a additional lens structure is required to collect the light emitted by all the pixels in the array and refocus them on a screen at a (large) distance from the lens. The lens should preferably have a good off axis performance so that the focal plane is reasonably flat at the screen, and it should have a large enough numerical aperture (NA) to collect most of the light emitted by the pixel array. It would be advantageous to couple a lens array to the pixel structure to reduce the divergence of the beams produced by the individual lenses, reducing the (costly) NA requirement on the projection lens. Another way to achieve this is again to taper the waveguides to the largest possible size at the pixel. It is relatively easy to taper the pixels to a large transverse size, but difficult to obtain a very deep waveguide. Large pixels may be made by coupling a wide waveguide with a long grating coupler.

The light distributed in the routing structure may also be used to activate processes, as for example in the case of a DNA reader or an allergy reader, or a protein reader. In each of these specific cases, a separate array of DNA or allergens or proteins is prepared with fluorescent tags which can be excited by the light. One type of molecule or one preparation of molecules may be arranged for excitation over each pixel. The light is scanned electronically among the different pixels, and the speed and order of the scanning may be determined according to the results. The fluorescence may be collected for detection by an external lens and detector. However, for some applications, it is advantageous for the pixel (and its lens) and waveguide structure itself to collect and guide the emitted radiation to an optical energy detection means as well as to control the emission of the source light. Depending on the desired light illumination and collection geometry, the lens may be a collimating lens, a refocussing lens, or even, conceivably a lens to produce a diverging beam. A collimating lens is separated from the end of the waveguide by the focal length of the lens so that the transmitted (and collected) beam is essentially parallel. Collimating lenses are most useful if there is a large volume of material to be traversed by the interrogating light beam. A refocussing lens is separated from the end of the waveguide by the object distance, the inverse of which is related to the difference between the inverse of the image distance and the inverse of the focal length, where the image distance is the distance from the lens to the desired image beam spot. The refocussing lens is used if it is desired to concentrate the sample into a small spot and to illuminate and/or read it from a waveguide. A diverging beam is created by a lens separated by less than its focal length from the end of the waveguide. The output beam from a simple lens is not necessarily round if the divergences of the wave approaching the lens are different in the two planes. The simplest way to make a beam round (for minimum spot area after refocussing) is to start with a round beam at the end of the waveguide, which may be accomplished by design in the waveguide, or by tapering the waveguide. The lens preferably has the appropriate numerical aperture to admit the entire wave from the waveguide and focus it to a diffraction limited spot or collimated beam according to the application.

The pixel element 1362 may be any of the elements mentioned above in this case, and it may be associated directly with the material to be activated, or indirectly as by alignment with an external plate to which the material has been conjugated. Each pixel element may contain a lens aligned as described above so that a switch array may be coupled with a lens array with the image beam spots in a substantially common plane of focus. (Substantially common, in this case, means within a Rayleigh range or so of the true plane of focus, which may be quite distorted due to aberration. Use of a type of reflector instead of a diffuser in the pixel element 1362 is preferred if the routing structure is also used to detect the fluorescent emission: the reflector couples the emission back into the waveguide whence it came. This coupling is maintained for as long as the switches for a given pixel are activated. If desired, the light source may be switched off prior to switching to another pixel element in order to resolve the decay of the emission.

Used as a data reader, the sense of the light propagation is reversed from that illustrated in FIG. 40. Light from a device containing data is collected at the pixel elements and coupled into the routing waveguide structure which guides it back out the input waveguide 1352. Connected to the waveguide 1352 is a detector to read the data. The detector may be simultaneously connected to the waveguide via a beamsplitter between the waveguide 1352 and the light source used for illumination of the data media. The pixel elements 1366 (or simply "pixels") are preferably coupled with the data spots via lenses to collect the light routed through the structure 1350 and direct it to the data medium. The lens coupling also serves for collecting reflected or otherwise emitted light from the data medium and refocussing it on the end of the waveguide coupled to the pixel element. The data may be in a target volume, in which case the lens may be configured to collimate the light beam 1346. The data may be on a target surface, in which case the different pixel elements may correspond to different tracks on the rotating disk of a magneto-optical data storage surface, for example, or of a CD. The lens is configured to refocus the light from the pixel to the data spot in a diffraction limited way. By associating the different pixels with different tracks, track-to-track switching may be accomplished electronically with essentially no delay time.

The different pixels may also be coupled to different planes on the data medium. This is useful for reading data which have been recorded in multiple planes on the medium, to increase total storage capacity. Switching between the planes may also be accomplished electronically by switching among pixels coupled to the different planes.

In addition, several different pixel elements may be focussed to locations separated by a fraction of the track separation transverse of (preferably normal to) a given track. When the track wanders, positive tracking may be accomplished electronically by switching between pixels, instead of mechanically. A sensor and electronics is needed to detect track wander, and a controller for switching to the desired pixels. The signal strength or the signal to noise ratio (SNR) may be detected in the different channels to determine the preferred (best aligned) channel. If the switches along the waveguide 1352 are configured as 4-way crosses instead of 3-way, with the fourth leg emerging at the edge of the substrate, a detector array 1368 may be placed in registration with the fourth legs, with individual detectors 1367 individually aligned with the columns for detecting the return power from each column. The optimal reflectivity for the gratings which lie along the waveguide 1352 is approximately 50% if the detectors 1367 are used, in order to maximize the return power from the data media on the detector array 1368. If a single beamsplitter is disposed in the waveguide 1352 upstream of the router structure, its optimal reflection is also 50%.

Note that partial excitation of the different pixels can be achieved by partial excitation of the switches along either the input waveguide or the pixel waveguides. The switching elements 1364 can be adjusted by means of the applied electric field to vary their reflection coefficient. Some of the beam may be transmitted through the desired partially-excited switches for use in a second pixel simultaneously. Multiple pixel excitation is of particular interest in the case of track wander correction, since multiple detectors may also be configured in the router 1350. For example, if three different pixels on three different columns of the routing structure 1350 are to be simultaneously excited their corresponding pixel column switches will need to be partially excited. A computation is required of the controller to determine the appropriate excitation of the multiple switches. Neglecting losses at the switches, to produce equal intensities on their respective detectors for optimal SNR, the first switch corresponding to the first pixel column should be excited to reflect about $3/16$ of the incident light, the second switch corresponding to the second pixel column should be excited to reflect about $1/4$ of the remaining light which has passed through the first switch, and the last switch corresponding to the third pixel column should be excited to reflect about $1/2$ of the remaining light which has passed through the previous two switches. About 15% of the incident beam is reflected into each detector, assuming 100% reflection from the medium and 100% light collection efficiencies. This result is quite good compared with the optimal 25% of the beam which is received on a single detector in the case of a single pixel (optimum switch excitation=50% reflectivity). Indeed, more total photons are collected with three beams than with only one. Electronic tracking will result in cheaper, faster, and more reliable data read/write devices.

Any combination of these approaches (electronic track switching, electronic data plane switching, and electronic tracking) may be taken to increase the performance of a data storage device. A means is also needed to accomplish variable focussing electronically, potentially removing all mechanical motion (except for rotation of the media) from the drive. As described below in reference to FIG. 54, electronically variable focussing may be accomplished with a zone-plate lens by changing the wavelength of the light beam 1342.

As drawn, the routing structure of FIG. 40 is a polarizing structure, with the 90° grating switches reflecting only the TM mode. As a result, only beamsplitting based on intensity can be used. It would be quite advantageous to be able to use polarizing beamsplitters because this would result in a factor of four increase in the signal strength for a given light intensity. However, a switching structure capable of transporting and then separating the two polarizations is required. Although the polarization dependence of the TIR switches may be made negligible at a sufficiently grazing TIR angle (well below the angle for total internal reflection for the TE mode), there is a packing density penalty in using very low angle switching geometries.

Figure 41:
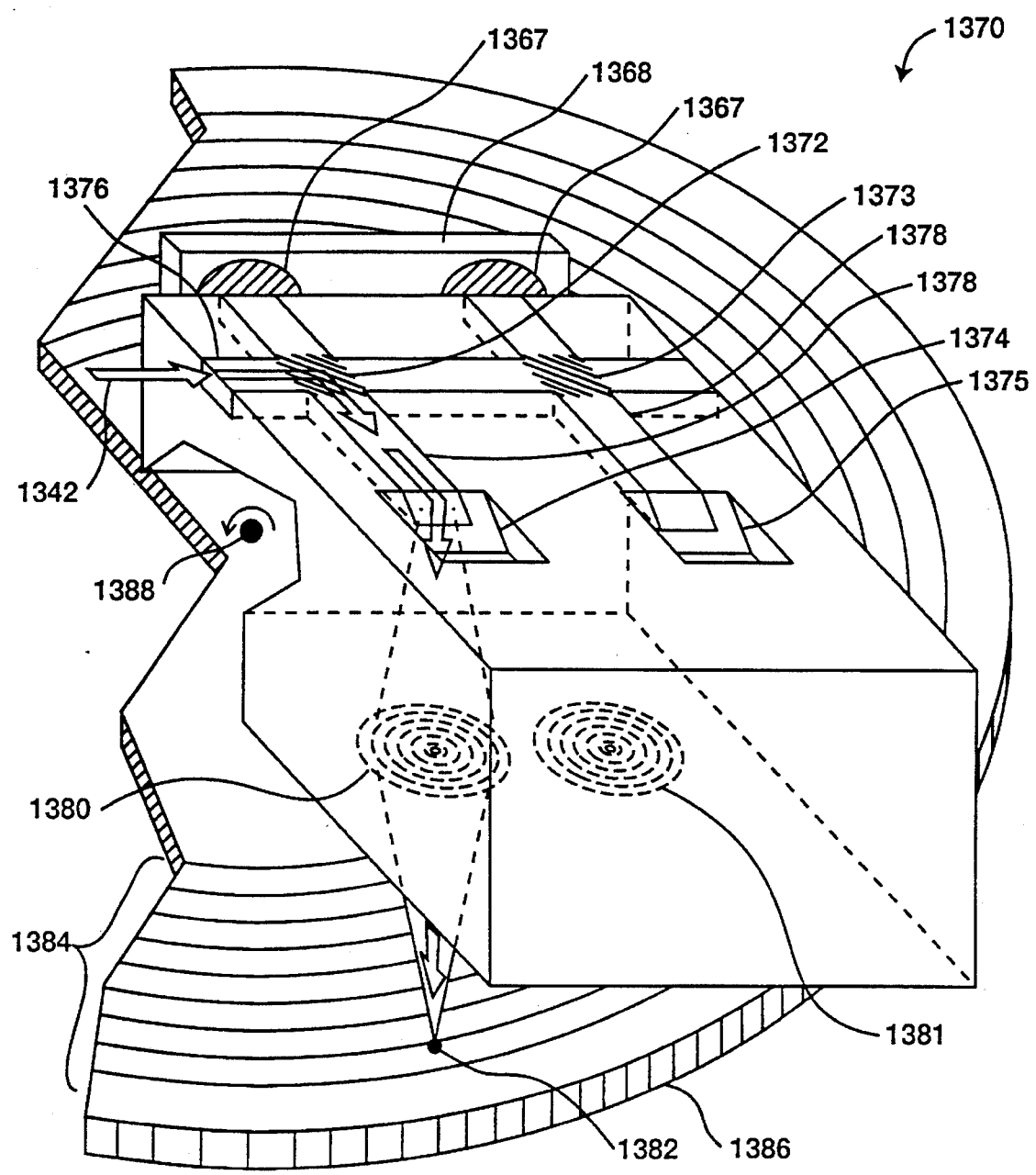
FIG. 41 is an embodiment of a one dimensional switching array with pixel elements coupled to data tracks.

FIG. 41 shows a linear array of strongly polarization dependent switches arranged as a data reader 1370. The switches are excited with a beam 1342 which is TM polarized and highly reflected in the activated switch 1372. Waveguides 1376 and 1378 such as titanium indiffused waveguides in lithium niobate are used which guide both polarizations. The pixel elements are implemented as micromirrors 1374 combined with integrated lenses 1380 and data spots e.g. 1382 arranged in tracks 1384 on a disk 1386 rotating about the axis 1388. The orthogonally polarized light which is reflected from birefringent data spots (or separators) on the data track is collected by the lens 1380, refocussed back to the waveguide 1378, and reflected by the micromirror back into the plane of the guides with TE polarization. Because the TE mode is both polarized at Brewster's angle for the grating and has different propagation constant not phase matched for reflection, it propagates through the switch without reflection into the detector 1367 of the detector array 1368. (Alternately, if the switch is a TIR switch, the reflectivity is much less for the TE wave than the TM wave, and a large portion of the TE wave transmits through the switch an impinges on the detector.) If another switch 1373 is actuated instead of the switch 1372, the beam will propagate to a different pixel 1375 and be focussed according to the alignment of the pixel 1375 and its microlens 1381 either into another data track, or to another data plane, or to the same track but with a transverse deviation of a fraction of a track width (according to whether the pixel 1375 is for track switching, data plane switching, or tracking control).

Many variations are apparent on the structures described in reference to FIGS. 40 and 41, such as that any of the switches in the router may be oriented differently to change directions of optical propagation in the plane, that multiple types of switches may be used in a single device, and that higher levels of switching may be added. Additional variations are too numerous to mention.

Figure 42:
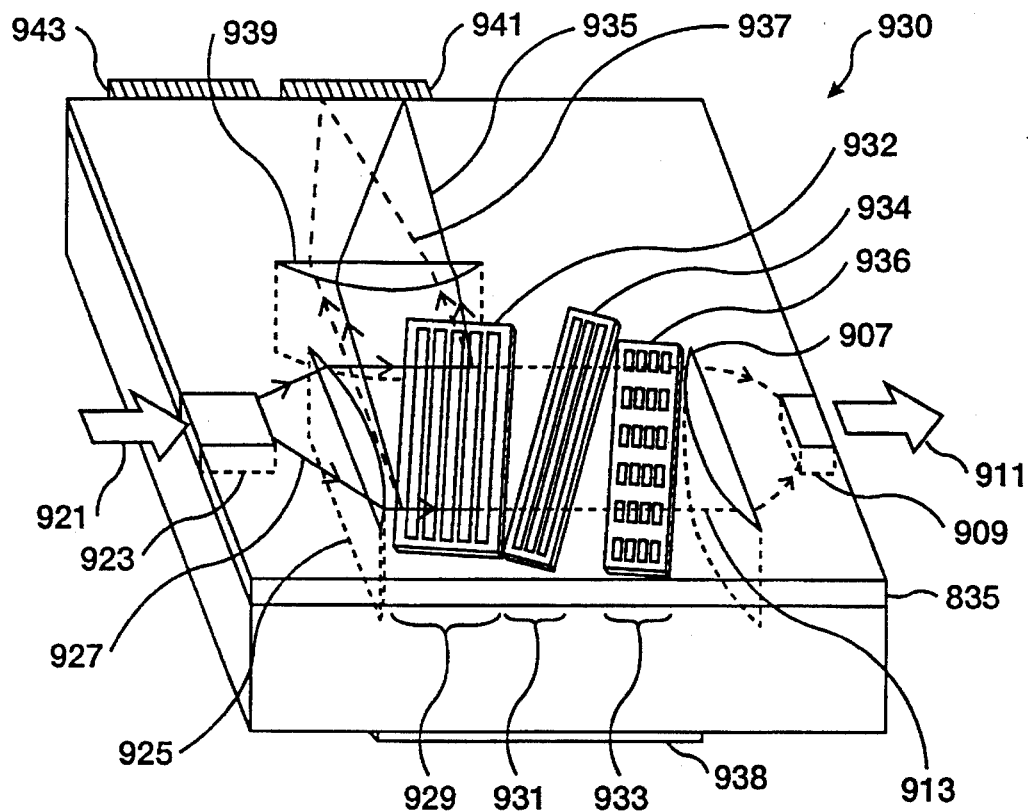
FIG. 42 is an embodiment of a switchable spectrum analyzer using selectable grating reflector sections and a detector array.

FIG. 42 shows a switchable integrated spectrum analyzer 930. The input beam 921 enters the input waveguide 923 which stops after a certain distance. The input beam 921 may be propagating in another waveguide or it may be a free space beam which is preferably aligned and mode matched to optimize the power into the waveguide 923. The device 930 is provided with a planar waveguide 835 which constrains propagation within the plane. The light beam 927 emerging from the end of the input waveguide diverges in one plane within the planar waveguide until it passes through the integrated lens element 925. The integrated lens has an elevated index of refraction relative to the planar waveguide within a boundary defining an optical thickness that reduces approximately quadratically from the optical axis. (Or if it has a depressed index, the optical thickness increases approximately quadratically.) The lens may be fabricated by masked indiffusion or ion exchange, or it may be a reverse poled segment excited by electrodes.

The lens 925 collimates the light beam which then passes to at least one of three grating sections 929, 931, and 933. The gratings are formed from individual cells, each cell being a domain, the domains being distinguished from the background material and separated by varying amounts according to the application. The cells have a permanent or adjustable index of refraction difference from the substrate, and different cells may be of different domain types. The permanent domain types include, for example, indiffused regions, ion exchanged regions, etched regions, radiation bombarded regions, and in general, regions formed by any type of index of refraction modifying process. The grating sections may be fabricated by etching, ion exchange, or indiffusion, in which case the gratings are permanent, but they are shown in the preferred embodiment fabricated from poled domains. Electrodes 932, 934, and 936 are used to individually excite the gratings in combination with the common electrode 938. The common electrode 938 may be placed on the opposite side of the substrate as shown for simplicity, or surrounding the electrodes 932, 934, and 936 for low voltage excitation.

The cells in an individual grating may be arranged in alternate ways to form the desired periodicity in the desired direction to supply virtual photons with the required momenta. They may be arranged in rows to define certain planes with a virtual photon momentum normal to the planes with momentum defined by the spacing of the rows. In this case, there will also be virtual photons with momentum along the planes with momentum defined by the spacing of the cells in the rows. To phasematch retroreflection, the momentum of the virtual photon is exactly twice the momentum of the incident photons, and is directed in the opposite direction. Any other reflection process has a smaller momentum and is directed transverse of the incident axis. The period $\Lambda$ of the row spacing is therefore fractionally related to the incident wavelength $\lambda$ in that $\Lambda$ is a fraction of the quantity $\lambda/2n_{eff}$. In a general case, the cells may be separated by a distribution of distances which varies with position through the grating so that the virtual photon momentum along any axis of incidence is determined by the spatial frequency spectrum (determined through the Fourier transform) of the cell distribution along that axis.

At least one of the gratings 929, 931, or 933 is turned on by adjusting the potential state of the corresponding electrode. In FIG. 42, grating 929 is shown activated. The activated grating contributes virtual photons to the incident photons, phase matching the scattering process into an output direction forming a plurality of output beams 935 and 937 with different wavelengths, the output beam being separated in angle according to their wavelength. The output beams from the activated grating 929 pass through the lens 939 which refocusses the output beams onto a detector array 941. The detector array is a group of sensors disposed to receive a portion of the output beams for detection, and are preferably bonded to an edge of the device 930 as shown. However, if it is desired to integrate the device 930 onto a larger substrate, it may not be desirable to have an edge of the substrate in this location. In this case, other beam extraction methods (such as vertical deflecting mirrors) can be used to deflect a portion of the beams 935 and 937 into the detector array. The sensing means is placed approximately within about one Rayleigh range of the focal plane of the output lens 939. In this position, the input beam angles are mapped into output beam positions. Since the gratings map input wavelength into output beam angles, a collimated input beam results in different input wavelengths being mapped into different positions in the focal plane, with spatial resolution of the wavelength spectrum depending on the characteristics of the grating. The detected power as a function of the location of the detector in the array 941 is related to the frequency power spectrum of the input beam 921. The device 930 is therefore a spectrum analyzer. It is also a multichannel detector if the input beam is divided into channels occupying several displaced frequency channels, and the device is configured to disperse the channels into predetermined detectors or groups of detectors.

By switching on different gratings, the device can be reconfigured to function in different frequency ranges. For example, if grating 931 or 933 is activated, the dispersed light is focussed by lens 939 onto either a different detector array 943 or a different portion of an extended detector array 941. The frequency range of the gratings is determined by the angle of the grating to the beam, and the periodicities of the grating. Grating 931 is shown to have a shallower angle to the beam so that a higher optical frequency range is selected when it is activated. Grating 933 has multiple periodicities transverse to each other so that multiple overlapping frequency ranges can be selected. Multiple frequencies may be mapped into poled region boundaries as described above in reference to FIG. 18. The poled elements of the grating 933 may be arranged generally in planes oriented normal to the two principle virtual photon momentum directions. The phasing of the planes is determined by the process for transcribing the component frequencies of the desired grating into domain boundaries. However, the general grating may have momentum components in all directions, in which case the resulting domain boundaries may not organize into planes except possibly in a prinicpal direction.

A transmitted beam 913 is refocussed by integrated lens 907 into an output waveguide segment 909 to form the output beam 911 which contains at least a portion of the out of band portions of the input beam 921 which did not interact with the gratings.

A useful variation of the switched range spectrum analyzer combines elements of FIGS. 42 and 30–35. The basic idea stems from the fact that the spectral range of a grating can be shifted by changing its angle, or equivalently the source point. In this variation, a waveguide routing structure is used to allow the source point to be switched. Waveguide switches are placed on the input waveguide 923 (and possibly on the emanating waveguides) at one or more locations, producing an array of parallel source waveguides among which the input light beam 921 is switchable. The waveguides all end in the same plane, preferably the focal plane of the input lens 925. The remainder of the spectrum analyzer remains the same, although with multiple inputs it may not be necessary to have the additional gratings 931 and 933. The separation of the multiple switched input waveguides is adjusted according to the application to achieve the desired switchable spectral ranges for the analyzer 930.

Figure 43:
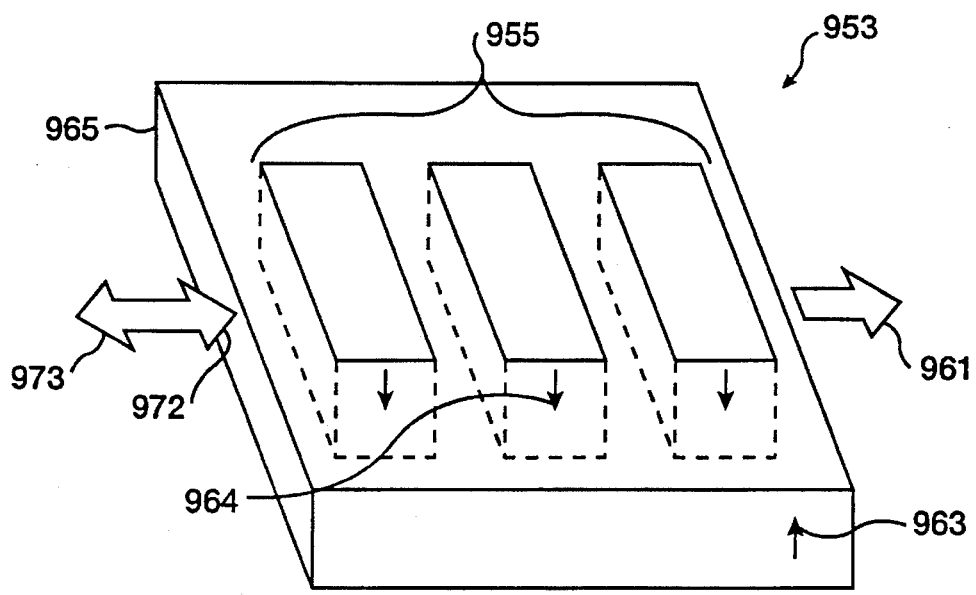
FIG. 43 is an illustration of a poled acoustic multilayer interferometric structure.

FIG. 43 shows a poled acoustic multilayer interferometric structure 953. The incident acoustic wave 972 may be a bulk or a surface acoustic wave. A poled structure is fabricated in the region 955 of a piezoelectric substrate 965, containing two types of domains 963 and 964. It is known (e.g. U.S. Pat. No. 4,410,823 Miller et al.) that polarity reversals result in partial acoustic wave reflection. The reflection into beam 973 and the transmission into beam 961 is affected by the spacing of the interfaces between the poled regions. If high reflection and low transmission is desired, adjacent interfaces should be spaced by a distance equal to an integral multiple of half an acoustic wavelength. If high transmission is required through a structure, with low reflection, the spacing should be equal to a quarter of an acoustic wavelength plus any integral multiple of half a wavelength. By applying an appropriate number of poled regions near an interface where the acoustic impedance changes, an antireflection (AR) structure can be fabricated provided that the phases of the reflected waves are chosen to be out of phase with and the same amplitude as the reflected wave from the interface.

Figure 44:
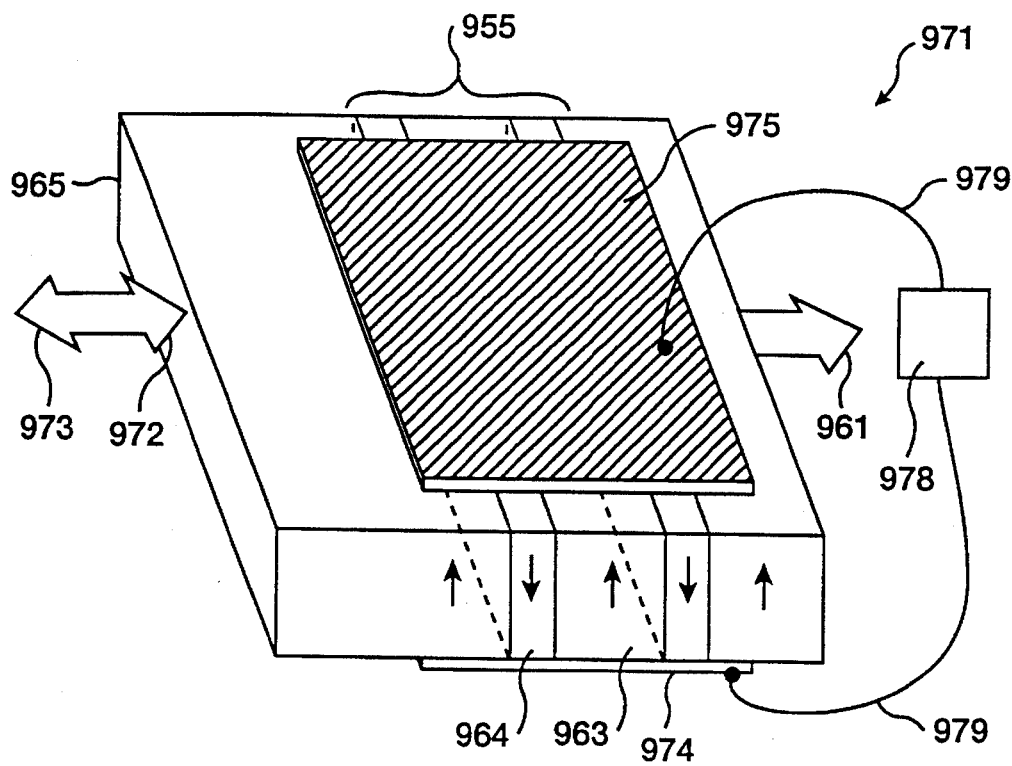
FIG. 44 is an illustration of a poled acoustic transducer.

FIG. 44 shows a poled bulk acoustic transducer 971. An input acoustic beam 972 is incident on a poled region of a piezoelectric substrate 965 containing a pair of electrodes 974 and 975. The poled region contains two types of domains 963 and 964 which are optimally reversed domains. The electric field induced by the acoustic wave in each of the poled regions can be selected to be identical by reversing the poling direction every half acoustic wavelength. In this case, a single electrode may be used to pick up the induced voltage instead of the prior art interdigitated electrodes. The electrodes 974 and 975 are used to detect the presence of the input wave 972. The output voltage, tapped by conductors 979 and seen in the electronic controller 978, varies sinusoidally (for a narrowband input) as a function of time with an amplitude related to the amplitude of the acoustic wave. As discussed above, if the poled interface spacing is a half wavelength, the structure also acts as a high reflector, which may not be desirable in a given implementation. This characteristic may be eliminated by spacing the interfaces alternately at one quarter wavelength and three quarters of a wavelength as shown in FIG. 44. In this case, the structure is an antireflection coating, eliminating the undesired reflection. Since almost the entire acoustic wave penetrates into the poled structure, where its energy can be almost totally absorbed into the detection electronics, this structure 971 is an efficient tuned detector of acoustic energy. The bandwidth of the structure is inversely related to the number of acoustic periods that fit within the poled structure covered by the electrodes. The efficiency is related to the acoustic path length under the electrodes. The bandwidth and the efficiency of the detector are therefore related, and can be adjusted by changing the size of the detection region.

The structure 971 can also be used as an acoustic generator, essentially by running the process in reverse. A time dependent electrical signal is applied between the two electrodes at the frequency of the acoustic wave it is desired to excite. The piezoelectric coefficient of the substrate produces a periodic strain at the frequency of the acoustic wave, and a pair of waves are generated, one 961 propagating in the forward direction and one 973 in the reverse direction. A high efficiency unidirectional generator can be made if it is desired to generate only a single wave, by combining the devices 953 and 971, with 953 being configured as a total reflector for the undesired wave. If the total reflector is oriented at 90° to the undesired wave and the phase of the reflected wave is chosen to be in phase with the desired wave, the two waves will emerge in a single direction as essentially a single wave.

A variation of the structure of FIG. 44 is a strain-actuated optical interaction device. In this device, the poled regions 964 and 963 are actuated by a strain field, producing a change in the index of refraction through the photoelastic effect. Now the structure 975 is a strain-inducing pad which may be deposited onto the substrate material 965 at an elevated temperature so that the different coefficients of thermal expansion of the film and the substrate create a strain field at room temperature. The mechanical strain field, working through the photoelastic tensor, produces index changes in the substrate which change from domain to domain, again producing a substrate with patterned index of refraction which can be used as described elsewhere herein. Electric fields using the electro-optic effect can be combined with the photoelastic effect provided that the deposition process of the electrodes do not undesirably affect the desired strain field.

Figure 45:
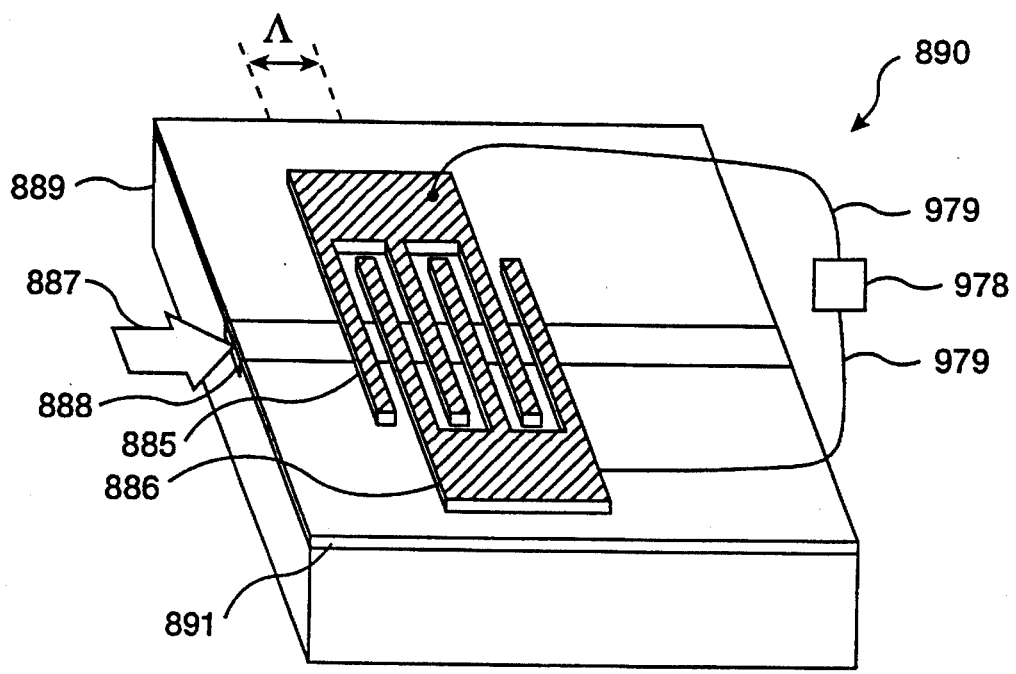
FIG. 45 is an embodiment of a tuned coherent detector of multi-frequency light waves.

The structure 890 of FIG. 45 is a tuned coherent detector of pairs of light waves. It is tuned in the sense that it will only sense frequency differences between light waves within a certain bandwidth about a desired central "resonant" frequency difference. In the simplest case, the device is configured with equal separations between interdigitated electrodes 885 and 886 which form a periodic structure with period $\Lambda$. At a given instant, the two input frequencies present in the input beam 887 produce an interference pattern of electric fields within the waveguide 888 with a spatial period which depends on the optical frequency difference and the index of refraction of the substrate 889 at the optical frequency. At a frequency difference where the spatial period of the interference pattern equals the period $\Lambda$, the electrode structure is on resonance, and the electrodes will be excited to a potential difference due to the induced displacement charge at the top of the waveguide.

The frequency response characteristic is related to a $\text{sinc}^2$ function with resonant frequency determined by the optical frequency difference at which two optical waves slip phase by $2\pi$ in a poled grating period. The buffer layer 891 is required to minimize the loss to the propagating optical waves when the electrode structure is laid down. It does not substantially reduce the strength of the induced potential if its thickness is much smaller than the period $\Lambda$. The interference pattern has a low frequency component which oscillates at the frequency difference between the two light waves. The electronic signal which is picked up by the electronic controller 978 via leads 979 therefore also oscillates at the difference frequency. The amplitude of the electronic signal is large at the resonance difference frequency, and falls off at other difference frequencies according to the bandwidth of the device, which is related to the inverse of the number of beat periods contained within the interdigitated electrode structure.

The interdigitated electrodes may alternately be configured with multiple frequency components so that there are several resonant frequencies, or so that the bandwidth of the response is modified. Note also that the device may be sensitive to multiple orders. If the electrodes are narrow compared to a half period, there will be a significant response at the odd harmonics of the resonant difference frequency. By shifting the fingers relative to each other so that there is asymmetry along the axis of the waveguide, a responsivity can be created to the even harmonics. This higher order response can only be improved at the expense of lowering the first order response. It can be minimized by centering the electrodes relative to each other, and by increasing their width. Finally, the waveguide 888 is not strictly necessary. It may be omitted, but the detected waves should be brought very close to the electrodes to optimize the signal pickup.

Figure 46:
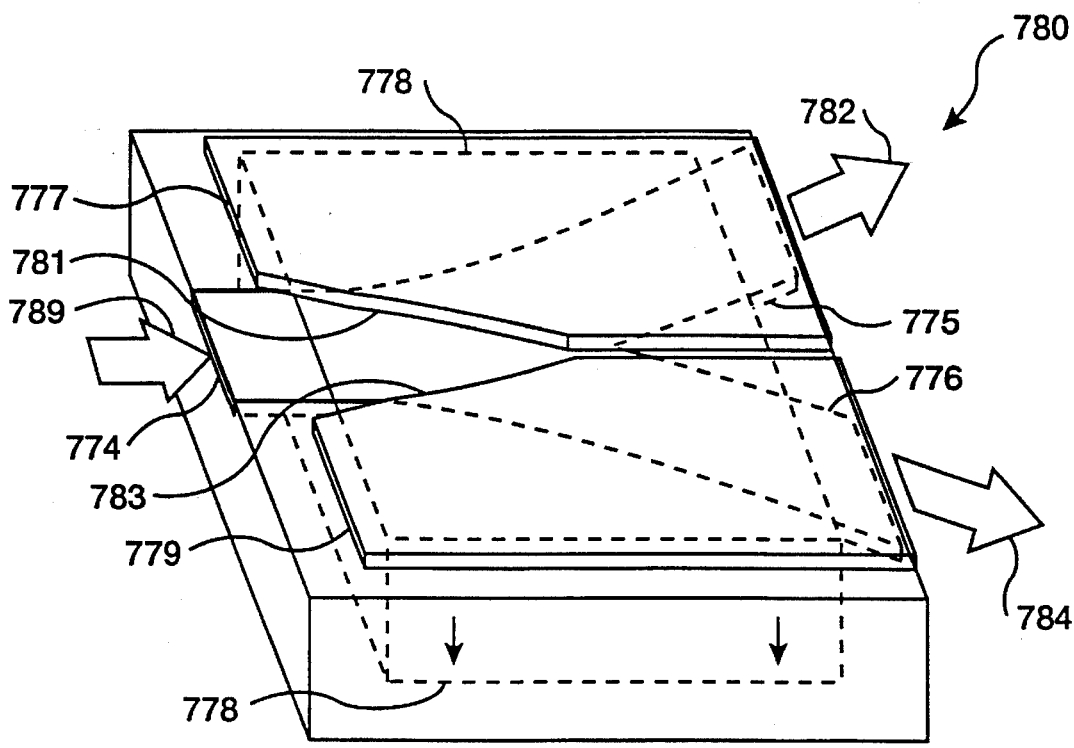
FIG. 46 is an embodiment of a low loss switchable waveguide splitter using a single poled region.

FIG. 46 shows a low loss switchable waveguide splitter 780. This device has a permanent wye waveguide splitter 774 consisting of an input waveguide segment widening into a wye junction and branching into two output waveguide segments 775 and 776 which are both optical path possibilities for light incident in the input segment. The widths and index profiles of the input and output segments are preferably equal. The splitter 780 also has a poled structure 778 which has an electro-optic coefficient within the region of the wye splitter 774. The poled region 778 may be a thin layer near the top of the substrate, which may have multiple layers, or it may extend throughout the substrate. The remainder of the substrate may be poled or unpoled. A pair of planar electrodes 777 and 779 are disposed adjacent to each other over the waveguides, with one electrode 777 covering a portion of one output waveguide 775, and the other electrode 779 covering a portion of the other output waveguide 776. The electrodes are planar only to the extent that this optimizes fabrication convenience and function: if the surface they are applied to is flat or curved, they conform. The edge 781 of the electrode 777 crosses the waveguide 775 at a very shallow angle, and forms a smooth continuation of the inside edge of the waveguide 776 at the wye junction. Likewise, the edge 783 of the electrode 779 crosses the waveguide 776 at a very shallow angle, and forms a smooth continuation of the inside edge of the waveguide 775 at the wye junction. When the electrodes are excited relative to each other with one polarity, the index of refraction under the electrode 777 is depressed and the index under the electrode 779 is increased. As a result, an excited region under the electrode edge 781 forms a waveguide boundary, steering the input beam 789 almost entirely into the output beam 784 with very little power leakage into the alternate output beam 782. The increased index under the electrode 779 aids in steering the optical energy away from the boundary 781. When the opposite polarity is applied between the electrodes, the input beam is steered almost entirely into the other output beam 782. If no voltage is applied, the input power is evenly divided into the two output ports if the structure is made symmetric. This structure is therefore a 3 dB splitter which can be electrically switched as a beam director into one of two directions with low loss.

The electrodes 777 and 779 are tapered away from the wye structure 774 at the input to the structure forming a gradual approach of the lower index region towards the waveguide to minimize optical losses. The smoothing effect of the electrostatic field distribution produces a very smooth index of refraction transition under both electrodes. The edge of the electrodes which crosses the output waveguides far from the wye branching region is preferably arranged at 90° to the waveguide to minimize losses.

The wye splitter may be arranged in an asymmetric way to produce a splitting ratio different from 3 dB with the fields off. This can be done by increasing the deviation angle for one of the waveguides and/or decreasing the angle for the other. The switching function operates almost as well with an asymmetric structure as with a symmetric structure, provided that a sufficiently large electric field is applied with the electrodes. The extinction ratio (the ratio between the power in the switched-on waveguide and the power in the switched-off waveguide) can remain very large despite a large asymmetry. However, the optical losses will be somewhat different in the two legs of an asymmetric switchable waveguide splitter. The device 780 may, therefore, be configured as a splitter with any desired splitting ratio, and still be switched with good efficiency and high extinction ratio.

This device may be cascaded to allow switching among more than two output waveguides. If, for instance, the output waveguide 775 is connected to the input of a second device similar to 780, its power may be passively or actively switched into an additional pair of waveguides. Sixteen switched output lines may be accomplished with four sets of one, two, four, and eight switches similar to 780. The power division ratio among these lines may be configured to be equal in the unswitched state, or any other power division ratio. When the switches are activated, a single output waveguide may be turned on, a single output waveguide may be turned off, or any combination of output waveguides may be turned on and off.

The direction of propagation of the light in the device may be reversed. In this case, an input on either one of the output ports 775 and 776 can be switched to emerge from the input port. In the absence of an applied voltage, the power at each output port is coupled into the input port with a given attenuation (3 dB in the case of a symmetric device). When the field is switched on, power in the "on" waveguide is connected into the input port with very low loss, while the power in the "off" waveguide is very effectively diffracted away from the input waveguide. The "off" waveguide is essentially isolated from the input port.

Alternatively, a mirror image device may be connected back-to-back with the switch 780 so that the input waveguides join together, forming a 2×2 switch or router. An input on either pair of waveguide ports may be switched into either waveguide of the other port pair. Again, cascading is possible, producing an n×n switch/router.

Figure 47:
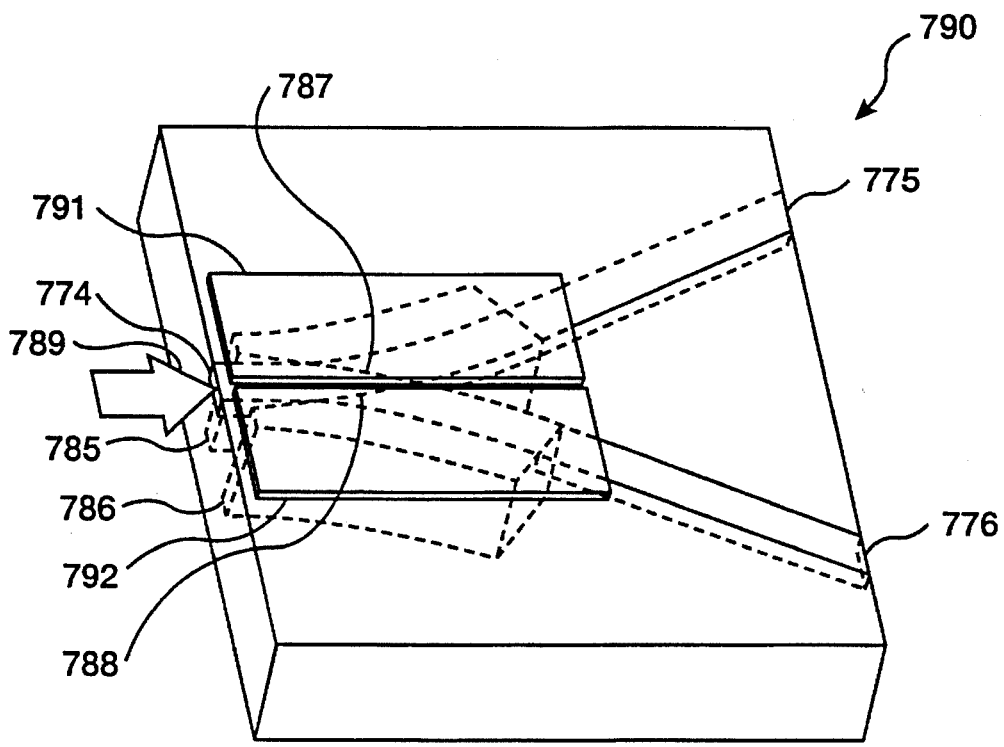
FIG. 47 is an embodiment of a low loss switchable waveguide splitter using multiple poled regions.

FIG. 47 shows an alternative realization 790 of a switchable waveguide splitter using multiple poled regions. In this configuration, the switched index difference along the boundaries of the waveguides in the wye region is enhanced, thereby confining better the optical mode into a narrower region, and reducing the residual coupling into the switched-off output waveguide. Two poled regions 785 and 786 are disposed on each side of the input waveguide 774 along the wye splitting region. The poled regions have boundaries 787 and 788 which cross the output waveguides 775 and 776 at a very shallow angle, and which form a smooth continuation of the inside edges of the waveguides 776 and 775 at the wye junction. The boundaries of the poled regions taper slowly away from the input waveguide to allow a slow onset of the electrically excited index change, and they cross the output waveguides at a large distance from the wye junction where the electric field is substantially reduced, in order to reduce the optical loss. Electrodes 791 and 792 are disposed substantially over the poled regions 785 and 786.

A potential difference is applied to the electrodes, exciting an electric field in an electrostatic pattern throughout the volume between and around them. The electric field penetrates the poled regions and the surrounding regions, inducing a corresponding pattern of optical index changes. The local optical index change is related to the product of the local electric field direction and the local electrooptic coefficient. The poled regions are preferably surrounded by regions of opposite polarity, in which case their electro-optic coefficient is of opposite sign to that of the surrounding regions. At the interfaces 787 and 788 there is a sharp change in the index of refraction. On one side of the waveguide, the index is reduced at the interface, producing a guiding tendency away from the low index region. The opposite is true of the other side. If the applied electric field is large enough, the interface with the reduced index forms a waveguide boundary. Since the guiding interface connects smoothly as an extension of the inside boundary of the output waveguide across from the poled region, the input light beam 789 is guided into that output waveguide. The light leak is low into the switched-off waveguide if the curvature of the guiding boundary is gradual. There is low loss at the input, because the poled regions approach the waveguide slowly. There is low loss at the wye junction, because the portions of the poled regions which extend beyond the junction depress the guiding effect of the switched-off output waveguide, and enhance the guiding of the switched-on output waveguide.

As an alternative, the poled regions could be surrounded by unpoled material. There is still an abrupt change in the index at the interfaces 787 and 788 so the device still functions, but the index change is only half the value obtained when the poled regions are surrounded with reverse poled material, so the applied field must be higher. The alternatives described before also apply to this device.

Figure 48:
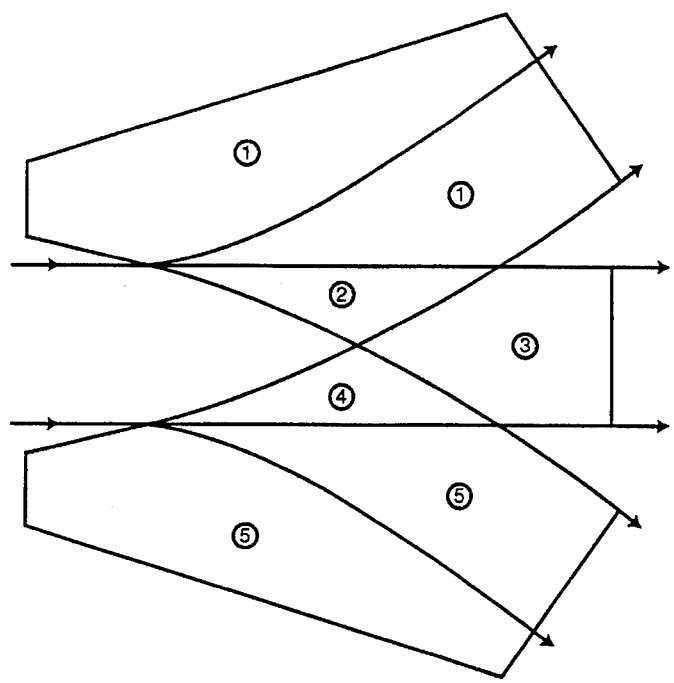
FIG. 48 is an illustration of the key design elements for a 1×3 waveguide splitter.

FIG. 48 shows the key design elements of a 1×3 switch. The design elements illustrated here show how to transform the device 780 of FIG. 46 into a 1×3 switch with a single poled region and patterned electrodes. The device contains a permanent branching waveguide with the desired number n (n=three) of output branches. The waveguide passes through a poled region which extends deeper than the waveguides (for good extinction ratio) and significantly beyond the junction region where the waveguides have become separated by a large amount (such as three times their width). Several zones are defined by the waveguide boundaries, by their smooth extensions back into the boundaries of the input waveguide, and by normal boundaries across the output waveguides at a distance significantly beyond the junction region. There are $(n^2+2n-2)/2$ zones so defined. It is useful to extend the outermost zone beyond the outside of the outermost waveguide as shown to taper the input. A separate electrode is placed over each of the regions with a small gap between all electrodes, but sufficient gap to avoid electrical breakdown when excited.

To operate the device, electric fields are independently applied to the zones with polarity determined by whether or not the corresponding zone is confined within the desired waveguide. For example, the five zones of FIG. 48 are excited according to Table I. As before, the magnitude of the electric field is adjusted to produce a good guiding boundary along the edges of adjacent zones excited at different polarities.

TABLE I

| Electrode Number | Top | Middle | Bottom |
| --- | --- | --- | --- |
| 1 | + | − | − |
| 2 | + | + | − |
| 3 | − | + | − |
| 4 | − | + | + |
| 5 | − | − | + |

Alternatively, the design elements of FIG. 48 also show how to transform the device 790 of FIG. 47 into a 1×3 switch with multiple poled regions. The device again contains a permanent branching waveguide with the desired number n (n=three) of output branches. Again, several zones are defined by the waveguide boundaries, by their smooth extensions back into the boundaries of the input waveguide, and by boundaries which cross the output waveguides at a distance significantly beyond the junction region. Again, it is useful to extend the outermost zone beyond the outside of the outermost waveguide as shown, in order to taper the input. Each zone is poled in the opposite direction to neighboring zones with a common zone boundary. Zones with the same poling direction may share at most a vertex. Preferably, the input waveguide region is poled oppositely to the innermost zones (i.e. the zones closest to the input waveguide). In FIG. 48 the innermost zones are labelled zones 2 and 4. This zone-based polarity selection procedure results in only zones 2 and 4 being reverse poled, while zones 1, 3, and 5, which are the output waveguide zones, are poled positive (in the same direction as the surrounding region, if the surrounding region is poled). If four output waveguides are used, there are nine zones, six of which are reverse poled, including all of the output waveguide zones. The splitter implementations which have an even number of output waveguides, therefore, have some advantage because only the even splitters have their output waveguide zones poled opposite to a potential substrate poling, with the attendant advantage of increased confinement at the final division point and higher transmission for the "on" states and better reverse isolation in the "off" states. A separate electrode is placed over each of the regions.

To operate the device, electric fields are independently applied to the zones, but now the rule for the polarity is different. The polarity is determined by two factors: whether or not the corresponding zone is contained within the desired waveguide, and the polarity of the poled region underneath. For example, if a positive polarity applied to a positively poled region produces an increase in the index of refraction, the following selection rules are followed: if a zone is poled positive, the electrical excitation polarity is selected to be positive if the zone is inside the desired waveguide and negative if the zone is outside; if a zone is reverse poled (negative), the polarity is selected to be negative if the zone is inside the desired waveguide, and positive if the zone is outside. In Table II are shown the optimal poling direction of the zones for the n=3 case with three output ports as shown in FIG. 48. The design of 1×n and n×n switches is derived by induction from the descriptions of the FIGS. 46, 47 and 48.

TABLE II

| Zone | Poling Direction | Top | Middle | Bottom |
| --- | --- | --- | --- | --- |
| 1 | − | − | + | + |
| 2 | + | + | + | − |
| 3 | − | + | − | + |
| 4 | + | − | + | + |
| 5 | − | + | + | − |

The planar components described herein may be stacked into multiple layer three dimensional structures containing electro-optically controlled devices and waveguide components. Stacks or three-dimensional constructions of planar waveguides and switches are fabricated by alternately layering or depositing electro-optically active, polable thin films, preferably polymers, and buffer isolation layers, which may be either insulating or electrically conducting. Advantages of stacked structures include better crosstalk isolation due to more widely spaced waveguide elements. Higher power handling capability is also achieved because more optical power can be distributed among the layers. Individual layers can be used if desired to distribute individual wavelengths in a display device.

Once deposited on a suitable substrate, poling of the active optical waveguide/switching layer is done using the techniques heretofore described. A buffer layer of lower index is necessary to isolate one active layer from adjacent layers, and is designed to establish the desired guiding in the dimension normal to the plane. Buffer layers of $SiO_2$, for example, may be used. Next comes a ground plane which can be fabricated from a metallic layer since it is isolated from the optically active layers, followed by a thick buffer layer. The buffer layers must also be capable of withstanding the applied voltages between the different layers of electrodes and ground planes. In polymers, a large area may be poled, and desired regions selectively de-poled by UV irradiation techniques as previously described in order to create waveguide features, even after a transparent buffer layer, such as $SiO_2$ has been applied. Or, poling can be performed electrically. With polymers, de-poling one layer by UV irradiation will not affect the layer behind it because of the shielding provided by the underlying metallic ground plane. Metal electrodes and conductive paths may then be laid down by standard masking and coating techniques, followed by another insulating buffer layer, and the next active layer. The buffer layer should be planarized to minimize the loss in the subsequent active optical waveguide/switching layer. This process of adding layers may be repeated as often as desired for a given device.

A variation in fabrication technique for making activation paths and electrodes for the poled device stacks is to coat the electro-optic layer with an insulating layer that is subsequently doped or infused to produce electrically conductive patterns within the buffer layer using standard lithographic masking techniques. Incorporating the electrodes into the buffer layer would serve to minimize the thickness of the stacked device.

Hybridized devices consisting of different electro-optically active materials could be used to ameliorate fabrication complexities. For example, the first electro-optically active layer containing waveguide devices could be fabricated in a $LiNbO_3$ substrate, which would also serve as the support substrate. Next a buffer layer and a layer of electrodes for the lithium niobate devices are deposited. Two insulating buffer layers sandwiching a conducting plane would then be coated onto the device prior to depositing the next active layer which could be a polable polymer. Subsequent layers are built up, poled and patterned as described earlier. The conducting planes in between buffer layers may serve both as electrodes to permit area poling of each polymer layer and to shield previous layers from the poling process.

Stacked waveguide arrays may be used, for example, as steering devices for free space beam manipulation. Electrically activated and individually addressable waveguide elements stacked closely together, and aligned with a source array form a controllable phased array for emitting optical radiation. The relative phases of the beams can be adjusted by varying the voltages on the poled zones as described previously. By adjusting these phases in a linear ramp, the emitted light from an array of waveguides can be swept in direction rapidly within the plane of the array. A linear array of devices on a plane can therefore sweep within the plane only. However, when poled waveguide array planes are vertically integrated into a three dimensional bulk device, optical beams emanating from the device may be directed in two dimensions.

An extension of this concept is the mode control of multimode laser bar arrays using a stack of waveguide grating reflectors. The waveguide stack is dimensionally matched to butt-couple to a laser diode array. By controlling the phase of the individual elements, the emission mode pattern of a multi element laser bar can be controlled. In devices where single mode waveguide confinement is not necessary, multimode or bulk arrays may also be stacked, for example, to increase the power handling capacity of a switched poled device.

Figure 49:
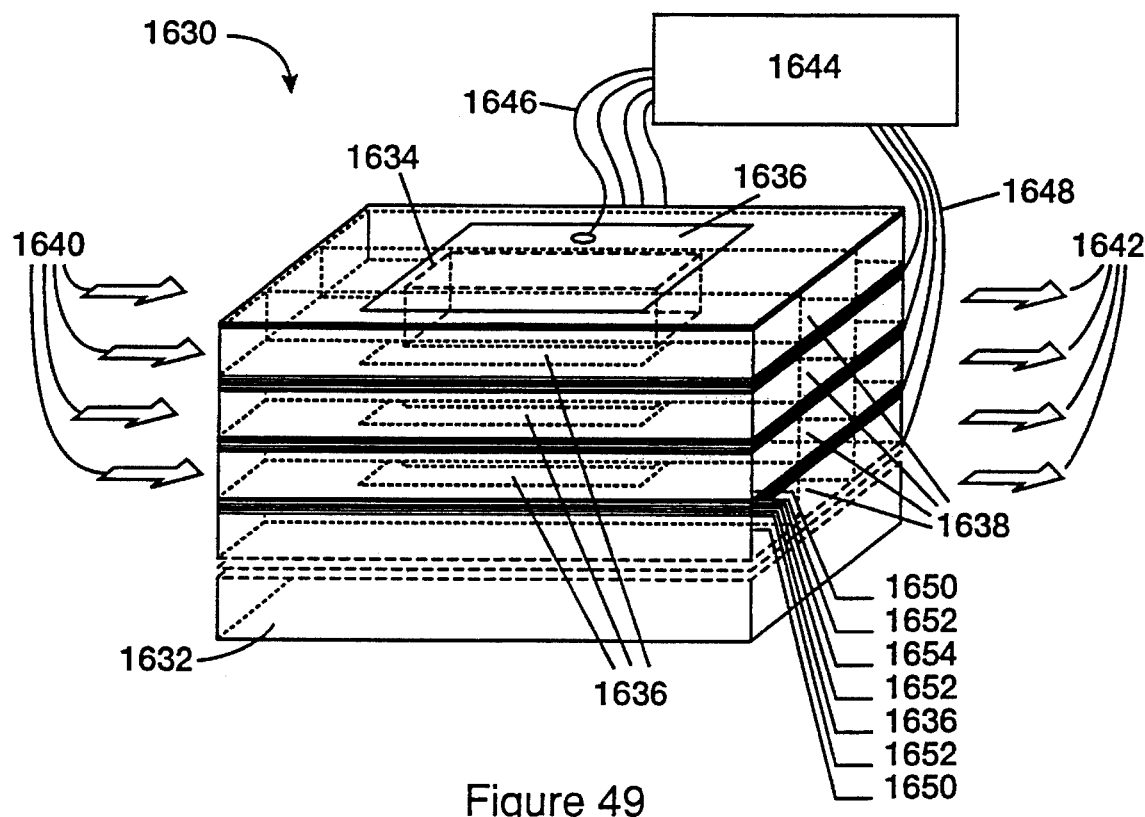
FIG. 49 is a multiple layer stack of active waveguide devices shown as an adjustable phased array modulator.

FIG. 49 illustrates an embodiment of the phased array waveguide stack section 1630 with only a single column of waveguides illustrated for clarity. Optical radiation 1640 enters the stack 1630 through waveguides 1638 which have been fabricated in an electro-optically active thin film 1650, such as a polable polymer. Here the input beams 1640 are shown staggered to represent beams of identical wavelength, but with different phases. Light travels along the waveguides 1638 in which they encounter poled regions 1634 within which the index of refraction may be modified electronically using the techniques described herein. Beams 1642 represent the output of the phased array after each light wave has been individually phase adjusted to produce output component beams that are aligned in phase.

Many other input and output wave scenarios are possible. For instance, a single mode laser beam with a flat phase wavefront could illuminate an area of waveguide elements, which would then impose arbitrary phase delays across the spatial mode of the beam, thereby allowing the beam to be electronically steered in free space. Directional beam control devices using this method would be much faster and more compact than current mechanical or A–O devices. Using optical-to-electrical pickup devices described herein or known in the art, phase differences or the presence of multiple frequency components may be sensed within or external to the stacked device in order to provide instantaneous information for a feedback loop.

The device segment 1630 represented here is constructed on a substrate 1632, such as $SiO_2$, by alternately depositing electrodes, buffer layers, and polable material in the following manner. A broad area planar electrode 1654, composed of an opaque metallic film or transparent conductive material such as indium-tin-oxide, is deposited, and followed by an electrically insulating buffer layer 1652, such as $SiO_2$, which also serves as the lower boundary layer for the waveguide 1638 fabricated in the next layer of polable material 1650. On top of the polable layer 1650, another buffer layer 1652 is added to form an upper waveguide bound before depositing the patterned electrode 1636 used to activate the poled structures. Another buffer layer 1652 is then added, this time to electrically insulate the patterned electrode from the next layer, another broad area planar electrode 1654. The patterned electrode 1636 is separated from one planar electrode only by a thick buffer layer, and from the other by buffer layers and the polable material. Since it is desired to apply fields across the polable material, the electrical separation across the polable material should be less than the separation across the buffer layer only. The layering sequence between broad area electrodes is repeated until the last layer of polable material 1650, after which only a buffer layer 1652, patterned electrode 1636, and optional final insulating layer 1652 need be added to complete the stack. Electrical leads 1646 and 1648 are brought into contact with electrodes 1636 and 1654, respectively, through integration and bonding techniques known to the art, and connected to voltage distribution control unit 1644.

The voltage control unit 1644 serves a dual purpose: to activate the poled devices individually, and to isolate each from the electric field used to control neighboring layers of active elements. The unit 1644 would be in essence a collection of coupled floating power supplies in which the voltages between electrodes 1636 and 1654 sandwiching an active layer may be controlled without changing the voltage differences across any other active layer.

Region 1634 depicts a poled region with one or more domains, and electrode 1636 depicts an unbroken or a segmented or patterned region with one or more isolated elements. Waveguide stack 1630 is described as a device for phase control, but stacks of waveguide structures may include any number of combinations of poled devices described herein, in series optically, or otherwise configured.

Figure 50:
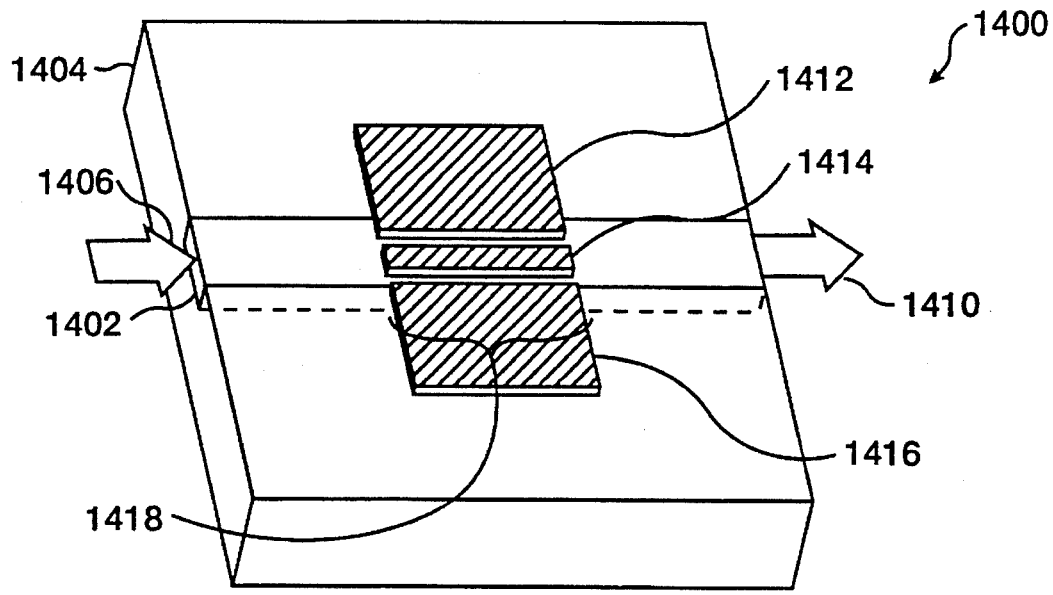
FIG. 50 is an embodiment of an adjustable waveguide attenuator of the prior art.

FIG. 50 shows a prior art adjustable attenuator 1400. An input waveguide 1402 traverses an electro-optically active region of a substrate 1404. An input optical beam 1406 propagates along the input waveguide into an output waveguide 1408, forming the output optical beam 1410. Electrodes 1412, 1414, and 1416 are disposed over the waveguide so that when electrode 1414 is excited at a given polarity (positive or negative) with respect to the two electrodes 1412 and 1416, there is an induced change in the index of refraction within the segment 1418 region of the waveguide under and adjacent to the electrodes due to the electro-optic effect. The electrode configuration is somewhat arbitrary and may be different and more complex than shown in the prior art represented by FIG. 50, but the common factor which all the patterns have in common is that overall, they reduce the index of refraction in the core when excited to a voltage, and increase the index of the surrounding regions.

In the absence of applied electric field, the loss of the waveguide segments is low, determined primarily by scattering on roughness along the waveguide walls. However, when the electric field is applied, the loss can be increased to a very large value. The three electrode pattern allows a negative index change within the waveguide at the same time as a positive index change occurs outside the waveguide, substantially flattening and broadening the index profile. When the field is applied, the modified section of the waveguide 1418 under the electrodes has a much wider lowest order mode profile from the input 1402 and output 1408 sections of the waveguide. As a result, mode coupling loss occurs both when the input beam 1416 transitions into the section 1418 and when the light in section 1418 couples back into the output waveguide 1408. If the index changes are large enough, the lowest order mode goes below cutoff, and the light emerging from the end of the waveguide 1402 diffracts almost freely into the substrate, resulting in a large coupling loss at the beginning of the waveguide 1408.

When a given mode enters the modified section 1418 of the waveguide, the overlap between its intensity profile and any mode profile of the modified section 1418 is reduced by the change in the index profile of the modified segment. If the segment 1418 is multimode, several propagating modes and radiation modes will be excited. If it is single mode, many radiation modes will be excited. The combination of these modes then propagates to the far end of the segment 1418 and couples into the output waveguide section 1408, where only a fraction of the light couples back into a mode of the waveguide to form the output beam 1410. By controlling the voltage applied to the electrodes, the loss in the device 1400 can be adjusted from very low to very high.

The maximum loss which can be obtained depends on the magnitude of the index change, the size of the excited regions, their length, and on whether the input and output waveguides are single mode or multimode. In a variation of the geometry, only two electrodes might be disposed over the waveguide segment 1418, decreasing the index within the waveguide segment and increasing the index to one side instead of on both sides. The function is again as an attenuator, but the rejected radiation fields will tend to leave the device towards the side of the increased index. This ability to direct the lost radiation might be of advantage in some systems where control of the rejected light is desired. An absorber may also be placed downstream of the segment 1418, on one or both sides, to prevent the rejected light from interfering with other functions elsewhere in the system.

Figure 51:
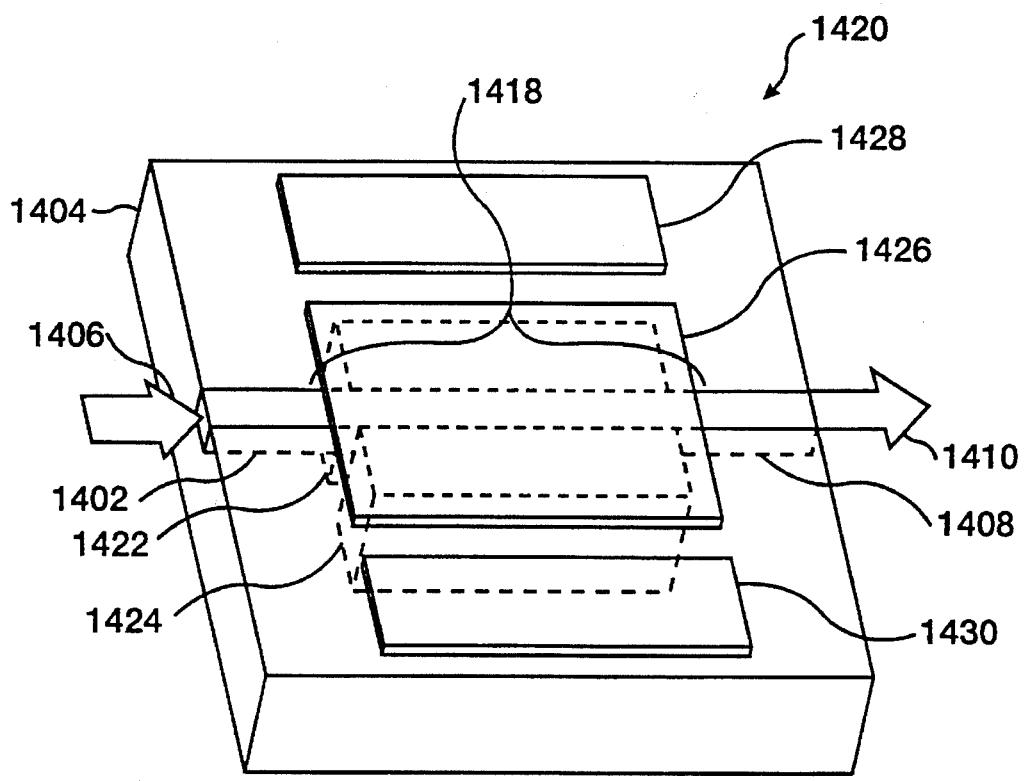
FIG. 51 is an embodiment of a multiple poled segment adjustable waveguide attenuator.

FIG. 51 shows a poled switched attenuator 1420. This device is an improvement on the prior art device of FIG. 50 in that poled regions are used to increase the definition of the index change and increase the index discontinuity, thereby increasing the amount of attenuation which can be obtained in a single stage. Regions 1422 and 1424 are electro-optically poled in a reverse direction from the surrounding material. (As an alternative, the surrounding material may be unpoled, or have no electro-optic coefficient, or it may simply be poled differently from the regions 1422 and 1424.) The central electrode 1426 covers both poled regions and surrounding material. It is excited relative to the electrodes 1428 and 1430 to produce a change in index of refraction in the poled regions 1422, 1424, and the surrounding material. The device 1420 operates in a similar way as described above in reference to the device 1400. The applied voltage reduces and broadens the index profile of the waveguide segment 1418, reducing the coupling between the mode of the output waveguide 1408 and the modes excited in the segment 1418 by the input beam 1406. In this configuration, the change in the index profile is abrupt at the beginning of the modified waveguide region 1418, and therefore the loss is larger. The number and shape of the poled segments 1422 and 1424 can be varied so long as the mode coupling with the excited waveguide segment 1418 is different from the mode coupling with the unexcited segment. The device may be configured with high loss in the electrically unexcited condition, adjusting to low loss in the electrically excited condition. In this case the electrically excited regions and/or the poled regions form a portion of the structure of the waveguide segment 1418. The waveguide segment 1418 may itself may be configured in many different ways, most notably if it is absent entirely without excitation, in which case the device is similar to the switched waveguide modulator of FIG. 29A.

As described above, these devices may be cascaded, in this case to increase the maximum attenuation.

The devices of FIG. 50 and FIG. 51 can also be operated as a variable intensity localized ("point") light source. The light propagating in waveguide 1402 is confined to follow the path of the waveguide until a voltage is applied the electrode structure. When the waveguiding effect is reduced or destroyed by changing the index of refraction, part or all of the previously confined light beam will now propagate according to free-space diffraction theory. The diffracting beam will continue to propagate in the forward direction while the beam area expands in two dimensions to be much larger than the core of the waveguide 1408. At an appropriate distance away from the electrode structure, the beam area can fill a large fraction of the substrate aperture and appear to a viewer as a point source of light emanating from a spatial location near the electrode structure.

If desired, a one-dimensional localized source can also be constructed with this technique. The waveguide segment 1418 in FIGS. 50 and 51 can be embedded in a planar waveguide structure frabricated using techniques known to the art, such that when an appropriate voltage level is applied to the electrode structure, the transverse confinement of the mode is destroyed while the vertical confinement in the planar waveguide is not. Thus the beam area would expand in one dimension, confining the light to a narrow plane.

Figure 52:
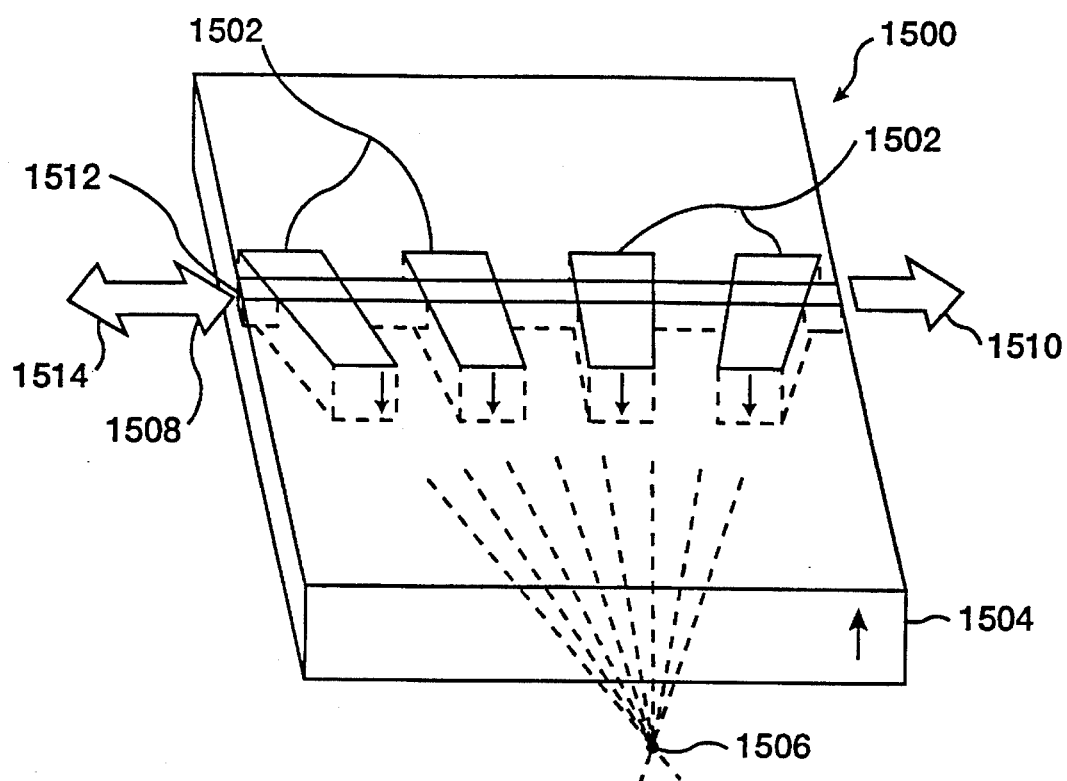
FIG. 52 is an embodiment of a structure with widened bandwidth using an angle-broadened poled grating.

FIG. 52 shows a poled device 1500 with an angle broadened poled grating. The method shown for broadening the bandwidth is an alternative to the bandwidth modifying approaches described in reference to FIG. 18 and elsewhere herein. A periodic structure 1500 is shown with poled regions 1502 which are preferably reverse poled into a poled region of the substrate 1504. Other structures such as waveguides and electrodes and additional gratings are incorporated as desired. The domains 1502 cross the central axis of propagation of the input beam 1508 with a pattern which may be strictly periodic with a 50% duty cycle. The sides of the top surfaces of the poled regions all align along lines drawn from an alignment point 1506. The poled regions approximately reproduce their surface shape some distance into the material. The result is a poled structure with periodicity which changes linearly with the transverse position in the poled substrate. An input beam 1508 which traverses the poled region may be a freely propagating Gaussian beam (if the domains are deeply poled) or it may be confined in a waveguide 1512. According to the function of the grating, the input beam may be coupled into a filtered or frequency converted output beam 1510, or into a retroreflected beam 1514. The range of periodicities in the grating structure (and hence its bandwidth) depends on the width of the beam and separation of the point 1506 from the axis of the beam. By adjusting these quantities, the bandwidth of the poled structure may be increased substantially over the minimum value determined by the number of first order periods which fit in the grating. There is a limit on the maximum desirable angle for the poled boundaries, and therefore the structure shown in FIG. 52 cannot be extended without limit. However, a long interaction region can be obtained by cascading several segments together. To maximize the coherence between the segments, the periodicity of the domains along the central axis of the beam should be unmodified at the joins between segments. There will be at least one wedge shaped domain between segments.

Although increasing the bandwidth of the grating decreases the interaction strength, it makes a device using that grating significantly less sensitive to small frequency drifts. For example, a frequency doubler device using an angle broadened grating is more tolerant of temperature drifts. Another example application is the channel dropping filter which tends to have narrow bandwidth because of the strong gratings which must be used. Use of an angle broadened grating enables a widened pass band to accept high bandwidth communications signals. The angle broadened grating can also be applied in the other grating configurations discussed above.

There are alternatives for implementing the angle broadened grating which do not follow the exact pattern described above. For example, the relationship between the angle of the grating periods and the distance along the propagation axis might be more complex than linear. A quadratic or exponential variation might be more appropriate for some applications where the majority of the interacting power exists at one end of the grating. The angle broadening technique is also applicable to prior art types of gratings such as indiffused, ion exchanged, and etched gratings.

Figure 53:
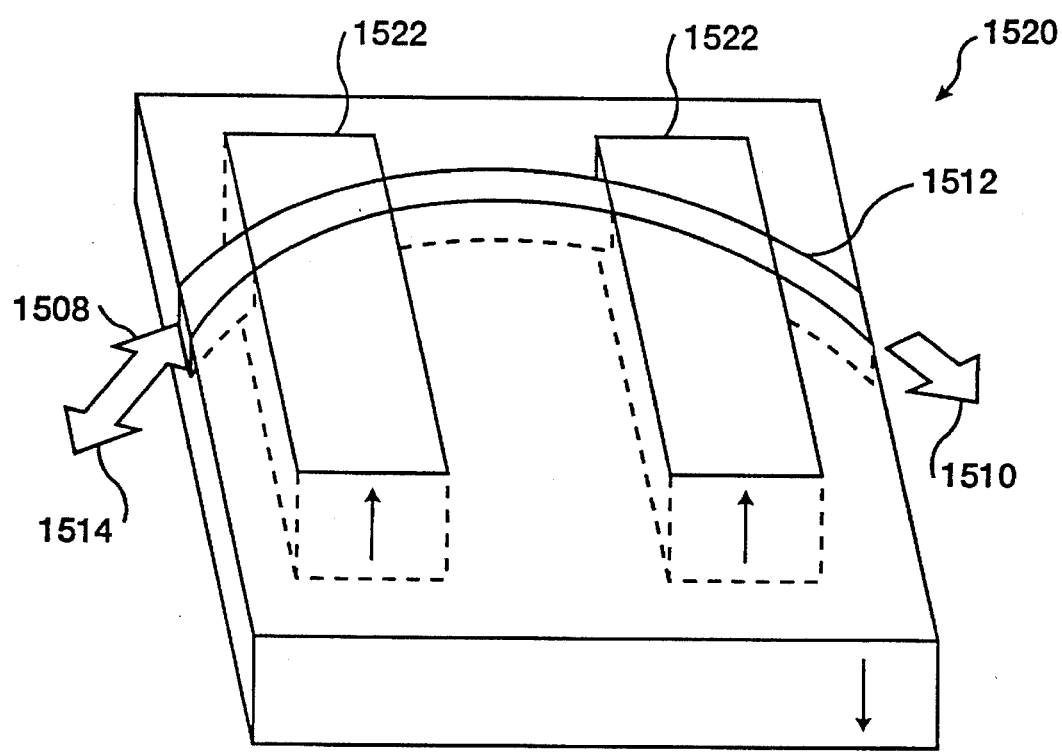
FIG. 53 is an embodiment of a structure with widened bandwidth using a curved waveguide.

An alternative angle broadened device 1520 using a curved waveguide is shown in FIG. 53. In this case, the poled regions 1522 have parallel faces, and the angle of the faces are inclined only relative to the local direction of propagation within the guide. Again, the bandwidth is broadened by the different components of the wave experiencing different Fourier components of the grating. The curved waveguide has a higher loss than the straight waveguide, but large curvatures are not required. Several sections as shown in FIG. 53 may be concatenated, forming for example a sinuous waveguide structure that waves back and forth around an essentially straight line.

Figure 54:
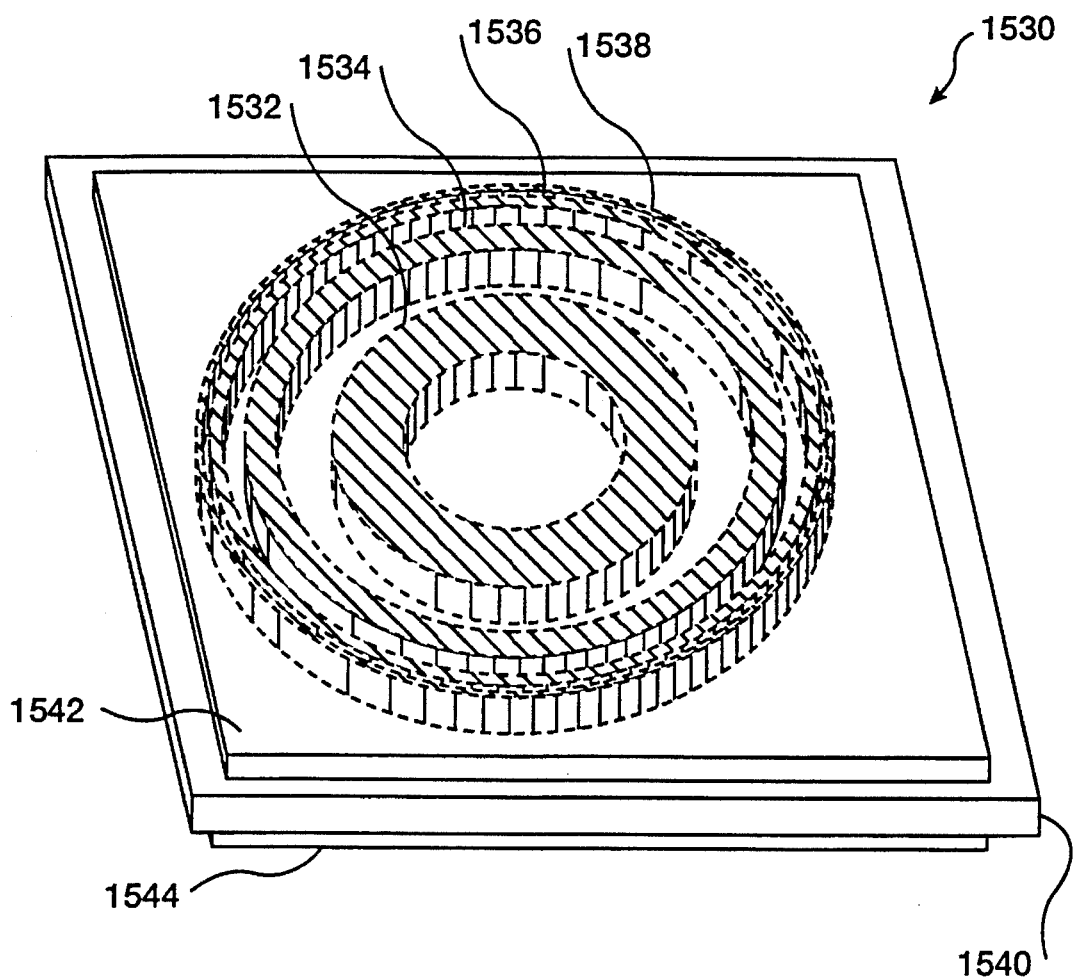
FIG. 54 is an embodiment of an electrically controllable poled lens.

FIG. 54 shows a controllable poled lens 1530. Concentrically arranged domains 1532, 1534, 1536, and 1538 are poled into an electro-optic substrate 1540 with a reverse polarity from that of the substrate. Transparent electrodes 1542 and 1544 are applied to the two opposing surfaces of the device above and below the poled regions. When an electric field is applied between the two electrodes, the poled regions have their index of refraction either increased or decreased according to the polarity. The geometry of the poled regions is determined by the diffractive requirements of focussing an optical wave of a given color. The separations between the boundaries varies roughly quadratically with radius. If the application requires focussing a plane wave to a round spot, for example, the poled regions will be round (for equal focussing in both planes), and separated by decreasing amounts as the diameter of the poled region increases. The boundaries of the poled regions are determined by the phase of a the desired outgoing wave relative to the incoming wave at the surface of the lens structure. A poled region boundary occurs every time the relative phase of the waves changes by $\pi$. For example, if the incoming wave is a plane wave its phase is constant along the surface. If the outgoing wave is a converging wave which will focus at a spot far from the surface, it is essentially a spherical wave and the phase changes in that spherical wave determine the boundaries. The lens 1530 is a phase plate with adjustable phase delay according to the applied voltage, and the domains occupy the Fresnel zones of the object.

To focus a plane wave of a given color, a voltage is applied which is sufficient to phase retard (or advance) the plane wave by $\pi$. Each different frequency has a different focal length defined by the Fresnel zone structure of the poled lens 1530. Higher frequencies have longer focal lengths. If it were not for dispersion, every wavelength would optimally focus at the same voltage. The voltage can be adjusted to compensate for the dispersion in the substrate material 1540. If the voltage is adjusted away from the optimal value, the amount of light which is focussed to the spot is reduced because the phase of the light from the different zones no longer add optimally. They will interfere partially destructively, reducing the net intensity.

Figure 55:
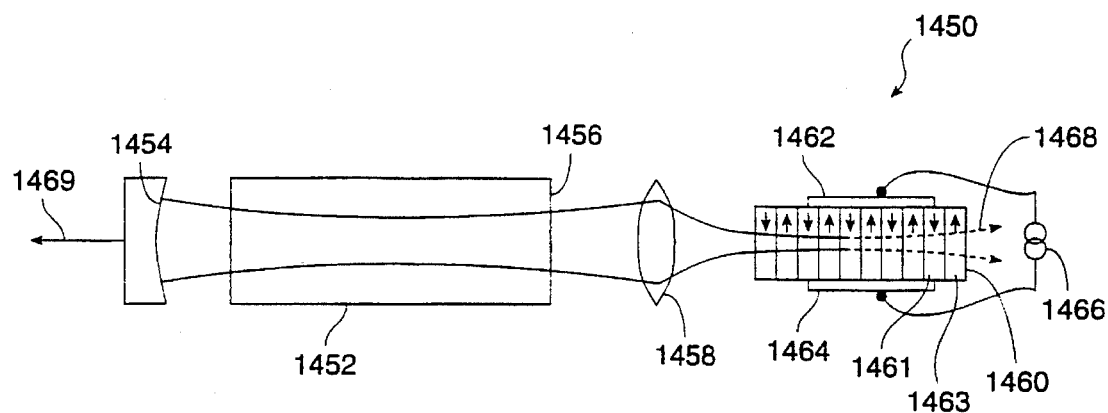
FIG. 55 is an embodiment of a laser feedback device using a periodically poled reflector.

FIG. 55 shows a laser feedback device 1450. The laser source consists of an amplifier region 1452, a rear reflector 1454, and a low reflection output region 1456 which may be an antireflection coated window, for example. While a conventional laser will have a second high reflector, in this invention, the high reflector is removed so that a grating feedback device can control the laser oscillation. The reflection from the output region 1456 and the coupler 1458 is low enough so that the laser does not lase without additional feedback from an external source. The external feedback source consists of an optical coupling system 1458 and a poled material 1460 which reflects a beam from the optical amplifier when excited by an electric field. Because the reflection spectrum of the poled material 1460 may be very narrow in frequency space, it may select a narrow region in which laser operation can occur about the single frequency or frequencies which make up the grating according to the distribution of grating periods. If the resonator cavity is long enough so that the FSR is on the same order as the width of the reflection spectrum, the combined device will oscillate on a single longitudinal mode.

The means 1458 for coupling optical energy between the optical amplifier and the material 1460 collects and refocuses the output mode of the laser into the poled material. The coupler 1458 may consist of many alternate realizations, including one or more of the following components: high numerical aperture lenses, such as GRIN (graded index), aspheric, diffractive, or multi-element spherical lenses; tapered waveguides; proximity adjusters and aligners in the case of butt coupling from waveguide to waveguide. The surfaces of the coupler 1460 are preferably antireflection coated. The AR coating may be a multilayer dielectric coating, or a sol-gel coating, or a quarter wave layer of a material with the appropriate index of refraction (geometric mean of the two adjacent media). If the material is bulk pole, d, the optimal focus within the material 1460 has a Rayleigh range approximately equal to the length of the poled region. If the material has a waveguide for confinement of the propagating beam, the optical coupling system should optimally transform the laser mode into a mode profile at the entrance of the waveguide which matches the desired mode of the waveguide in terms of phase front angle, radii of curvature, and transverse dimensions. The poled structure consists of at least two types of domains 1461 and 1463 which are preferably oppositely poled. The poled material has electrodes 1462 and 1464 which extend across the poled region and which can be excited electrically by the power supply 1466. When a voltage is applied to the electrodes, the induced field in the material produces changes in the index of refraction which vary spatially according to the poling direction and the electric field strength. By inducing periodic structures in the poling, electrically controllable periodic modulations in the index of refraction can be induced.

The amplifier 1452 is provided with the necessary mounting and excitation to produce an optical gain coefficient over an extended region characterized by a central optical axis. The optical bandwidth of the amplifier is limited according to the process which gives rise to gain. The bandwidth is the width (typically the 3 dB full width) of the gain profile: the dependence of the gain as a function of optical frequency. The semiconductor diode technology (such as InGaAs, AlGaAs, AlGaInP, InGaAsP, ZnSe, GaN, InSb) is advantageous for providing a large bandwidth, although without the capability of supplying high power. The optical reflector 1454 is a feedback mirror which can be a bulk mirror aligned and matched in radius to the phase front of the mode to reflect the mode propagating out the rear surface of the amplifier back into itself. Or in the case of a waveguide amplifier (Nd:YAG, Er:YAG, Nd:LiNbO$_3$, Er:LiNbO$_3$, and various combinations of rare earth ions and crystalline or glassy hosts), it can be a facet of the amplifier which is cleaved or polished normal to the waveguide. If the resonator geometry is a ring, permitting unidirectional propagation of light, the optical reflector is a multi element structure composed of at least two elements to collect the light reflected from the material 1460 which does not pass through the amplifier, and to align and refocus this light back through the amplifier to the material 1460 again with similar mode characteristics as it had on previous passes.

Several beam interactions with the periodic poled material 1460 are possible. If the periodicity is chosen to be a multiple of the period required to retroreflect light within the gain profile of the amplifier 1452, the device will function as a (higher order) field controlled feedback mirror. The laser can be turned on when the voltage 1466 is switched on, thereby creating retroreflection within the bandwidth of the grating. The laser output can then be amplitude modulated by modulating that voltage since the laser oscillation varies in proportion to the strength of the electric field. The modulation control means 1466 provides the voltage and current required to establish the desired electric fields in the material 1460 as a function of time. The laser can also be modelocked by operating the modulation control means 1466 at a frequency equal to a multiple of the round trip frequency for the light between the material 1460 and the laser reflector 1454. Since the reflectivity of the poled structure 1450 is modulated at the same frequency, the light beam resonating between the two feedback mirrors 1450 and 1454 tends to break up into one pulse (or more) which of course bounces around with the round trip frequency. If the frequency is a multiple (1×, 2×, 3×, . . . ) of the round trip frequency, the reflectivity will be high each time the pulse approaches the reflector 1450. At the higher multiples, the reflectivity remains high for a shorter time so a shorter pulse is produced, but some means may be needed to suppress the additional pulses which tend to be formed at the other high reflection times within the round trip optical transit time. The additional pulses can be suppressed by also applying a component of the signal at the round trip frequency to the reflector 1450, by also modulating the amplifier 1452, or by other means including conventional additional components. An optical output may be extracted into the beam 1468 or 1469.

The laser is frequency stabilized by using the feedback device 1450 because periodic reflectors operate only at specific frequencies. Incident frequencies outside the bandwidth of the poled structure are not reflected. In a simple structure, the bandwidth is determined by the inverse of the number of first order grating periods which fit in the length of the poled region containing that frequency component. In a more complicated structure with multiple periods, the bandwidth is determined by the Fourier transform of the poled structures along the bisector angle of the incident and the reflected beam propagation directions. Because feedback is only present over a limited frequency range, the output frequency of the device 1450 can be much narrower than that of a free running laser oscillator in which the poled structure has been replaced by a simple mirror. If the bandwidth of the reflection is comparable to the separation of the longitudinal modes of the extended cavity formed by the reflector 1454 and the poled structure, the device will operate in a single frequency mode.

The stabilization characteristic is particularly useful in the case of the semiconductor diode laser, where the gain is very high and broadband. With diode lasers, all undesired internal reflections such as the reflection from the output region 1456 should preferably be kept very low (such as below $10^{-3}$).

The electrodes 1462 and 1464 may be on the same side of the substrate or on opposite sides, according to the field penetration and drive voltage preferred for the application. The resonator including the laser and the switched reflector may also be a ring resonator instead of the linear resonator shown in FIG. 55. Additional optical elements are required to form the ring resonator as is known in the prior art, and the reflection from the poled material 1460 is not at normal incidence. The periodicity and angle of the grating must always be adjusted so that the virtual photon added to the interaction produces momentum conservation between the input and the output photon. This constraint determines both the angle and the period of the poled grating.

Figure 56:
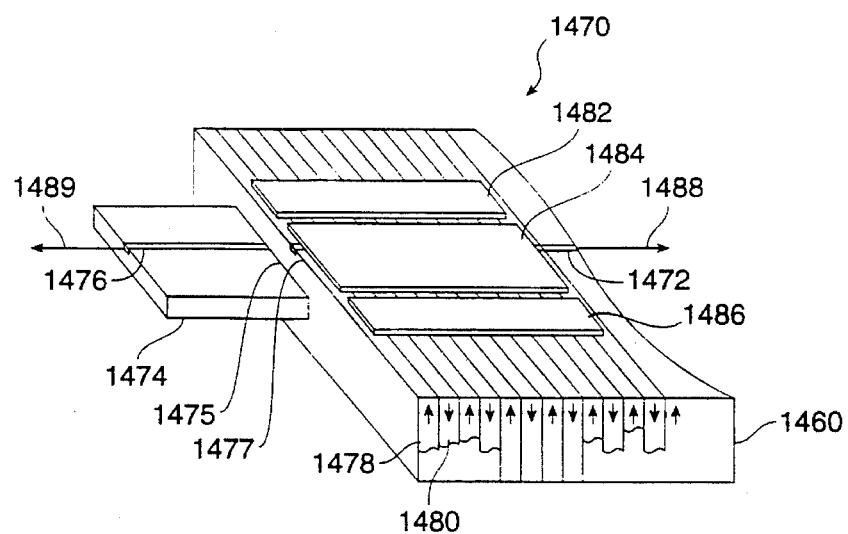
FIG. 56 is an embodiment of a laser feedback device using a periodically poled waveguide reflector.

FIG. 56 shows a laser feedback device 1470 with a waveguide. A waveguide 1472 may be incorporated into the poled material 1460 to confine the light beam for a long distance. This is particularly useful in devices which require the interaction length to generate a significant reflection, and in integrated devices where all light is routed m waveguides. Waveguide lasers 1474 such as semiconductor diode lasers or diode pumped solid state lasers may be butt-coupled to the waveguide, as shown in FIG. 56, for rugged and efficient operation. In butt coupling, the optical coupling system 1458 is the AR coating on the surfaces 1475 and 1477 along with the alignment and mounting structures necessary to maintain alignment. The waveguides of the optical amplifier 1474 and the poled substrate 1460 are aligned so that the optical field phase front which emerges from the optical amplifier towards the substrate has to an optimal extent the same angles, radii, and transverse dimensions as the phase front of the mode which propagates in the waveguide 1472. The separation of the two waveguides should be within a Rayleigh range, and their deviation from coaxial alignment should be less than a fraction of the transverse mode size. Either one of the waveguides 1472 or the guide in the amplifier 1476 may be tapered to optimize this overlap. In waveguide devices, it is not necessary for the poled regions 1478 and 1480 to extend entirely through the substrate 1460. Electrodes 1482, 1484, and 1486 are disposed over the poled region traversed by the waveguide 1472. When electrode 1484 is excited relative to electrodes 1482 and 1486, an index of refraction pattern is created in the waveguide with structure determined essentially by the structure of the poled substrate. This index pattern may act as a reflector as described in reference to FIG. 55, and/or it may act as a coupler to other waveguides as described above. An optical output may be extracted from the device at either the through port 1488 or the opposite end of the amplifier 1489.

A frequency doubler may be incorporated into the substrate 1460 if the substrate material is a nonlinear optical material such as lithium niobate, lithium tantalate, or KTP. The quasi phase matched doubler may be incorporated as a part of the feedback grating structure, prior to it, or after it. If the grating structure incorporates multiple reflection frequencies, the optical amplifiers 1452 or 1474 may be induced to oscillate at two or more frequencies within their gain bandwidths. In this case, the nonlinear frequency converter may be a sum frequency mixer instead of a doubler, or several such devices may be cascaded to form multiple frequency combinations of the multiple frequency outputs.

The variations described above relative to the poled structure, its excitation, and its mode of use can also be applied in combination with the external optical amplifier. In particular, frequency tunable lasers can be realized by combining the structures of FIGS. 55 and 56 with the tunable gratings of FIGS. 14 and 15, respectively. As before, tuning is achieved by arranging the poled grating structure so that the average index of refraction changes with applied field. The frequency of operation of the optical amplifier 1452 or 1474 is determined by the frequency of the feedback from the poled structure 1460, The output frequency may therefore be chirped and/or modulated by chirping and/or modulating the average index of the poled structure. Changing the average index changes the momentum vector of the light photons without changing the momentum vector of the virtual photon contributed by the grating. After the change in average index, the old reflection frequency is no longer optimally phase matched for reflection; the peak reflectivity has moved to a new frequency.

A frequency modulated (FM) laser may be constructed using the configurations described in reference to FIGS. 55 and 56 with the addition of changing the average index of refraction as described in reference to FIGS. 14 and 15. By modulation, we mean changed as a function of some parameter which is time in this case, as in pulsed with a high or low duty cycle, sinusoidally varied, or varied with any arbitrary temporal dependence. A control system may be supplied to control the voltages and supply the currents needed to apply the desired temporal variations in electric field.

Typically, the reflectivity of a grating required for optimal feedback for a semiconductor laser is less than 10%. The remaining light can be used for output. The laser can be forced to operate in either the TM or TE polarization, depending on the confinement of the optical beam in the waveguide on the grating chip, the dispersion in the grating, and the relative gain of the two polarizations in the gain element. Since the strength of the grating is controllable, the reflectivity can be adjusted to optimize the output coupling of the laser to maximize the output power.

Similarly, the grating can be used to form reflectors of a passive or buildup cavity. Since the coupling of a laser beam to a cavity depends on the relative reflectivity of the input coupler compared to the cavity losses, a variable reflectivity input coupler provides a means to optimize this parameter, and thus impedance match the resonator.

In a cavity, this invention can also be used for single pulse switching, mode-locking, or cavity dumping, with little or no chirping for lower power CW sources, such as semiconductor lasers. In addition, the timing potential enables the laser to be used as a source for communications, spectroscopy, and remote sensing.

Figure 57:
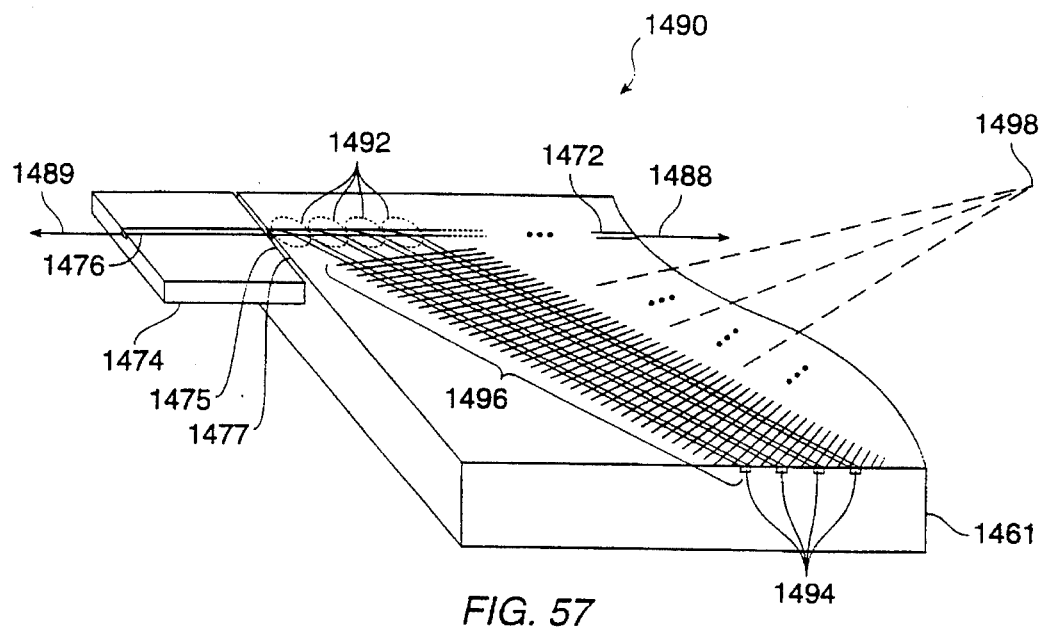
FIG. 57 an embodiment of a laser feedback device using multiple switched feedback gratings.

FIG. 57 shows a selectable wavelength laser 1490 controlled by an array of switches. The laser is preferably a diode laser 1474 with waveguide 1476 butt coupled to a waveguide 1472 in a substrate 1461. The surfaces 1475 and 1477 are preferably AR coated so that the optical amplifier 1474 will not lase from the reflectivity of its own facets. The substrate may be any substrate capable of supporting the switches 1492, which may be implemented in a variety of ways including the TIR switches of FIGS. 30–32 and 34–35, the grating switch structures of FIGS. 7–8 and 12–13, the couplers of FIGS. 10 and 26–28, the splitters of FIGS. 23, 25, 33, and 46–48, or any of the other optical waveguide switch structures now known or yet to be discovered. The TIR switches 1492 have been sufficiently described above that we indicate their presence only schematically in this diagram. In their on position, these switches reroute the optical energy from the amplifier down the one of the waveguides 1494 that is associated with the switch.

A retroreflector array 1496 is disposed in the waveguides, here shown as a grating. The grating reflects the incident light at a specific frequency, and the laser lases within the bandwidth of the grating. The grating elements are shown directed towards a somewhat distant point 1498 so that the periods of the gratings farther from the laser are progressively shorter. The reflection spectra of the gratings is therefore essentially identical but shifted to shorter and shorter wavelengths. By selecting the switch 1492 associated with the desired grating period, the desired frequency of operation of the laser can be selected. The optical frequency is determined by the geometry, and linearly spaced optical wavelengths may be obtained with a constant switch separation. If desired, any wavelength spacing within the packing density capability of the arrangement may be chosen. A large number of switches may be disposed along the waveguide 1472 because of the low insertion loss of the TIR switches and their high packing density. The tilted output waveguides also pack together very compactly.

An output beam may be extracted from the rear surface of the optical amplifier 1474 as beam 1489, or it may be extracted from the waveguide 1472 as beam 1488 since the TIR switches will leak a fraction of the laser light along the waveguide 1472. Many alternative configurations such as are described in reference to FIG. 56 are also relevant to this configuration. For instance, the reflector array 1496 may consist of permanent gratings fabricated by a large number of techniques, or switched gratings. It may consist of a uniform grating structure in which the different optical path lengths to the grating select a different FSR for the laser cavity, producing single mode operation at a selectable array of very narrowly spaced spectral peaks. It may even consist of an array of permanent mirrors along the waveguides 1494 which might be coated for high reflection or variable wavelength reflection. Again, the differing separation of the mirrors provides the opportunity to adjust the laser cavity path length switchably over a large range.

A subset of the structure of FIG. 57 is a modulator using an adjustable optical energy redirector 1492, and one of the feedback reflectors 1496 in one of the waveguides 1494. If the waveguide 1472 is configured not to reflect, as by for example tapering its width to zero following the redirector 1492, the laser again is forced to lase with the feedback afforded by the reflector 1496. By adjusting the amount of optical energy which is fed back through the excitation of the redirector 1492, the laser output characteristics can be controlled. The laser power may be modulated in this way, in which case the reflector 1496 may be a fixed grating or even a broadband fixed mirror. With the grating reflector, there is the advantage of a fixed frequency so that the laser power can be modulated deeply without frequency shifts, producing almost pure amplitude modulation. If the redirector 1492 is modulated at an integer multiple of the cavity round trip time, the device is a mode locker and produces a pulsed output. The round trip time is the time taken by a coaxially aligned pulse to return to its original position and direction within the cavity. By using different switches the cavity length can be varied to vary the pulse separation. By using two different switches simultaneously, it is also possible to discriminate against the intermediate pulses which tend to grow with mode locking frequencies at a high order multiple of the round trip time. Frequency modulation can be obtained by modulating the central frequency of the reflector. In this case, the reflector 1496 should preferably be implemented as a tunable grating such as is described in FIGS. 14–22.

Figure 58:
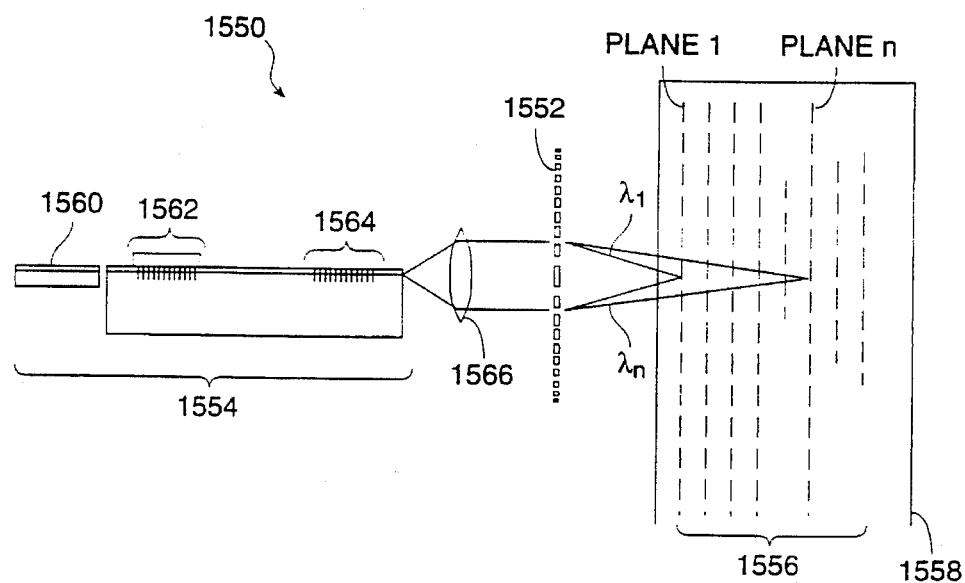
FIG. 58 is an embodiment of a wavelength-tuned adjustable focussing system.

FIG. 58 shows a wavelength tuned adjustable focussing system 1550. The combination of a diffractive focussing element 1552 such as the zone plate lens of FIG. 54 (or a fixed diffractive lens such as an opaque or an etched zone plate) with a tunable light source 1554 offers important new capability in the field of data storage. When a zone plate is combined with an adjustable frequency light source, the distance to the focus is adjusted by tuning the light source. This capability is useful for multilayer data storage devices where the data is read from and written to data planes 1556 stacked at various distances into the data storage medium 1558. If the wavelength of the light source is tuned (as we have described above by various means), the distance from the zone plate to the focus is adjusted correspondingly. This change of focus by wavelength change allows both instantaneous tracking of the optical data storage surface of a distorted disk by analog wavelength change, and selection of the desired data surface with random access to the various stacked planes 1556 by discrete changes in the light wavelength.

The frequency tunable laser of choice for driving the multiplane data storage system is a laser system based on a semiconductor diode laser 1560 with tuning based on feedback from an electronically tunable grating 1562 such as we have described above. The laser may also be frequency doubled in a quasi phasematched section 1564, in which case use of an angle broadened poled grating is the preferred method of rendering the acceptance of the doubler broad enough to accept significant tuning of the source laser. Lens system 1566 collimates and makes round the laser output in preparation for the final focus in the zone plate lens 1552.

The lens system 1566 is not necessary since a zone plate can also refocus a diverging beam. However, it is desirable to achieve a round beam through the zone plate because this will produce the smallest spot size and therefore the highest density data reading/writing capability. The devices 1562, 1564, and 1566 may be implemented in waveguides on the same substrate if desired, and in combination with one of the out-of-plane reflectors described above, can be integrated with zone plate lenses on the rear surface of the substrate to achieve a small and lightweight unit capable of rapid actuation in a data storage system.

The invention has now been explained with reference to specific embodiments. Other embodiments will be apparent to those of ordinary skill in the art. Therefore, it is not intended that the invention be limited, except as indicated by the appended claims, which form a part of this invention description.

What is claimed is:

1. A laser comprising:
   a solid material for passing optical energy;
   at least a first electrically-conductive material forming a first electrode, said first electrode confronting said solid material and bridging at least two elements of an electrically-controllable grating structure in said solid material;
   an optical amplifier disposed along an optical axis, said optical axis traversing said solid material, said at least two elements being disposed transverse of said optical axis; and
   an optical coupling means disposed between said solid material and said optical amplifier along said optical axis.

2. The device according to claim 1 further including:
   an optical reflector disposed along said optical axis, said optical amplifier being disposed between said optical reflector and said solid dielectric material.

3. The device according to claim 1 further including:
   an optical reflector disposed along said optical axis, said optical amplifier being disposed between said optical reflector and said solid dielectric material;
   waveguide means along said optical axis in said solid dielectric material, wherein said optical amplifier is a semiconductor diode; wherein
   said optical coupling has butt coupling and antireflective means disposed between said semiconductor diode and said waveguide; and wherein
   said at least two elements form a feedback mirror capable of producing laser oscillation.

4. The device according to claim 1 further including:
   an optical reflector disposed along said optical axis, said optical amplifier being disposed between said optical reflector and said solid dielectric material;
   a modulation controller for modulating said electric field creating means;
   said optical coupling being antireflective to inhibit laser oscillation in absence of said electric field; and
   wherein said grating is a field-controlled feedback mirror for producing laser oscillation in proportion to the strength of said electric field.

5. The device according to claim 4 for amplitude modulation of an optical signal, wherein said grating comprises alternates of said first type of said elements with a second type of said elements, said second type being a poled structure having a reverse sense to said first type of said elements and wherein average optical distance across said first type of elements is substantially equal to average optical distance across said second type of elements along said optical axis.

6. The device according to claim 4 for frequency modulation of an optical signal, wherein said grating comprises alternating said first type of said elements with a second type of said elements, said second type being a poled structure having a reverse sense to said first type of said elements and wherein average optical distance across said first type of elements differs from average optical distance across said second type of elements along said optical axis.

7. The device according to claim 1 for mode locking optical energy, further including:
   an optical reflector disposed along said optical axis, said optical amplifier being disposed between said optical reflector and said solid dielectric material; and
   a mode locker operated at a frequency that is a multiple of a frequency which is the reciprocal of the round-trip optical transit time between said grating and said optical reflector.

8. The device according to claim 1 wherein said at least two elements are formed from a plurality of types of domains having a plurality of electro-optic coefficients, and further including:
   an optical reflector disposed along said optical axis, said optical amplifier being disposed between said optical reflector and said solid dielectric material;
   wherein said optical coupling means is antireflective to inhibit laser oscillation in absence of optical feedback from said at least two elements; and
   wherein the sum over all domain types of the product, for each domain type, of said electro-optic coefficient times the average distance across the domain type along said optical axis, differs from zero.

9. The device according to claim 1, for nonlinear conversion of optical energy, further including:
   an optical reflector disposed along said optical axis, said optical amplifier being disposed between said optical reflector and said solid dielectric material;
   wherein said solid dielectric material further includes a pattern of differing domains transverse to said optical axis, at least a first type of said domains being an optically nonlinear structure and forming a plurality of components alternating with a second type of said domains, said pattern being phase matched to interact between three optical waves of at least two different frequencies, wherein a linear combination of the values of the frequencies of said three optical waves is substantially zero to generate at least one optical output beam.

10. The device according to claim 9, wherein said elements and said components together form a combined structure with both reflecting and nonlinear optical properties.

11. The device according to claim 9 wherein said optically nonlinear structure is a frequency doubler.

12. The device according to claim 9 wherein said optically nonlinear structure is a frequency mixer.

13. The device according to claim 9 wherein said optically nonlinear structure is an optical parametric oscillator frequency doubler.

14. The device according to claim 1, wherein said grating comprises alternates of said first types of said elements and second types of said elements which are spaced at at least two different periods.

15. The device according to claim 1 further including:
   an optical reflector disposed along said optical axis, said optical amplifier being disposed between said optical reflector and said solid dielectric material; and
   at least one electro-optically active region in said solid material transverse of said optical axis and having an electrode adjacent said active region for inducing an electric field.

16. The device according to claim 15 wherein said active region defines an optical focussing device.

17. The device according to claim 15 wherein said active region has a reflective interface at a skew with said optical axis and forms a reflecting grating for diverting optical energy.

18. The device according to claim 15 wherein said active region is a variable dispersion, electrically-controllable waveguide segment along said optical path.

19. A laser comprising:
   a solid material for passing optical energy;
   an input waveguide in said solid material;
   a base reflector disposed along an optical axis;
   a plurality of output waveguides encountering said input waveguide at intersection regions along said input waveguide;
   a plurality of electrically-switchable beam redirectors disposed along said input waveguide at said intersection regions, each one of said electrically-switchable beam redirectors comprising a first electrically-conductive material forming a first electrode, said first electrode confronting said solid material and bridging at least one electrically-active element in said solid material;
   a plurality of gratings disposed along said output waveguides defining electrically-selectable retroreflectors further defining cavities between said base reflectors and said gratings;
   an optical amplifier disposed along an optical axis, said optical axis traversing said solid material; and
   an optical coupling means disposed between said solid material and said optical amplifier along said optical axis.

20. The laser according to claim 19 wherein said electrically-switchable beam redirectors are total internal reflectors.

21. The laser according to claim 19 wherein said electrically-switchable beam redirectors are switchable mirrors.

22. The laser according to claim 19 wherein said gratings have differing periods in order to support selectable-frequency operation.

* * * * *